United States Patent
Limberg

(10) Patent No.: US 8,290,035 B2
(45) Date of Patent: Oct. 16, 2012

(54) SYSTEMS FOR REDUCING ADVERSE EFFECTS OF DEEP FADES IN DTV SIGNALS DESIGNED FOR MOBILE RECEPTION

(76) Inventor: Allen LeRoy Limberg, Port Charlotte, FL (US)

( * ) Notice: Subject to any disclaimer, the term of this patent is extended or adjusted under 35 U.S.C. 154(b) by 968 days.

(21) Appl. No.: 12/218,131

(22) Filed: Jul. 11, 2008

(65) Prior Publication Data

US 2009/0016432 A1    Jan. 15, 2009

Related U.S. Application Data

(60) Provisional application No. 60/959,140, filed on Jul. 11, 2007, provisional application No. 60/961,941, filed on Jul. 25, 2007, provisional application No. 60/964,450, filed on Aug. 13, 2007.

(51) Int. Cl.
*H04N 7/12* (2006.01)

(52) U.S. Cl. ......... 375/240.01; 375/240.24; 375/240.26; 375/261; 375/262; 375/316; 348/470; 348/608; 348/611; 348/614; 348/726

(58) Field of Classification Search .................. None
See application file for complete search history.

(56) References Cited

U.S. PATENT DOCUMENTS

| | | | | |
|---|---|---|---|---|
| 7,038,732 | B1* | 5/2006 | Limberg et al. | 348/614 |
| 7,111,221 | B2* | 9/2006 | Birru et al. | 714/755 |
| 2002/0140867 | A1* | 10/2002 | Weiss | 348/723 |
| 2005/0180332 | A1* | 8/2005 | Kim et al. | 370/244 |
| 2006/0262651 | A1* | 11/2006 | Cooper et al. | 368/68 |
| 2008/0282130 | A1* | 11/2008 | Lee et al. | 714/758 |

* cited by examiner

*Primary Examiner* — Hassan Phillips
*Assistant Examiner* — Ajay Cattungal

(57) ABSTRACT

Digital television broadcasting signals employ parallel concatenated convolutional coding, commonly called "turbo coding", to improve reception by receivers in motor vehicles. Turbo coded Reed-Solomon codewords are transversally disposed in the payload fields of encapsulating MPEG-2-compliant packets to improve the capability of the Reed-Solomon coding to overcome deep fades. Turbo codewords are transmitted more than once in so-called "staggercasting". Reception of DTV signals is improved by combining soft decisions concerning repeated transmissions of turbo codewords before turbo decoding. Only the data components of turbo codewords are transmitted twice in "punctured" staggercasting of turbo codewords, with parity components being transmitted only once, so code rate is reduced by a smaller factor than two.

19 Claims, 28 Drawing Sheets

SYSTEMS FOR REDUCING ADVERSE EFFECTS OF DEEP FADES IN DTV SIGNALS DESIGNED FOR MOBILE RECEPTION

This application is filed under 35 U.S.C. 111(a) claiming, pursuant to 35 U.S.C. 119(e)(1), benefit of the filing dates of provisional U.S. patent applications Ser. Nos. 60/959,140, 60/961,941 and 60/964,450 filed pursuant to 35 U.S.C. 111 (b) on 11 Jul. 2007, 25 Jul. 2007 and 13 Aug. 2007, respectively. These provisional applications are incorporated herein by reference.

The invention relates to digital television (DTV) signals for over-the-air broadcasting, transmitters for such broadcast DTV signals, and receivers for such broadcast DTV signals.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is particularly incorporated by reference into this specification. So is Section 5.6.3 titled "Specification of private data services" from Annex C of A/53. In the beginning years of the twenty-first century efforts were made by some companies in the DTV industry to provide for more robust transmission of data over broadcast DTV channels without unduly disrupting the operation of so-called "legacy" DTV receivers already in the field. The operation of nearly all legacy receivers is disrupted if ⅔ trellis coding is not preserved throughout every transmitted data field. Also, the average modulus of the signal should be the same as for 8VSB signal as specified in the 1995 version of A/53, so as not to disrupt adaptive equalization in legacy receivers using the constant modulus algorithm (CMA).

Another problem concerning "legacy" DTV receivers is that a large number of such receivers were sold that were designed not to respond to broadcast DTV signals unless de-interleaved data fields recovered by trellis decoding were preponderantly filled with (207, 187) Reed-Solomon forward-error-correction (R-S FEC) codewords of a specific type, or with correctable approximations to such codewords. Accordingly, in order to accommodate continuing DTV reception by such legacy receivers, robust transmissions are constrained in the following way. Before convolutional byte interleaving, data fields should be preponderantly filled with (207, 187) R-S FEC codewords of the type specified in A/53.

A/53 was revised in January 2007 to describe "enhanced" 8VSB signals, or "E-VSB" signals, with code rates one-half and one-quarter that of "ordinary" or "full-code-rate" 8VSB prescribed in the 1995 DTV standard. Ancillary data that are transmitted using E-VSB are randomized and put into 164-byte packets that are shortened versions of the 187-byte MPEG-2-compatible data packets used in ordinary 8VSB. These 164-byte packets are encoded using a (184, 164) shortened Reed-Solomon forward-error-correction code for 8-bit bytes. Each resulting (184, 164) R-S FEC codeword is packed into the 184-byte payload-data field of a respective 187-byte MPEG-2-compatible data packet having a null packet header, the PID of which is all ONEs. The null packets are then time-division multiplexed with MPEG-2-compatible data packets containing data to be transmitted as full-code-rate 8VSB signal. The 187-byte data packets in this transport stream are all encoded using the (207, 187) shortened R-S FEC code for 8-bit bytes prescribed in A/53. Packing the redundantly-coded data into the 184-byte payload-data fields of null packets results in the data fields supplied for convolutional byte interleaving being completely filled with (207, 187) R-S FEC codewords of the type specified in A/53. These 207-byte R-S FEC codewords are subjected to convolutional byte interleaving and are then ⅔ trellis coded to generate the modulating signal for 8VSB transmission, which processing is similar to that prescribed in the 1995 DTV broadcasting standard.

In 2006 engineers of Samsung Electronics Co., Ltd. proposed introducing further-coded ancillary data into adaptation fields of the 187-byte MPEG-2-compatible data packets included in the 207-byte data segments of the 8VSB DTV broadcast signals used in the United States. This scheme, called "AVSB", was championed because the packet decoders in legacy DTV receivers could readily disregard the further-coded ancillary datastream. This provides a form of backward compatibility in which those legacy DTV receivers can still receive a principal datastream transmitted in the payload data fields of the 187-byte MPEG-2-compatible data packets. There is no backward compatibility in the sense that legacy DTV receivers can usefully decode the information content in the further-coded ancillary datastream. Nominally, the code rate of AVSB is one-half the code rate of ordinary 8VSB in its less robust form or one-quarter the code rate of ordinary 8VSB in its more robust form. AVSB uses a specially designed form of turbo coding that incorporates the ⅔ trellis coding characteristic of 8VSB DTV signals, so turbo coding is accomplished just halving the ordinary code rate for 8VSB. This special form of turbo coding is not systematic; that is, the data do not appear in their original form in the signal resulting from the turbo coding. The data to be turbo coded are randomized and then subjected to (207, 187) R-S FEC coding, and the resulting (207, 187) R-S FEC codewords are subsequently turbo coded using serially concatenated convolutional coding (SCCC).

In 2007 Samsung engineers proposed adapting their AVSB transmission system for mobile reception by DTV receivers that are carried by fast-moving vehicles such as automobiles, buses or railroad passenger cars. Such reception is disrupted by momentary "deep fades" or drop-outs in received signal strength as the vehicle moves through underpasses or passes large buildings blocking the transmission path. To help a mobile DTV receiver withstand these momentary drop-outs, the Samsung engineers introduced an outer byte interleaver after the encoder used to generate the (207, 187) R-S FEC codewords supplied for turbo coding. This outer byte interleaver spread the successive bytes of each (207, 187) R-S FEC codeword apart so far that fewer of them would be lost during a momentary drop-out. Hopefully, so few bytes would be lost in each (207, 187) R-S FEC codeword that the Reed-Solomon decoding apparatus in a DTV receiver designed for mobile reception would be able to correct the codeword and restore the missing bytes.

The inventor of the apparatuses described in this specification, hereinafter referred to simply as "the inventor", perceived that the Samsung proposal had a basic flaw in regard to a DTV receiver designed for mobile reception of turbo coded DTV signals. Turbo coding primarily benefits the AWGN performance of a receiver. Much of the improvement in the AWGN performance of a receiver at low signal-to-noise ratios (SNR) derives from iteration of the turbo decoding procedures. Reed-Solomon forward-error-correction coding the data to be turbo coded has been considered previously for improving the ability of the receiver to withstand burst error as well. However, the inventor perceived that R-S-FEC coding has a further advantage in that R-S decoding can be used to determine when iteration of turbo decoding procedures allows the R-S decoding to restore the data in the transmitted R-S FEC codeword to its original form. The iteration of the turbo decoding procedures can be discontinued for that data, thus to conserve the power that would otherwise be consumed by further iteration. Keeping power consumption of the DTV receiver low is a major design concern, especially for receivers to be sold in California, which has stringent limitations on power consumption in consumer devices.

The outer byte interleaver that Samsung engineers introduced between R-S FEC coding and turbo coding in the DTV transmitter requires a matching outer byte de-interleaver between turbo decoding and outer R-S decoding in the DTV receiver. This outer byte de-interleaver has such long latent delay associated with it that feedback from the outer R-S decoding is generated too late for timely shutting down iteration of turbo decoding procedures. The inventor concluded that the outer byte interleaving in the DTV transmitter should be done after both R-S FEC coding and turbo coding are completed.

The inventor reasoned that this would permit re-positioning the outer byte de-interleaver to precede the cascade connection of turbo and outer R-S decoders in a DTV receiver, supposing that outer R-S decoder was to feed back control information to the turbo decoder. This placement does not facilitate the ⅔ trellis decoder being included within the turbo decoding apparatus as Samsung engineers do in AVSB, however. The ⅔ trellis decoding has to be considered to be a preliminary decoding procedure that is serially concatenated with the subsequent turbo decoding procedure. This observation led the inventor to contemplate outer de-interleaving being done after ⅔ trellis decoding, convolutional byte de-interleaving, decoding of (207, 187) R-S FEC coding and data de-randomization were performed as prescribed by A/53. Turbo decoding would then follow the outer de-interleaving. A convenient feature of this arrangement is that de-randomization is completed before iterative turbo decoding and is done at a point in the system where the time base is well defined. The soft-decision information associated with the preliminary ⅔ trellis decoding procedure can be passed along to the subsequent turbo decoding procedure even though there are intervening steps of data randomization, de-interleaving, and possibly symbol re-coding. The turbo coding can use parallelly concatenated turbo code, already proven in wireless communications, which would constrain code rate to being no greater than one-third that of ordinary 8VSB.

In the AVSB system the tail bits of the turbo code encoding procedures are discarded. Preserving the tail bits of the turbo code encoding procedures improves decoding performance at low SNR by facilitating sweeps through the trellis in reverse direction as well as forward direction. This tends to reduce the number of iterations required for correcting bit errors, so decoding can proceed at slower speeds and consume less power. This also facilitates forward-backward turbo decoding algorithms correcting bit errors in both initial and final portions of a turbo codeword that are separated by burst error resulting from a protracted deep fade. Correcting the bit errors caused by AWGN in the initial and final portions of a turbo codeword thus corrupted increases the chances of being able to correct the recovered data by subsequent R-S decoding procedures. That is, the forward-backward turbo decoding algorithms can work from both ends of a turbo codeword to attempt to close the extent of a burst error that the subsequent R-S decoding procedure must then attempt to overcome.

Part of the AVSB system proposed by Samsung engineers concerns supplemental training signals being interspersed throughout transmitted fields of trellis-coded data. These supplemental training signals are introduced as private data within adaptation fields of successive MPEG-2 compatible packets, including those packets that are involved in ordinary 8VSB transmissions as well as the null packets that are employed for AVSB turbo code transmissions. These supplemental training signals are touted as being necessary for adaptive equalization being able to track the fast-changing dynamic multipath reception conditions encountered in mobile reception. Most current DTV receiver designs use forms of adaptive equalization that rely on incremental auto-regression techniques of one sort or other. They usually combine elements of the Wiener technique, which relies on training signal for developing error signals to adjust equalization, and the Kalman technique, which develops error signals to adjust equalization from ordinary data symbols. Because these adaptive equalization techniques use incremental feedback adjustments, they are inherently slow, Kalman-type auto-regression techniques generally being slower than the Wiener-type auto-regression techniques that rely on training signal. Supplemental training signals support somewhat faster tracking of rapidly changing multipath reception conditions in adaptive equalization techniques that use incremental feedback adjustments.

In another technique attributable to Dr. J. Douglas McDonald, the channel impulse response (CIR) is computed by auto-correlating a sliding window 4096 symbols wide. Computation of the CIR is done using discrete Fourier transform, or DFT. Incidentally, this facilitates initial frequency-domain equalization in a DTV receiver to whiten the channel frequency response. Each computation of CIR can be made very quickly. If multipath conditions are slow-changing, the CIR computations can be averaged over longer time periods to improve accuracy of the equalization. If multipath conditions change rapidly, however, the averaging can be curtailed to speed up equalization adjustment much more than possible with Kalman-type or Wiener-type auto-regression techniques or variants of those techniques. The bottom line is that the data-randomized 8VSB signal contains enough information to implement adaptive equalization even when multipath conditions change rapidly without need for additional training signals.

Accordingly, the transmission of turbo coding in the adaptation fields of MPEG-2-compatible null packets following several bytes of supplemental training signal per AVSB unnecessarily costs code overhead. A better procedure is to pack turbo coding into the entire 184-byte payload-data fields of MPEG-2-compatible null packets. A special PID could be established to identify the packets having their payload-data fields packed with turbo coding, of course, rather than null packets being used.

The inventor initially considered turbo coding (207, 187) R-S FEC codewords individually, so the internal bit interleaver in the turbo code encoder would have to permute 207×8=1656 bits. However, he considered whether higher interleaver gains could be fitted into the 8VSB signal. The inventor observed that eight (207, 187) R-S FEC codewords fit exactly into nine 184-byte payload-data fields, which suggested to him that the input signal to the turbo code encoder could conveniently be parsed into blocks of 207×8×8=184×9×8=13,248 bits. This sets a size for the internal bit interleaver that is within the capability of bit interleaver designs currently used in turbo code encoders for wireless telephony. Presuming the turbo code encoder to use two recursive systematic convolutional code encoders that are parallelly concatenated, each block of input signal consisting of 13,248 bits generates a respective turbo codeword consisting of 3×13,248+12=39,756 bits. The twelve additional bits are turbo code tail bits.

In AVSB the tail bits associated with turbo codewords are discarded before packing into the adaptation fields of MPEG-2-compatible data packets. It is preferable to transmit the tail bits associated with turbo codewords, however. The tail bits improve forward and back decoding procedures for turbo codewords, particularly when reverse sweeping through the trellises. The improved decoding of each turbo codeword tends to reduce the number of times the forward and back decoding procedures need be iterated to obtain satisfactory bit error rate for low-SNR AWGN reception conditions. This furthers the primary objective of the invention to reduce the power consumed by the receiver during decoding of turbo code.

Furthermore, improving the capability to reverse sweep through the trellises helps to overcome drop-outs in signal strength that occur during the mid portions of turbo codewords. The portion of the turbo codeword occurring after the deep fade is more quickly decoded. Accordingly, a sufficient amount of the R-S FEC codeword to permit its correction is likely to be earlier available. The correction of the R-S FEC codeword restores the data lost because of the deep fade.

The inventor discerned that the successive bytes of turbo codewords should be transversely disposed relative to the payload-data fields of the MPEG-2 compatible packets they are packed into before being time-division multiplexed with other MPEG-2 compatible packets to form data fields. The MPEG-2 compatible packet in these data fields are provided with inner (207, 187) R-S FEC coding and subjected to inner byte interleaving, with the resulting data then being encoded with 12-phase ⅔ trellis code. The inner byte interleaving is of a convolutional type that spreads the bytes in each inner (207, 187) R-S FEC codeword to be 52 byte intervals apart. Because the inner byte interleaving is of convolutional type, there are periodic snaps back in time of 51 data segment intervals.

If the bytes of turbo codewords are interleaved correctly, then each byte of a turbo codeword occupies the same position within the payload-data field of a respective MPEG-2 compatible packet and the inner (207, 187) R-S FEC codeword generated therefrom as the other bytes of that turbo codeword. So, the inner byte interleaving shifts all the bytes of each turbo codeword by the same amount in time, and the intervals between successive block-interleaved bytes remain alike. Accordingly, the convolutional inner byte interleaving does not affect a turbo-coded outer R-S FEC codeword, the bytes of which are block-interleaved, so as to alter the capability of that codeword to overcome a deep fade.

Positioning codewords transversely across the payload-data fields of MPEG-2 compatible packets transmitted by 8VSB has other advantages. There is no need to constrain the length(s) of codewords, so that each will fit exactly within the 184-byte width of a respective payload-data field, or so that a whole number of codewords will fit exactly within a reasonably small multiple of that 184-byte width. Also, there need be no concern that coding artifacts will appear to be echoes to the adaptive equalization filtering in DTV receivers. There are fewer, if any, constraints as to how data segments containing other 8VSB signals are time-division multiplexed with the data segments containing turbo coding. The inventor noted that transverse interleaving by the outer byte interleaver results in the inner and outer R-S coding being cross-interleaved, and so essentially comprising cross-interleaved Reed-Solomon codes (CIRC). This holds out the possibility that CIRC techniques might eventually be found to be of use in difficult decoding situations.

The inventor spent some time seeking a technique to construct outer interleavers that would position codewords transversely across the payload-data fields of MPEG-2 compatible packets and could also overcome deep fades lasting as long as a second. Convolutional interleaver designs that he initially attempted required very large numbers of temporary storage locations in memory, leading him to consider block interleaver designs and combinations of convolutional and block interleaver designs. None of these designs were completely satisfactory, so he conducted a thorough search of patents to interleavers. He found a type of block interleaver described generally in U.S. Pat. No. 5,907,560 issued 25 May 1999 to P. M. P. Spruyt and titled "Method for interleaving data frames, forward error correcting device and modulator including such a device" that could be adapted to provide the desired outer byte interleavers. The required number of temporary storage locations in memory were substantially lower than in the byte interleaver design inspired by the Spruyt patent than other interleaver designs the inventor had considered. Analysis of the interleaver problem working back from knowledge of these various interleaver designs seemed to indicate that the number of temporary byte-storage locations in memory could not be further reduced.

During the course of his work the inventor discerned that the placement of bytes of the turbo coding within the turbo codewords supplied for outer byte interleaving was crucial in securing best performance of the R-S FEC coding in overcoming deep fades. Bytes of the parity bits associated with each byte of data should be closely grouped with that byte of data in the turbo codeword supplied for outer byte interleaving by Spruyt's method. This minimizes the amount of the turbo codeword that a deep fade renders unfit for turbo decoding. More of the turbo codeword survives for turbo decoding. Turbo decoding in the forward direction from the beginning of the codeword can recover more data from the initial surviving portion of the codeword than otherwise possible. Turbo decoding in the reverse direction from the conclusion of the codeword can recover more data from the final surviving portion of the codeword than otherwise possible. Accordingly, the hiatus in data that decoding of the R-S FEC coding must correct for is kept as small as possible.

Another known technique for overcoming fading is called "staggercasting", a variant of which Thomson, Inc. has proposed be used in robust 8VSB transmissions. Staggercasting communications systems transmit a composite signal including two component content-representative signals, one of which is delayed with respect to the other. The composite signal is broadcast to one or more receivers through a communications channel. At a receiver, delayed response to the earlier transmitted component content-representative signal supplied from a buffer memory is contemporaneous in time with the later transmitted component content-representative signal. Under normal conditions, the receiver detects and reproduces the content of the later transmitted signal as soon as it is received. However, if a deep fade occurs, then the receiver detects and reproduces the content of the earlier transmitted signal as read from buffer memory. If the delay period and the associated delay buffer are large enough, then fairly long deep fades can be overcome. This capability not only requires a several fold increase in the amount of memory required in a receiver; it halves the effective code rate of the transmission.

The inventor perceived that the processing of soft decisions in turbo decoding allows a more sophisticated approach to be taken for the reception of staggercasting. Soft decisions concerning the contents of an earlier transmitted data packet and concerning the contents of a later transmitted data packet can be analyzed for selecting which of corresponding portions of the two packets is more likely to be correct. The selection procedure can synthesize a packet that is more likely to be correct than either of the packets from which the parts of the synthesized packet are drawn. The synthesized packet can then be subjected to turbo decoding and R-S decoding procedures.

The inventor discerned that this synthesis procedure can provide more than a tenfold increase in the capability of the turbo coding to withstand dropouts in received signal strength with only a doubling of receiver memory. This is accomplished by using a novel form of staggercasting in which each successive turbo codeword is immediately repeated in its transmission.

SUMMARY OF THE INVENTION

In digital television signals transmitted in accordance with aspects of the invention turbo coded Reed-Solomon codewords are transversally disposed in the payload fields of encapsulating MPEG-2-compliant packets, rather than laterally, to improve the capability of the Reed-Solomon coding to overcome deep fades. Other aspects of the invention concern DTV receiver apparatuses for such digital television signals. Still other aspects of the invention concern DTV transmitter apparatuses in which turbo coded Reed-Solomon codewords are subjected to supplemental outer interleaving after turbo coding.

Still further aspects of the invention concern the use of novel forms of staggercasting further to improve the capability of the turbo coding to overcome deep fades. One of these further aspects of invention concerns "punctured" staggercasting of turbo codewords in which only the data components of turbo codewords are twice transmitted, with parity components being transmitted only once, so code rate is reduced by a smaller factor than two.

DETAILED DESCRIPTION

Figure 1:
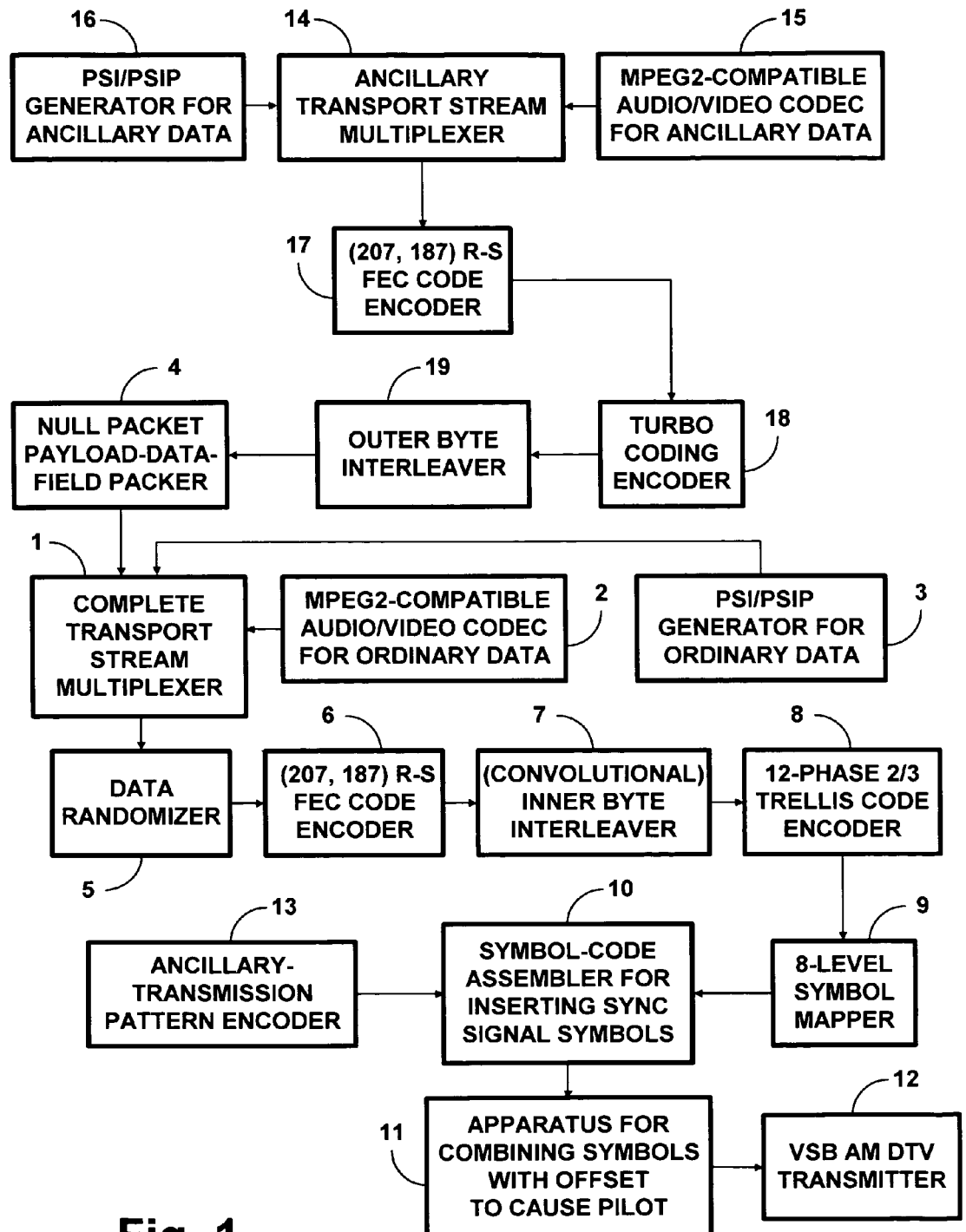
FIG. 1 is a schematic diagram of transmitter apparatus for broadcast digital television signals designed for improved reception by mobile receivers, which transmitter apparatus embodies an aspect of the invention.

FIG. 1 shows a multiplexer 1 for assembling the complete transport stream. The complete-transport-stream multiplexer 1 is connected for time-division multiplexing 187-byte MPEG-2-compatible data packets from an audio/video codec 2, from a PSI/PSIP generator 3 and from a null-packet payload-data-field packer 4. The codec 2 and PSI/PSIP generator 3 are associated with the transmission of ordinary 8VSB data. When turbo code is transmitted, the null-packet payload-data-field packer 4 packs it into the payload data fields of MPEG-2 null packets. The 13-bit PIDs of these null packets will all be ONEs, in compliance with the MPEG-2 convention for designating null packets. Decoding of the turbo coding in new DTV receivers is facilitated if the null packets that have turbo coding packed into their payload data fields by the null-packet payload-data-field packer 4 have consecutive continuity count components.

Rather than the continuity count component being constrained to just the final half of the third byte of each of these 187-byte null packets, the continuity count can be extended to fill the complete third byte of each of them. This permits modulo-256 counting of the null packets that contain turbo coding, rather than just modulo-16 counting of them. Since legacy DTV receivers discard the null packets containing turbo code anyway, such extension of the continuity count does not affect the operation of these receivers. Extension of the continuity count could adversely affect the operation of receivers designed for AVSB reception, however.

The complete-transport-stream multiplexer 1 is further connected for applying the time-division multiplexed MPEG-2-compatible data packets to a data randomizer 5 to be exclusive-ORed with portions of a pseudo-random binary sequence (PRBS) prescribed in A/53, Annex D, §4.2.2 titled "Data randomizer". The data randomizer 5 is connected for supplying the resulting randomized 187-byte MPEG-2-compatible data packets to an encoder 6 that generates a respective (207, 187) Reed-Solomon forward-error-correction codeword in response to each of these packets. This inner (207, 187) R-S FEC code encoder 6 is of the sort described in A/53, Annex D, §4.2.3 titled "Reed-Solomon encoder". The (207, 187) R-S FEC code encoder 6 is connected for supplying its 207-byte codewords to an inner byte interleaver 7 of convolutional type as described in A/53, Annex D, §4.2.4 titled "Interleaving". The inner byte interleaver 7 is connected to supply the convolutionally interleaved bytes of the (207, 187) R-S FEC codewords to a 12-phase encoder 8 for ⅔ trellis code. The 12-phase encoder 8 is of the sort described in A/53, Annex D, §4.2.5 titled "Trellis coding" and supplies groups of three bits to an 8-level symbol mapper 9 as also described in §4.2.5, which 8-level symbol mapper 9 is customarily constructed using read-only memory (ROM). The mapper 9 is connected to supply 8-level symbols to a symbol code assembler 10 which inserts data segment synchronization (DSS) symbols and data field synchronization (DFS) symbols into the symbol stream before it is supplied to apparatus 11. The apparatus 11 combines the symbols with an offset to supply digital modulating signal to a vestigial-sideband amplitude-modulation (VSB AM) transmitter 12 for DTV signal.

Except for the complete-transport-stream multiplexer 1 time-division multiplexing into the complete transport stream the packets received from the null-packet payload-data-field packer 4, the transmitter practice described in the previous two paragraphs is substantially the same as was prescribed by A/53 Annex D. The reserved section of the DFS signal at the beginning of each data field, however, contains a code sequence specifying the pattern of the ancillary (turbo-code) transmission in at least that field. FIG. 1 shows an encoder 13 connected for supplying these code sequences to the symbol code assembler 10. The encoder 13 can, for example, be similar to those previously designed for use in enhanced-VSB DTV signal transmitter apparatuses.

FIG. 1 further shows a transport stream multiplexer 14 for ancillary data. This ancillary transport stream multiplexer 14 is connected for time-division multiplexing MPEG-2-compatible data packets from an audio/video codec 15 and from a PSI/PSIP generator 16. The codec 15 and PSI/PSIP generator 16 are associated with the transmission of ancillary data that are turbo coded. (In regard to the PSI/PSIP generators 3 and 16, the acronym PSI stands for Program Specification Information, and the acronym PSIP stands for Program and System Information Protocol.) The transport stream multiplexer 14 is connected for applying 187-byte data packets in the ancillary transport stream that it assembles to an encoder 17 for (207, 187) Reed-Solomon forward-error-correction coding. The R-S FEC coding can be utilized by DTV receivers of the sorts shown in FIGS. 6, 9 and 11 to determine when the decoding of turbo coding regenerates one of the outer (207, 187) R-S FEC codewords from the encoder 17.

The encoder 17 is connected for supplying the outer (207, 187) R-S FEC codewords that it generates to an encoder 18 for turbo coding. The encoder 18 can, for example, resemble encoders for parallelly concatenated convolutional coding (PCCC) used in the third-generation Universal Mobile Telephone System (UMTS) cellular telephony.

An outer byte interleaver 19 is connected for receiving the turbo coding generated by the encoder 18. The outer byte interleaver 19 is designed so the (207, 187) R-S FEC coding can correct for drop-outs in signal strength as long as a second or so in duration. The outer byte interleaver 19 is preferably a matrix type block interleaver into which data bytes are written row by row and from which data bytes are read column by column. The outer byte interleaver 19 is connected for supplying the stream of bytes of interleaved turbo coding therefrom to the null-packet payload-data-field packer 4.

Figure 2:
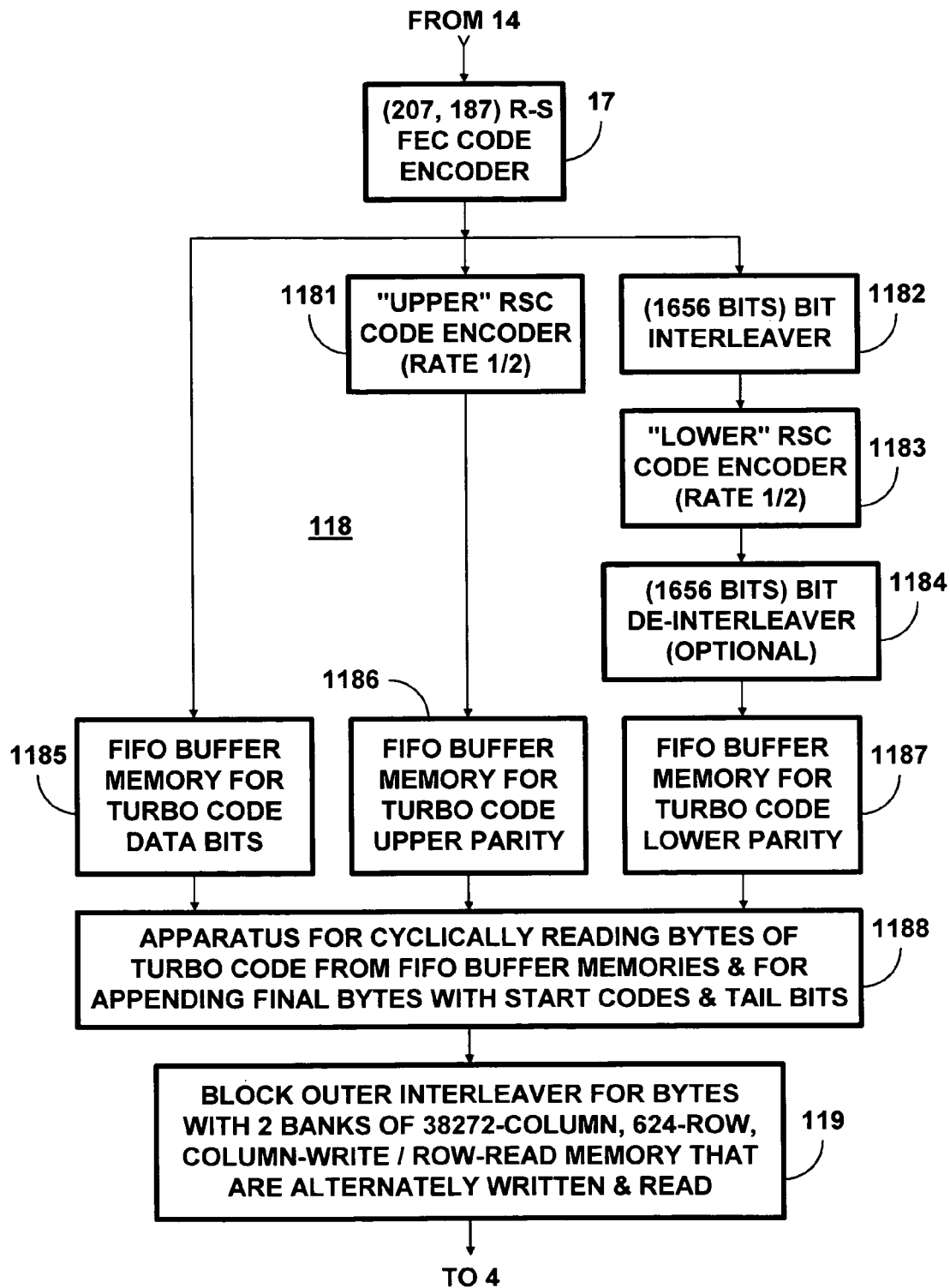
FIG. 2 is a detailed schematic diagram of a turbo code encoder and an outer byte interleaver used in an embodiment of the FIG. 1 transmitter apparatus that turbo codes individual 207-byte data segments, using parallelly concatenated convolutional codes.

FIG. 2 shows a PCCC encoder 118 and an outer byte interleaver 119, which are used as the turbo code encoder 18 and the outer byte interleaver 19 in an embodiment of the FIG. 1 transmitter apparatus that turbo codes individual Reed-Solomon forward-error-correction codewords using parallelly concatenated convolutional coding (PCCC). FIG. 2 shows the encoder 17 for supplying (207, 187) R-S FEC codewords connected directly to an "upper" recursive systematic convolutional code encoder 1181 and via a bit interleaver 1182 to a "lower" recursive systematic convolutional code encoder 1183. The bit interleaver 1182 has capacity for permuting the order of the 1,656 bits in a single (207,187) R-S FEC codeword. The "upper" RSC code encoder 1181 generates a respective set of "upper" parity bits that extend for two hundred seven 8-bit bytes plus three tail bits in response to each of the (207,187) R-S FEC codewords directly supplied thereto. The "lower" RSC code encoder 1183 generates a respective set of "lower" parity bits that extend for two hundred seven 8-bit bytes plus three tail bits in response to each of the (207,187) R-S FEC codewords supplied thereto in interleaved form via the bit interleaver 1182. The "upper" RSC code encoder 1181, the bit interleaver 1182 and the "lower" RSC code encoder 1183 are of the types used in third-generation UMTS, for example.

The bit interleaver 1182 randomizes the ordering of the data in an irregular manner, rather than trying to space the data out according to a regular pattern. Parallelly concatenated turbo coding (PCCC) is linear coding. A linear code is a code for which the modulo-2 sum of two valid codewords (found by XOR-ing each bit position) is also a valid codeword. The Hamming weight of a codeword is the number of ONEs that it contains. All linear codes must contain the all-zeros codeword, since any code word XOR-ed with itself will produce all zeros. A "good" linear code has mostly high-weight code words beside the mandatory all-zeros codeword. High-weight codewords are desirable because they tend to be more distinct from other codewords, so the decoder has an easier time distinguishing among them. While a few low-weight codewords can be tolerated, they should be relatively infrequent. Turbo coding is a good way to reduce the occurrence of low-weight codewords. The weight of the turbo codeword is the sum of the weights of the data bits component, the "upper" parity bits component and the "lower" parity bits component of the codeword. Low weight of one of the parity bits components can be tolerated as long as the other has high weight. The input data supplied to the "lower" RSC code encoder 1183 are scrambled by the interleaver 1182, but the input data supplied to the "upper" RSC code encoder 1183 are not. So, the "lower" parity code output from the "lower" RSC code encoder 1183 usually differs quite a bit from the "upper" parity code output from the "upper" RSC code encoder 1181. While it is quite probable that one of the two RSC code encoders 1181 and 1183 will occasionally produce a low-weight output, the probability that both encoders simultaneously produce a low-weight output is extremely small. This improvement is called "interleaver gain" and is one of the main reasons that turbo coding performs so well in overcoming AWGN. Generally, the more random the bit interleaving pattern in the bit interleaver 1182, the higher the interleaver gain.

In a departure from conventional encoding practice for turbo coding, a bit de-interleaver 1184 is connected to receive the "lower" parity code output from the "lower" RSC code encoder 1183. The bit de-interleaver 1184 provides bit de-interleaving of the "lower" parity code complementary to the bit interleaving of the data by the bit interleaver 1182. This rearranges the "lower" parity code bits so that they can be better aligned in time with delayed response to the data bits used to generate them. This can reduce the extent of the disruption of data recovery from turbo codewords caused by deep fades. In less preferred embodiments of the turbo code encoder 118, the bit de-interleaver 1184 is not employed and the "lower" parity code output from the "lower" RSC code encoder 1183 is directly applied to subsequent circuitry, yet to be described.

FIG. 2 shows the encoder 17 connected for supplying (207, 187) R-S FEC codewords to a first-in, first-out buffer memory 1185 for 207-byte segments of turbo code data bits. Each (207, 187) R-S FEC codeword, which may alternatively be extracted from the "upper" RSC code encoder 1181, is written into the FIFO buffer memory 1185 as the principal part of one of the 208-byte segments of turbo code data bits temporarily stored in the memory 1185. Three tail bits from the "upper" RSC code encoder 1181 are appended to the conclusion of the (207, 187) R-S FEC codeword, and three tail bits from the "lower" RSC code encoder 1183 are further appended. FIG. 2 does not explicitly show the connections for writing these six tail bits into the FIFO buffer memory 1185. The "upper" RSC code encoder 1181 is connected for writing each successive set of "upper" parity bits that extend for two hundred seven 8-bit bytes plus three tail bits into another first-in, first-out buffer memory 1186. This writes into the FIFO buffer memory 1186 the principal part of one of the 208-byte segments temporarily stored therein. Yet another first-in, first-out buffer memory 1187 is connected for receiving each successive set of "lower" parity bits that extend for two hundred seven 8-bit bytes, either directly from the "lower" RSC code encoder 1183 or preferably after being rearranged by the bit de-interleaver 1184. The FIFO buffer memory 1187 is further connected for additionally receiving three tail bits from the "lower" RSC code encoder 1183. Each successive set of "lower" parity bits that extend for two hundred seven 8-bit bytes plus three tail bits together form the principal part of one of the 208-byte segments temporarily stored in the first-in, first-out buffer memory 1187. The FIFO buffer memories 1185 and 1186 provide delays compensating for the latent delays in the bit interleaver 1182 and in the bit de-interleaver 1184, if used. The FIFO buffer memory 1185 provides further delay compensating for the latent delays in the RSC code encoders 1181 and 1182. The FIFO buffer memories 1185, 1186 and 1187 also support interleaving of the turbo code components they respectively store, which interleaving in a departure from ordinary practice is done on a byte-by-byte basis to facilitate R-S FEC coding correcting burst errors arising from deep fades.

Apparatus 1188 cyclically reads a successive byte of the data bits component of the turbo code stored in the FIFO buffer memory 1185, a successive byte of the "upper" parity bits component of the turbo code stored in the FIFO buffer memory 1186, and a successive byte of the "lower" parity bits component of the turbo code stored in the FIFO buffer memory 1187. The apparatus 1188 time-division multiplexes the cyclically read successive bytes of each component and appends a 12-bit codeword separator sequence to generate 624-byte turbo codewords. These 624-byte turbo codewords are written into respective columns of byte-storage locations in one of two banks of memory in the outer byte interleaver 119.

The two banks of memory in the outer byte interleaver 119 alternate between being written and being read. A succession of 624-byte turbo codewords are written into respective columns of byte-storage locations in one bank of the memory while the rows of byte-storage locations in the other bank are being read out to the null-packet payload-data-field packer 4. Each bank of the memory contains M times 184 columns of byte-storage locations, M being an integer. When reading from a row of byte-storage locations in either bank of memory each successive group of 184 byte-storage locations furnishes the 184 bytes of data that the packer 4 will pack into one payload-data field. The integer M is chosen to be the number of payload-data fields that will occur between one byte and the next of a turbo codeword being read from one of the two banks of memory in the byte interleaver 119.

Suppose the outer byte interleaver 119 is to spread the bytes of each 624-byte turbo codeword so that a deep fade of about one second duration can be overcome by a decoder for (207, 187) R-S FEC codewords that follows the decoder for turbo coding in the DTV receiver. Presumably the decoder for turbo coding can locate erasures caused by the drop-out, so the decoder for (207, 187) R-S FEC codewords can restore as many as twenty lost bytes. These lost bytes can be as far apart as one-twentieth of a second, then, which is essentially the duration of a 626-segment data frame. If turbo coding is transmitted in all 312 segments of each successive data field, the bytes of the data component of the turbo coding have to occur at least one data frame apart. Because of the 1:1:1 interleaving of the bytes of the data component with the bytes of two other turbo coding components, the bytes of each turbo codeword have to occur at least one third of a data frame apart—i.e., at least 208 data segments apart. So, M has to be 208 in the outer byte interleaver 119. Each of the two banks in the byte interleaver 119 has 208×184=38,272 columns and 624 rows of byte-storage locations therein.

Each bank of memory in the byte interleaver 119 stores payload-data fields for 208 data frames. So, there is about a ten second latent delay in the byte interleaver 119 and another ten second or so latent delay in the matching byte de-interleaver in a DTV receiver. If the transport stream multiplexer 1 regularly interleaves MPEG-2-compatible packets of other 8VSB data in N:1 ratio with the MPEG-2-compatible packets containing turbo coding payload, N being a positive integer, deep fades of about (N+1) seconds will be tolerated in a DTV system using transmitter apparatus as shown in FIGS. 1 and 2. The perceived latent delay in the ancillary data will also increase by a factor of (N+1).

Figure 3:
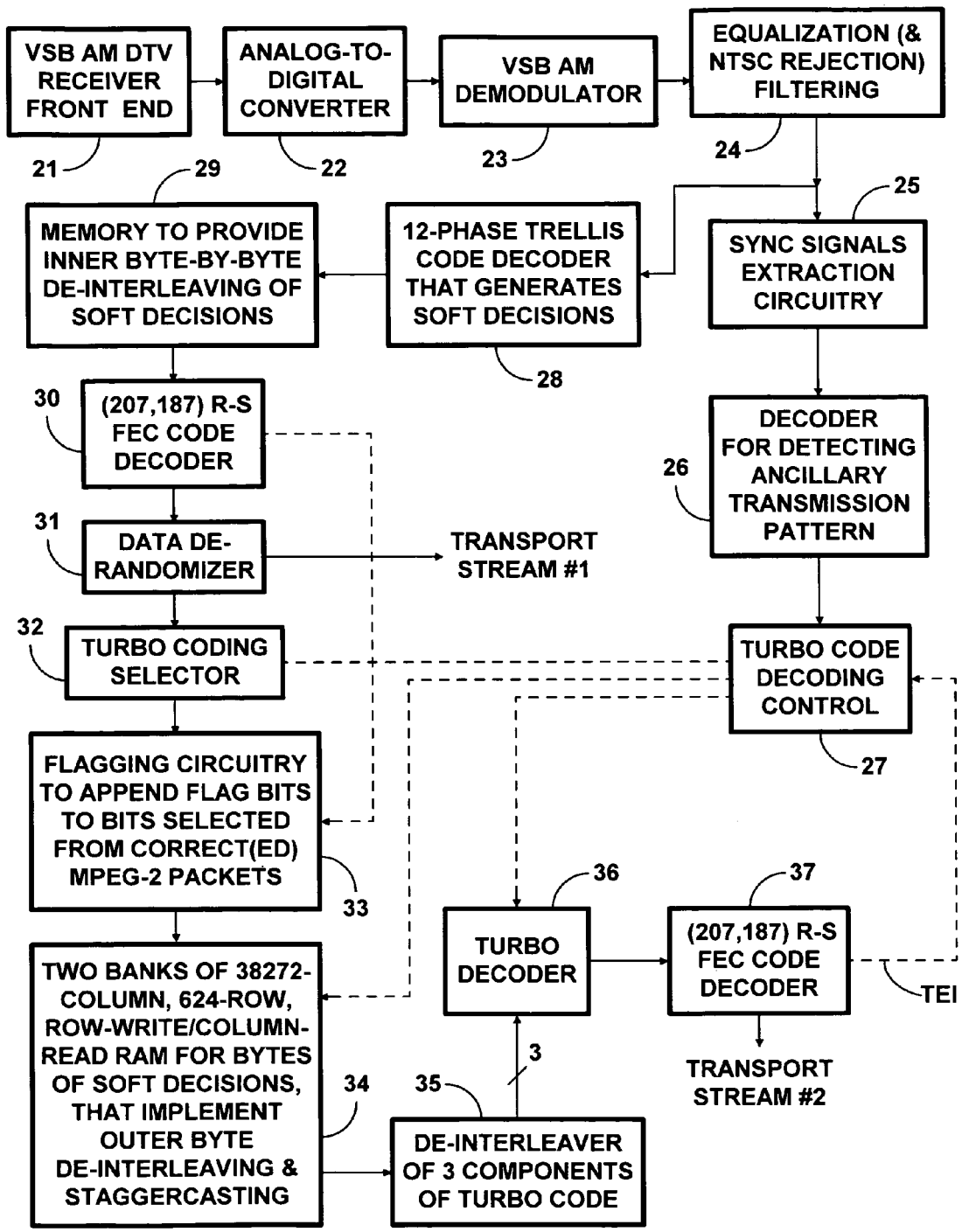
FIG. 3 is a schematic diagram of receiver apparatus for broadcast digital television signals transmitted by transmitter apparatus of the sort shown in FIGS. 1 and 2, which receiver apparatus embodies an aspect of the invention.

FIG. 3 shows receiver apparatus for DTV signals transmitted by transmitter apparatus of the general sort shown in FIG. 1, supposing that the turbo code encoder 18 and the byte interleaver 19 are the turbo code encoder 118 and the byte interleaver 119 shown in FIG. 2. The FIG. 3 DTV receiver apparatus includes a vestigial-sideband amplitude-modulation (VSB AM) DTV receiver front-end 21 for selecting a radio-frequency DTV signal for reception, converting the selected RF DTV signal to an intermediate-frequency DTV signal, and for amplifying the IF DTV signal. An analog-to-digital converter 22 is connected for digitizing the amplified IF DTV signal supplied from the DTV receiver front-end 21. A demodulator 23 is connected for demodulating the digitized VSB AM IF DTV signal to generate a digitized baseband DTV signal, which is supplied to digital filtering 24 for equalization of channel response and for rejection of co-channel interfering NTSC signal. Synchronization signals extraction circuitry 25 is connected for receiving the digital filtering 23 response. Responsive to data-field-synchronization (DFS) signals, the sync signals extraction circuitry 25 detects the beginnings of data frames and fields. Responsive to data-segment-synchronization (DSS) signals, the sync signals extraction circuitry 25 detects the beginnings of data segments. The FIG. 3 DTV receiver apparatus uses the DSS and DFS signals for controlling its operations similarly to the way this is conventionally done. FIG. 3 does not explicitly show the circuitry for effecting these operations.

A decoder 26 for detecting the ancillary transmission pattern responds to the ancillary transmission pattern code contained in the reserved portions of DFS signals separated by the synchronization signals extraction circuitry 25. The decoder 26 is connected for supplying ancillary transmission pattern information to turbo code decoding control circuitry 27 that controls turbo decoding in the FIG. 3 DTV receiver apparatus. The decoder 26 can, for example, be similar to those previously designed for use in enhanced-VSB DTV signal receiver apparatuses.

A 12-phase trellis code decoder 28 of a type that generates "soft" decisions as well as "hard" decisions is connected for receiving the digital filtering 24 response. For example, the decoder 28 employs the soft-output Viterbi algorithm (SOVA). By way of alternative example, the decoder 28 employs the maximum a posteriori (MAP) algorithm. The trellis code decoder 28 can take advantage of the initial two bytes of a null packet having known values, being connected to receive information of when null packets occur from the decoder 26 via a connection not shown in FIG. 4. A plural-port memory 29 is connected for receiving soft-decision decoding results from the trellis code decoder 28 and providing byte-by-byte de-interleaving of those results, which are used to generate input signal for a Reed-Solomon decoder 30 of the de-interleaved (207, 187) R-S FEC codewords read from the memory 29. Preferably, the R-S decoder 30 is of a sort that can use the soft-decision information concerning the de-interleaved (207, 187) R-S FEC codewords to improve overall performance of the decoders 28 and 30. The R-S decoder 30 is connected for supplying randomized data packets to a data de-randomizer 31, which exclusive-ORs the bits of the randomized data packets with appropriate portions of the PRBS prescribed in A/53, Annex D, §4.2.2 to generate de-randomized MPEG-2-compatible data packets of a first, principal transport stream. Insofar as the R-S decoder 30 is capable, it corrects the 187-byte randomized data packets that it supplies to the data de-randomizer 31.

The R-S decoder 30 is connected for supplying the turbo code decoding control circuitry 27 indications of whether there are uncorrected byte errors in each MPEG-2 compatible data packet in the first transport stream. If the R-S decoder 30 finds a recovered data packet to be correct or corrects the recovered data packet, the turbo code decoding control circuitry 27 will use this information to control the filling of subsequent buffer memory from the first transport stream. FIG. 3 does not show this subsequent buffer memory.

The de-randomizer 31 is connected for supplying the first transport stream to a turbo-coding selector 32. If the R-S decoder 30 is a soft-input/soft-output type, as preferred, the de-randomizer 31 passes on soft-decision information concerning data packets that the R-S decoder 30 was unable to correct. The turbo-coding selector 32 separates the turbo coding that is contained in the payload portions of the null packets in the first transport stream and subsequently supplies the separated turbo coding to flagging circuitry 33. Except for errors incurred in transmission and reception, the separated turbo coding reproduces the bit-interleaved outer coding from the outer byte interleaver 19 in the FIG. 1 DTV transmitter apparatus.

The flagging circuitry 33 is connected for appending a respective flag bit to each bit of the response from the turbo coding selector 32, which flag bit indicates whether or not the R-S decoder 30 found the 207-byte R-S codeword the bit is from to have been correct, or was able to correct that R-S codeword. The flagging circuitry 33 is connected to write the bits of separated turbo coding, together with their respective flag bits, to a memory 34 operated as a block de-interleaver for turbo coding. Note that despite intervening procedures in elements 29-33 the soft-decision information from the 12-phase trellis decoder 28 can be passed down to the memory operated as a block de-interleaver for turbo coding.

The memory operated as a block de-interleaver in a receiver for the signals transmitted by the FIG. 1 transmitter apparatus is written to row-by-row and read from column-by-column to performing outer de-interleaving in accordance with a pattern that complements the pattern of interleaving by the outer byte interleaver 19. Supposing that the outer byte interleaver 19 in the FIG. 1 transmitter apparatus is the interleaver 119 shown in FIG. 2, the memory in which is separated into two banks to be alternately written to and read from, the memory 34 is similarly separated into two banks. Each bank includes 38,272 columns and 624 rows of byte-storage locations with attendant soft-decision storage capability. These two banks are alternately written to and read from in accordance with a de-interleaving pattern that complements the interleaving pattern of the interleaver 119 shown in FIG. 2. The decoder 26 for detecting the ancillary transmission pattern signals the use of this pattern to the turbo code decoding control circuitry 27. The control circuitry 27 responds to supply appropriate addressing, read commands and write commands to the memory 34. The memory 34 is operated, as controlled by the turbo code decoding control circuitry 27, to provide outer byte-by-byte de-interleaving of soft decisions as well as hard decisions in the read-out therefrom. Except for errors incurred in transmission and reception, this read-out reproduces the turbo code from the turbo code encoder 17 in the FIG. 1 DTV transmitter apparatus.

A de-interleaver 35 for separating the three components of the turbo code is connected to receive the bits of the reproduced outer coding read from the memory 34 together with their respective accompanying flag bits indicative of the likelihood of their being correct. The de-interleaver 35 separates the three components of the turbo code byte by byte for application to an outer decoder 36 for turbo code. The soft decisions and flag bits associated with the bits of the reproduced outer coding are preserved during this further de-interleaving procedure. In actual practice the de-interleaver 35 will usually be subsumed into the memory 34 by altering the addressing of its byte-storage locations that are read from. By way of example, the decoder 36 may be of a type similar to that described by M. C. Valenti and J. Sun in the article "The UMTS Turbo Code and an Efficient Decoder Implementation Suitable for Software-Defined Radios" in International Journal of Wireless Information Networks, Vol. 8, No. 4, October 2001. A Reed-Solomon decoder 37 is connected for receiving (207, 187) Reed-Solomon forward-error-correction-coded data recovered by the outer decoder 36 for turbo code. The R-S decoder 37 produces 187-byte MPEG-2-compatible data packets of a second, ancillary transport stream.

The R-S decoder 37 is further connected for supplying the turbo code decoding control circuitry 27 indications of byte errors in the 187-byte packets of ancillary data. If the R-S decoder 37 finds a recovered 187-byte data packet to be correct or corrects the recovered data packet, the turbo code decoding control circuitry 27 will discontinue further trying to correct that data packet. The turbo code decoding control circuitry 27 keeps track of the number of decoding iterations for each turbo-coded packet in the turbo data field and the number of turbo-coded data packets that remain uncorrected. The turbo code decoding control circuitry 27 uses this information to control the filling of subsequent buffer memory written from the second transport stream. FIG. 3 does not show this subsequent buffer memory. In some DTV receivers the first and second transport streams may be combined into a single transport stream using a common buffer memory. In such case, the turbo code decoding control circuitry 27 includes circuitry for arbitrating the order in which packets from the first and second transport streams are to be written into the common buffer memory.

Figure 4:
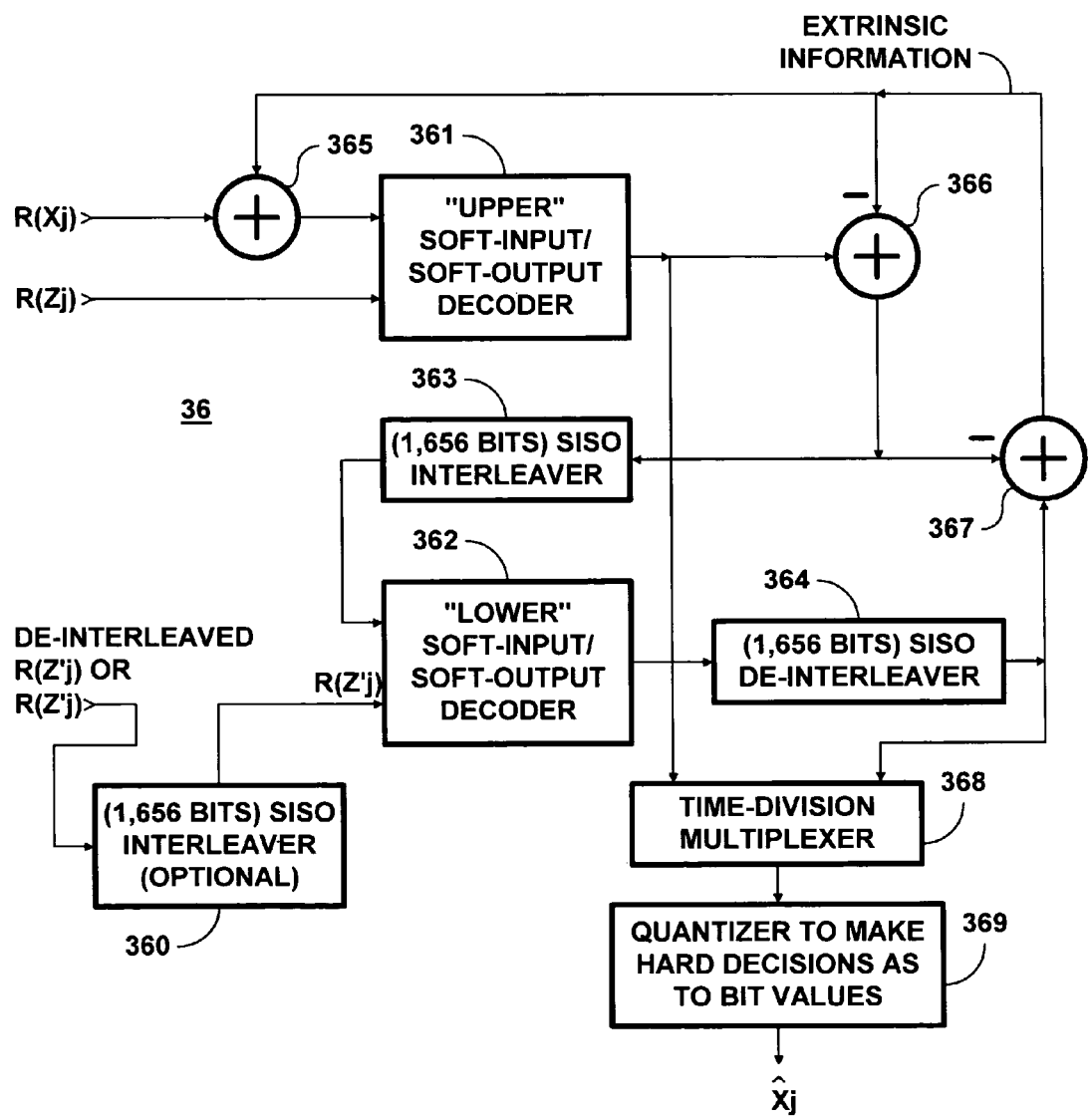
FIG. 4 is a schematic diagram showing the decoder used in each of the DTV receiver apparatuses of FIGS. 3 and 5 for turbo decoding parallelly concatenated convolutional codes.

FIG. 4 shows the basic architecture of the decoder 36 for the three components of turbo coding supplied from the de-interleaver 35 shown in FIG. 3. The three components of turbo coding supplied from the de-interleaver 35 are converted to probabilistic expressions referred to as "log-likelihood ratios" (LLRs) for use in this basic architecture for the turbo decoder 36. A distinctive feature of this basic architecture is the soft-input/soft-output interleaver 360 that is included, presuming that received signals are transmitted by transmitter apparatus as shown in FIG. 1 that is of a type that de-interleaves the "lower" parity code bits following their generation by the "lower" RSC code encoder. FIG. 4 does not show the buffer memories that are included in many of the interconnections between elements of the basic architecture of the turbo decoder 36, but are customarily omitted in diagrams of turbo decoder architecture. The basic architecture shown in FIG. 4 includes an "upper" soft-input/soft-output decoder 361, a "lower" soft-input/soft-output decoder 362, a soft-input/soft-output interleaver 363, a soft-input/soft-output de-interleaver 364, and (signed) two-input adders 365, 366 and 367. The LLRs computed by the SISO decoders 361 and 362 compare the probability that each particular data bit was a ONE versus the probability that it was a ZERO, considering soft decisions as to other bits of the received turbo codeword.

The SISO interleaver 363 is designed to accommodate soft decisions concerning the 1,656 data bits of a turbo codeword. The permutation pattern of the SISO interleaver 363 is similar to the permutation pattern of the bit interleaver 1182 used in the FIG. 2 encoder 118 for turbo coding or to the permutation pattern of the bit interleaver 2182 used in the FIG. 3 encoder 218 for turbo coding. The SISO interleaver 360, if used, uses the same permutation pattern. The SISO de-interleaver 364 uses a permutation pattern that complements the permutation pattern of the SISO interleaver 363 and also that of the SISO interleaver 360, if used.

The soft-decisions as to data bits as converted to LLR form, $R(X_j)$, are supplied as one of two summand input signals to the adder 365, to be additively combined with the other of the two summand input signals consisting of extrinsic information fed back from any previous decoding procedure the "lower" SISO decoder 362 performed on the same turbo codeword. The adder 365 is connected for supplying the sum output signal therefrom to an upper input port of the "upper" soft-input/soft-output decoder 361. A lower input port of the "upper" SISO decoder 361 is connected for receiving the first set of parity code soft-decisions $R(Z_j)$ as converted to LLR form. A lower input port of the "lower" SISO decoder 362 is connected for receiving the second set of parity code soft-decisions $R(Z'_j)$ as converted to LLR form. Presuming that received signals are transmitted by transmitter apparatus as shown in FIG. 1 that is of a type that de-interleaves the "lower" parity code bits following their generation by the "lower" RSC code encoder, this second set of parity code soft-decisions $R(Z'_j)$ is rearranged in an interleaving procedure that restores their original order for application to the lower input port of the "lower" SISO decoder 362.

The SISO decoders 361 and 362 may employ the soft-output Viterbi algorithm (SOVA) or the maximum a posteriori (MAP) algorithm. The MAP algorithm is more complex than SOVA, but performs better. The MAP algorithm is more easily performed in the logarithmic regime, so that multiplications become simple additions in the SISO decoders 361 and 362. The adders 365, 366 and 367 accordingly operate in the logarithmic regime. It is known to implement addition in the logarithmic regime simply by taking the maximum of the arguments of the two summands and then adding a correction function the argument of which depends only on the magnitude of the difference between the two arguments. The correction function is customarily pre-computed and stored in a lookup table.

The SISO decoders 361 and 362 operate at different times. The "upper" SISO decoder 361 operates during the initial half of each performance of the turbo decoding procedure. Subsequently the "lower" SISO decoder 362 operates during the final half of that performance of the turbo decoding procedure. When decoding of a fresh turbo codeword commences, there is no extrinsic information fed back from the SISO decoder 362 to the adder 365, so the adder 365 supplies $R(X_j)$ as its sum signal to the SISO decoder 361. The SISO decoder 361 operates during the initial half of the first performance of the turbo decoding procedure on a current turbo codeword to generate an LLR comparing the probability that each particular data bit in $R(X_j)$ was a one versus the probability that it was a zero, considering the soft decisions in $R(X_j)$ and in $R(Z_j)$. This LLR, generated without dependency on extrinsic information, is supplied as minuend to the signed adder 366 operated as a subtractor, which is connected to receive the extrinsic information as subtrahend input signal. The difference signal supplied from the output port of the signed adder 366 is a revised LLR comparing the probability that each particular data bit was a ONE versus the probability that it was a ZERO, which revised LLR has no dependency on extrinsic information. The output port of the signed adder 366 is connected for supplying this difference signal to the input port of the SISO interleaver 363.

The output port of the SISO interleaver 363 is connected for supplying its interleaved response to the revised LLR to an upper input port of the "lower" soft-input/soft-output decoder 362. The "lower" SISO decoder 362 then operates during the final half of the first performance of the turbo decoding procedure on the current turbo codeword, responsive to the bit interleaver 363 response received at its upper input port and to the second set of parity code soft-decisions $R(Z'_j)$ received at its lower input port. The SISO decoder 362 generates a further revised LLR supplied from an output port thereof connected to the input port of the SISO de-interleaver 364. The response from the output port of the SISO de-interleaver 364 re-arranges the soft decisions of this further revised LLR to an order corresponding to the order of soft decisions in the revised LLR supplied as difference signal from the output port of the signed adder 366. The signed adder 367 is operated as a subtractor, one of its input ports being connected to receive as minuend input signal the further revised LLR from the output port of the SISO de-interleaver 364. The other input port of the signed adder 367 is connected to receive as subtrahend input signal the revised LLR from the output port of the signed adder 366. The difference signal supplied from the output port of the signed adder 367 is the extrinsic information for the subsequent iteration of the turbo decoding procedure, if such there is to be.

In the standard basic architecture of the turbo decoder for PCCC the de-interleaved further revised LLR from the output port of the SISO de-interleaver 364 is quantized to recover a (207, 187) R-S FEC codeword for application to the R-S decoder 38. FIG. 4 shows the basic architecture of the decoder 36 further including a time-division multiplexer 368, which has its output port connected to the input port of a quantizer 369 for making hard decisions as to each of the bits in a recovered (207, 187) R-S FEC codeword. One of the two input ports of the multiplexer 368 is connected for receiving the de-interleaved further revised LLR from the output port of the SISO de-interleaver 364, but the other input port of the multiplexer 368 is connected for receiving the LLR computed by the SISO decoder 361. This latter connection permits the turbo decoding control circuitry 27 to discontinue the processing of a current turbo codeword by the decoder 36 halfway through a complete cycle of decoding procedure.

The output port of the quantizer 368 is connected for supplying the R-S FEC codeword recovered by the decoder 36 to the input port of the R-S decoder 37 shown in FIG. 3. If the R-S decoder 37 finds the recovered R-S FEC codeword to be correct or is able to correct it, this information is conveyed to the turbo decoding control circuitry 27. This information causes circuitry 27 to terminate turbo decoding procedures on the current turbo codeword and to begin turbo decoding procedures on the next turbo codeword. After some specified number of iterations of the turbo coding procedure, the turbo decoding control circuitry 27 will in any case terminate turbo decoding procedures on the current turbo codeword and begin turbo decoding procedures on the next turbo codeword. Otherwise, if the R-S decoder 37 finds the recovered R-S FEC codeword to contain too many byte errors to be corrected, the turbo decoding control circuitry 27 directs a further iteration of turbo decoding procedures on the current turbo codeword.

In each iteration of turbo decoding procedures on the current turbo codeword, the extrinsic information supplied from the output port of the signed adder 367 during the preceding performance of the turbo decoding procedures on the current turbo codeword is added to $R(X_j)$ by the adder 365 and applied to the upper input port of the "upper" soft-input/soft-output decoder 361. The SISO decoder 361 operates during the initial half of each iteration of the turbo decoding procedure on a current turbo codeword to generate an LLR comparing the probability that each particular data bit in $R(X_j)$ was a one versus the probability that it was a zero, considering the soft decisions in R($X_j$) as updated by the extrinsic information from the preceding performance of the turbo decoding procedures on the current turbo codeword, and considering the soft decisions in R($Z_j$). This LLR is supplied via the multiplexer 368 to the quantizer 369.

The LLR that the SISO decoder 361 generates has some dependency on extrinsic information. This LLR is also supplied as minuend to the signed adder 366 operated as a subtractor and connected to receive the extrinsic information as subtrahend input signal. The difference signal supplied from the output port of the signed adder 366 is a currently revised LLR comparing the probability that each particular data bit was a ONE versus the probability that it was a ZERO. This currently revised LLR has its dependency on extrinsic information from the SISO decoder 362 suppressed. The output port of the signed adder 366 is connected for supplying this difference signal to the input port of the SISO interleaver 363.

The output port of the SISO interleaver 363 is connected for supplying its interleaved response to the currently revised LLR to an upper input port of the "lower" soft-input/soft-output decoder 362. The "lower" SISO decoder 362 then operates during the final half of the iterated turbo decoding procedure on the current turbo codeword, responsive to the bit interleaver 363 response received at its upper input port and to the second set of parity code soft-decisions R($Z'_j$) received at its lower input port. The SISO decoder 362 generates a currently further revised LLR supplied from an output port thereof connected to the input port of the bit de-interleaver 364. The response from the output port of the SISO de-interleaver 364 re-arranges the soft decisions of this currently further revised LLR to an order corresponding to the order of soft decisions in the currently revised LLR supplied as difference signal from the output port of the signed adder 366. The signed adder 367 is operated as a subtractor, receiving the currently further revised LLR from the output port of the SISO de-interleaver 364 as minuend input signal, and receiving the currently revised LLR from the output port of the signed adder 366 as subtrahend input signal. The difference signal supplied from the output port of the signed adder 367 is the extrinsic information for the subsequent iteration of the turbo decoding procedure, if such there is to be.

Figure 5:
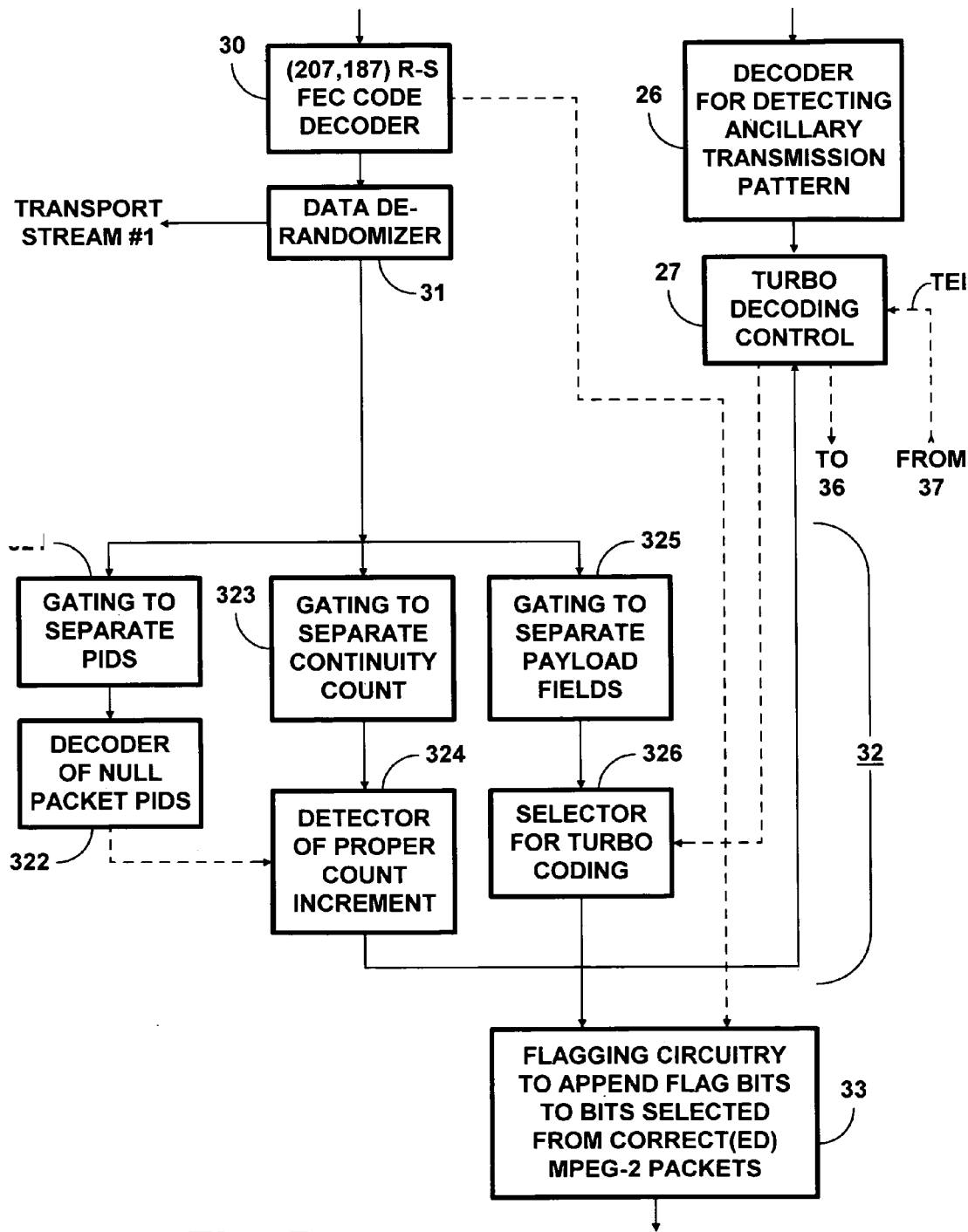
FIG. 5 is a schematic diagram showing in greater detail the turbo coding selector used in each of the FIGS. 3, 7, 9, 13, 16, 17, 19, 21, 23, 25, 27 and 29 DTV receiver apparatuses.

FIG. 5 shows the turbo coding selector 32 of the FIG. 3 receiver apparatus in greater detail. The turbo coding selector 32 receives as its input signal the 187-byte packets in the first transport stream from the data randomizer 31.

Gating circuitry 321 separates the 13-bit PIDs from the first and second bytes of these 187-byte packets for application to a decoder 322 of null-packet PIDs. The decoder 322 generates a logic ONE output signal if and only if the 13-bit PID of a 187-byte packet is that identifying the packet as being a null packet. Otherwise, the decoder 322 generates a logic ZERO output signal.

Gating circuitry 323 separates the continuity count from the third byte of the 187-byte packets in the first transport stream for application to a detector 324 of proper count increment. The decoder 322 of null-packet PIDs clocks the 4-bit continuity count into an two-stage shift register at the input of the detector 324 when and only when the decoder 322 identifies the packet as being a null packet. The detector 324 compares the most recent 4-bit continuity count in the initial stage of the shift register with the previous 4-bit continuity count in the final stage of the shift register, to determine whether or not the count has incremented by one in a modular arithmetic. The DTV transmitter is operated so that the count will increment by one if and only if the current 187-byte packet contains turbo coding as payload. The detector 324 generates a logic ONE output signal if and only if the count increments by one, indicating that the current 187-byte packet presumably contains turbo coding. The detector 324 is connected to supply this information to the turbo decoding control circuitry 27. Ordinarily, this information confirms the ancillary transmission pattern supplied by the decoder 26. If the decoder 26 is unable to furnish the ancillary transmission pattern, the turbo code decoding control circuitry 27 can use the information from the detector 324 to generate a substitute for the missing ancillary transmission pattern.

Gating circuitry 325 separates the 184-bit payload data fields that conclude the 187-byte packets in the first transport stream for application to a selector 326 for turbo coding. Responsive to the ancillary transmission pattern or a substitute therefor, the turbo code decoding control circuitry 27 generates a control signal for the selector 326. This control signal conditions the selector 326 to reproduce the 184-bit payload data fields that contain turbo coding, which are supplied as the turbo coding selector 32 output signal. The selector 326 is connected for supplying the reproduced 184-bit payload data fields to the flagging circuitry 33 as input signal thereto. In variants of the receiver apparatus the flagging circuitry 33 is omitted. In these variants the selector 326 is connected for writing the reproduced 184-bit payload data fields that contain turbo coding directly into the memory operated to perform outer byte de-interleaving.

Figure 6:
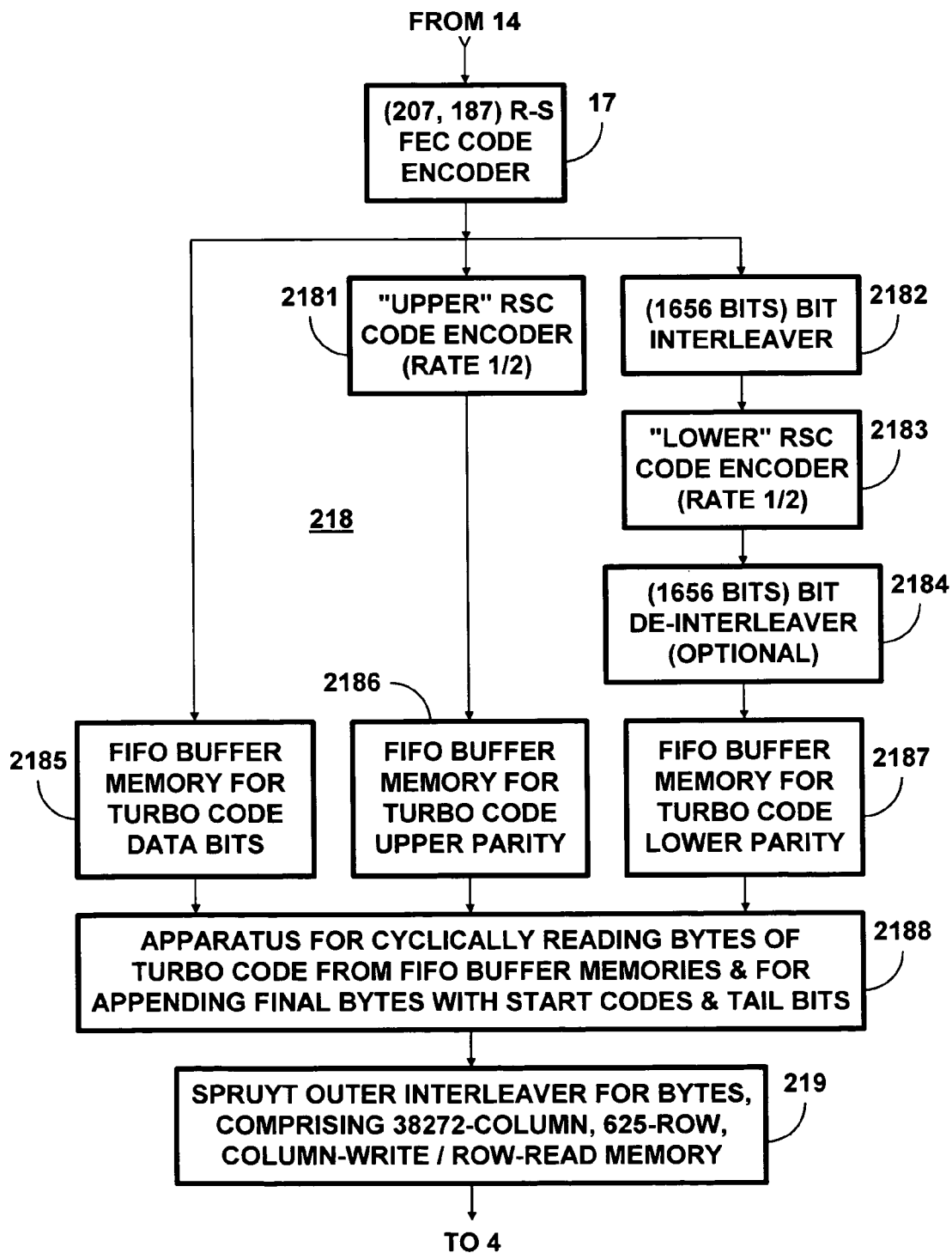
FIG. 6 is a detailed schematic diagram of a turbo code encoder and an outer byte interleaver used in an embodiment of the FIG. 1 transmitter apparatus that uses parallelly concatenated convolutional codes to turbo code individual 207-byte data segments, which outer byte interleaver uses substantially less memory than that in FIG. 2.

FIG. 6 shows a turbo code encoder 218 and an outer byte interleaver 219, which are used as the turbo code encoder 18 and the outer byte interleaver 19 in another embodiment of the FIG. 1 transmitter apparatus that turbo codes individual (207, 187) R-S FEC codewords using parallelly concatenated convolutional coding (PCCC). The turbo code encoder 218 includes an "upper" RSC code encoder 2181, a bit interleaver 2182, a "lower" RSC code encoder 2183, a bit de-interleaver 2184 and first-in, first-out buffer memories 2185, 2186 and 2187. These elements respectively correspond to the "upper" RSC code encoder 1181, the bit interleaver 1182, the "lower" RSC code encoder 1183, the bit de-interleaver 1184 and FIFO buffer memories 1185, 1186 and 1187 of the turbo code encoder 118 shown in FIG. 2. The turbo code encoder 218 further includes apparatus 2188 that cyclically reads a successive byte of the data bits component of the turbo code stored in the FIFO buffer memory 2185, a successive byte of the "upper" parity bits component of the turbo code stored in the FIFO buffer memory 2186, and a successive byte of the "lower" parity bits component of the turbo code stored in the FIFO buffer memory 2187. The apparatus 2188 time-division multiplexes the cyclically read successive bytes of each component and appends a codeword separator sequence to generate each successive one of the turbo codewords written to a column of byte-storage locations within memory in the outer byte interleaver 219. For reasons explained a bit further on in this specification, the apparatus 2188 differs somewhat from the apparatus 1188 in the FIG. 2 turbo code encoder 118.

The outer byte interleaver 219 uses substantially less memory than the outer byte interleaver 119 shown in FIG. 2. The 2-bank memory used in the outer byte interleaver 119 allows the turbo codewords to be written to respective columns of byte-storage locations in each bank of memory without the order of the bytes being changed. U.S. Pat. No. 5,907, 560 shows an interleaver which rotates the positions of bytes within the codewords as written to respective columns of byte-storage locations in the interleaver memory, which rotations avoid the need to provide that memory with two banks for alternate writing and reading. The interleaver in U.S. Pat. No. 5,907,560 employs codewords that are have more bytes than the number of columns of byte-storage locations in the interleaver memory. However, U.S. Pat. No. 5,907,560 suggested to the inventor that, despite the turbo codewords having fewer bytes than the number of columns of byte-storage locations in the interleaver memory, he try designing the outer block interleaver 19 without employing two banks of memory to be alternately written and read in their entirety.

The numbers 38,272 and 624 have a number of factors in common with each other, suggesting possible problems with establishing uniform scanning paths for both writing and reading all 624×38,272=23,881,728 byte-storage locations. Extending the length of the turbo codewords to 625 bytes eliminates any problems caused by there being any factors in common with the number 38,272. Lengthening the turbo codewords leaves more room for codeword separator sequences in them. This extension of the length of the turbo codewords to 625 bytes is performed by the apparatus 2188, which is how it differs from the apparatus 1188 in the FIG. 2 turbo code encoder 118. As each row in the memory of the outer byte interleaver 219 is read, a little over sixty-one of its columns of byte-storage locations are written. The columns that are written while a row is being read occur at intervals of 625 columns, for example.

Figure 7:
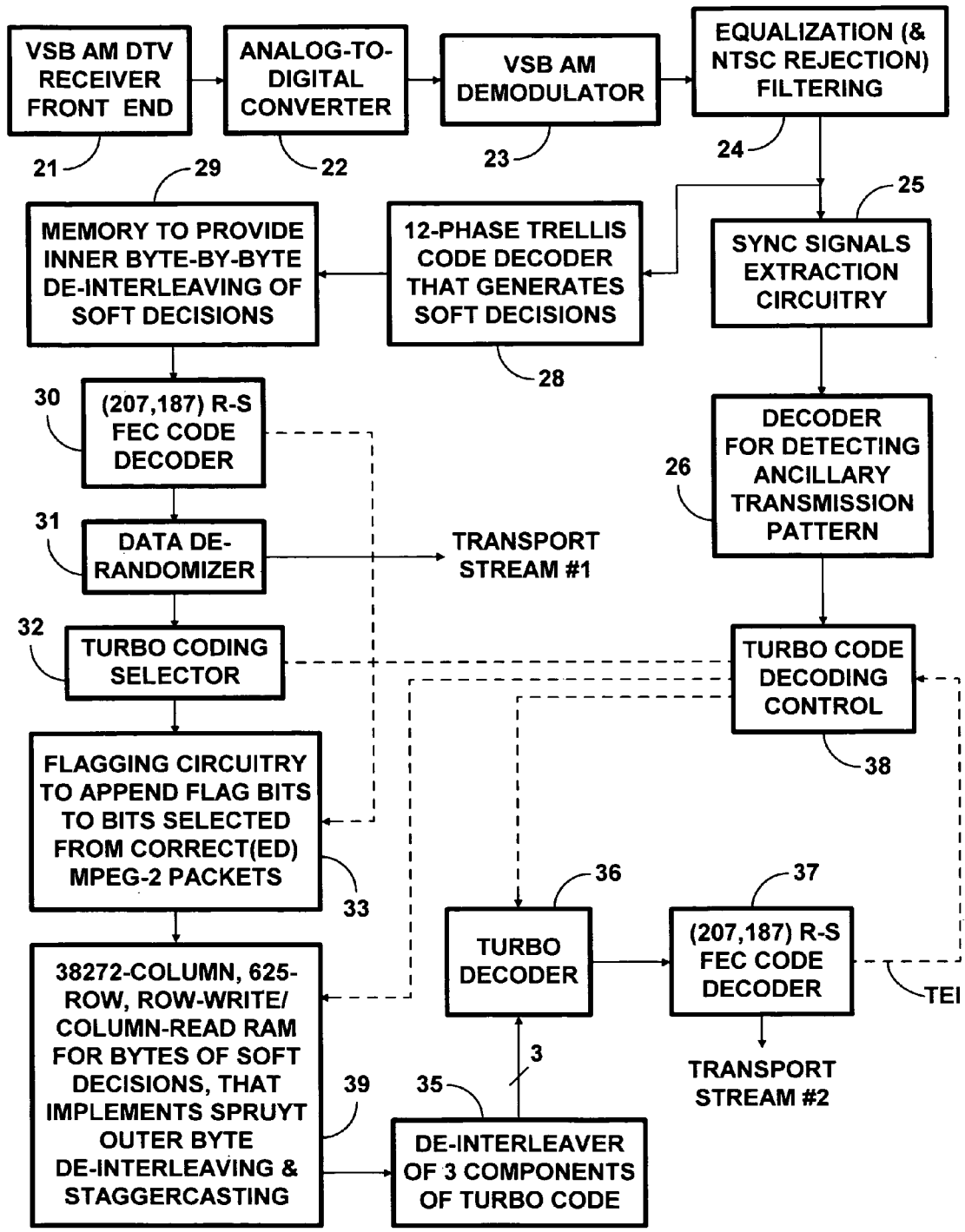
FIG. 7 is a schematic diagram of receiver apparatus for broadcast digital television signals transmitted by transmitter apparatus of the sort shown in FIGS. 1 and 6, which receiver apparatus embodies an aspect of the invention.

FIG. 7 shows receiver apparatus for DTV signals transmitted by transmitter apparatus of the general sort shown in FIG. 1, supposing that the turbo code encoder 18 and the byte interleaver 19 are the turbo code encoder 218 and the byte interleaver 219 shown in FIG. 6. The FIG. 7 receiver apparatus is similar to the FIG. 3 receiver apparatus except for the following modifications. The turbo code decoding control circuitry 27 of the FIG. 3 DTV receiver apparatus is replaced by turbo code decoding control circuitry 38 that takes into account the FIG. 5 outer byte interleaver 219 being of Spruyt type. The memory 34 of the FIG. 3 DTV receiver apparatus is replaced in FIG. 6 by a memory 39 that has therein 38,272 columns and 624 rows of byte-storage locations with attendant soft-decision storage capability. The memory 39 is operated to alternately write to and read from its byte-storage locations in accordance with a de-interleaving pattern that complements the interleaving pattern of the Spruyt interleaver 219 shown in FIG. 6. This permits the memory 39 to be a single-bank memory half the size of the memory required if the FIG. 1 transmitter apparatus uses the interleaver 119 shown in FIG. 2. The decoder 26 for detecting the ancillary transmission pattern signals the use of the Spruyt pattern to the turbo code decoding control circuitry 27, which responds to supply appropriate addressing, read commands and write commands to the memory 39.

Figure 8:
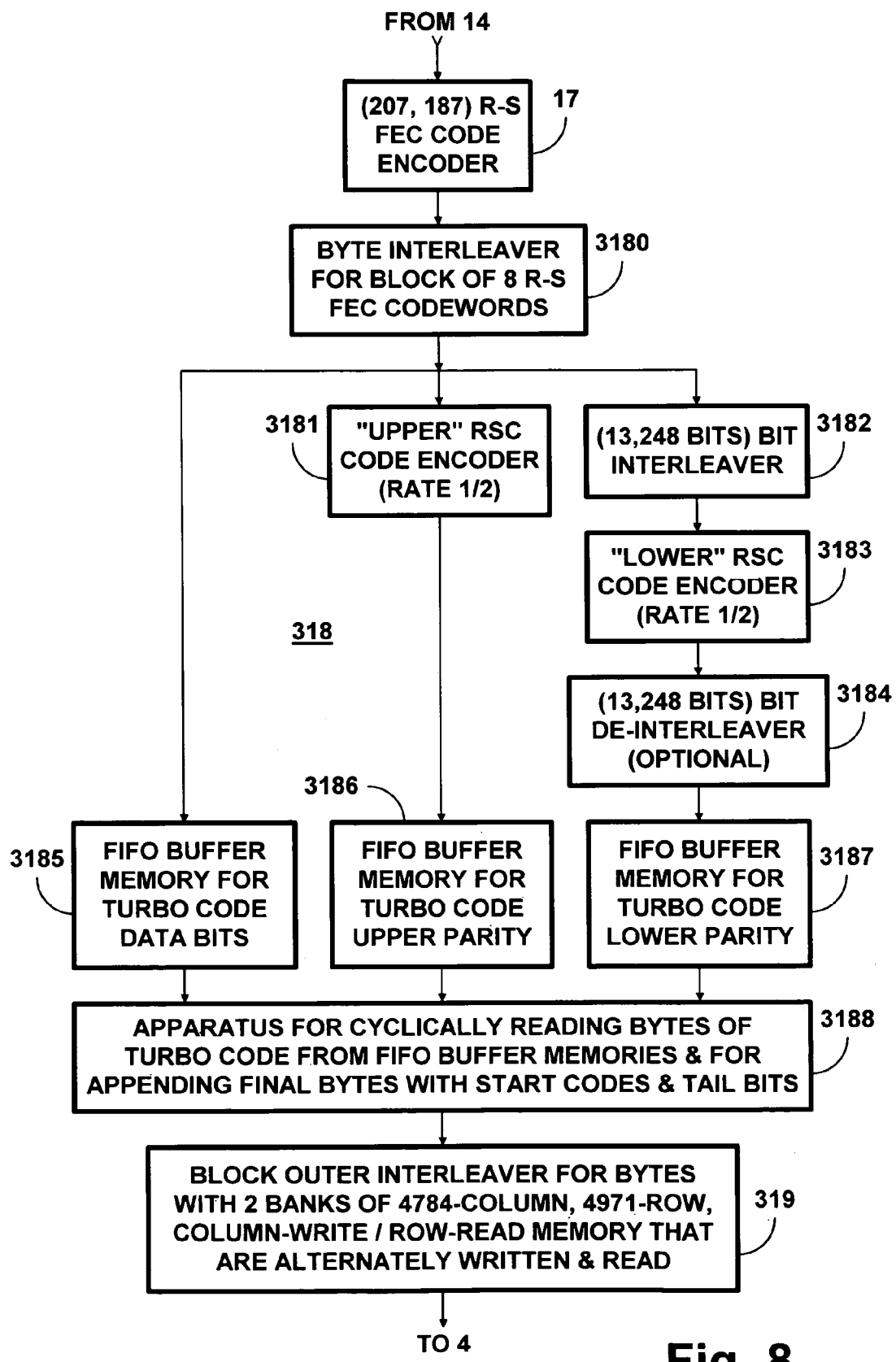
FIG. 8 is a detailed schematic diagram of a turbo code encoder and an outer byte interleaver used in an alternative embodiment of the FIG. 1 transmitter apparatus that turbo codes octets of 207-byte data segments, using parallelly concatenated convolutional codes.

FIG. 8 shows a turbo code encoder 318 and an outer byte interleaver 319, which are used as the turbo code encoder 18 and the outer byte interleaver 19 in an embodiment of the FIG. 1 transmitter apparatus that turbo codes octets of (207, 187) R-S FEC codewords using parallelly concatenated convolutional coding (PCCC). FIG. 8 shows the encoder 17 connected for supplying (207, 187) R-S FEC codewords to an initial byte interleaver 3180 within the turbo code encoder 318. This byte interleaver 3180 cyclically samples the successive bytes of each consecutive octet of (207,187) R-S FEC codewords supplied from the encoder 17, thereby interleaving the bytes of the eight data segments to generate a 1656-byte super word for turbo coding. The initial byte interleaver 3180 is connected for supplying the 13,248 bits of each consecutive 1656-byte super word directly to an "upper" recursive systematic convolutional code encoder 3181 and via a bit interleaver 3182 to a "lower" recursive systematic convolutional code encoder 3183. The "upper" RSC code encoder 3181, the bit interleaver 3182 and the "lower" RSC code encoder 3183 are of the types used in later developed third-generation UMTS, for example.

The bit interleaver 3182 has capacity for permuting the order of the 13,248 bits in an octet of eight successive (207, 187) R-S FEC codewords. Accordingly, the bit interleaver 3182 should provide more interleaver gain than the bit interleavers 1182 and 2182 with only the capacity for permuting the order of 1,656 bits. In some embodiments of the turbo code encoder 318, the bit interleaver 3182 and the byte interleaver 3180 share the same bit-storage locations in memory common to both of them.

In a departure from conventional encoding practice for turbo coding, a bit de-interleaver 3184 is connected to receive the "lower" parity code output from the "lower" RSC code encoder 3183. The bit de-interleaver 3184 provides bit de-interleaving of the "lower" parity code complementary to the bit interleaving of the data by the bit interleaver 3182. In less preferred embodiments of the turbo code encoder 318, the bit de-interleaver 3184 is not employed and the "lower" parity code output from the "lower" RSC code encoder 3183 is directly applied to subsequent circuitry to be described further on in this specification.

FIG. 8 shows the initial byte interleaver 3180 connected for supplying 1656-byte super words to a first-in, first-out buffer memory 3185 for 1656-byte chunks of turbo code data bits. Each 1656-byte super word, which may alternatively be extracted from the "upper" RSC code encoder 3181, is written into the FIFO buffer memory 3185 as the principal part of one of the 1657-byte chunks of turbo code data bits temporarily stored therein. Three tail bits from the "upper" RSC code encoder 3181 are appended to the conclusion of the 1656-byte super word, and three tail bits from the "lower" RSC code encoder 3183 are further appended. FIG. 8 does not explicitly show the connections for writing these six tail bits into the FIFO buffer memory 3185.

The "upper" RSC code encoder 3181 generates a respective set of "upper" parity bits that extend for sixteen hundred fifty-six 8-bit bytes plus three tail bits in response to each of the 1656-byte super words directly supplied thereto. The "upper" RSC code encoder 3181 is connected for writing each successive set of "upper" parity bits into another first-in, first-out buffer memory 3186 as the principal part of one of the 1657-byte components of turbo codewords temporarily stored therein.

The "lower" RSC code encoder 3183 generates a respective set of "lower" parity bits that extend for sixteen hundred fifty-six 8-bit bytes plus three tail bits in response to each of the 1656-byte super words supplied thereto in interleaved form via the bit interleaver 3182. Yet another first-in, first-out buffer memory 3187 is connected for receiving each successive set of "lower" parity bits that extend for two hundred seven 8-bit bytes, either directly from the "lower" RSC code encoder 3183 or preferably after being rearranged by the bit de-interleaver 3184. The FIFO buffer memory 3187 is further connected for additionally receiving three tail bits from the "lower" RSC code encoder 3183. Each successive set of "lower" parity bits that extend for two hundred seven 8-bit bytes plus three tail bits together form the principal part of one of the 1657-byte segments temporarily stored in the FIFO buffer memory 3187.

The FIFO buffer memories 3185 and 3186 provide delays compensating for the latent delay in the bit interleaver 3182 and for the latent delay in the bit de-interleaver 3184, if used. The FIFO buffer memory 3185 provides further delay compensating for the latent delays in the RSC code encoders 3181 and 3182. The FIFO buffer memories 3185, 3186 and 3186 also support interleaving of the turbo code components they respectively store, which interleaving in a departure from ordinary practice is done on a byte-by-byte basis to facilitate R-S FEC coding correcting burst errors arising from deep fades.

Apparatus 3187 cyclically reads a successive byte of the data bits component of the turbo code stored in the FIFO buffer memory 3184, a successive byte of the "upper" parity bits component of the turbo code stored in the FIFO buffer memory 3185, and a successive byte of the "lower" parity bits component of the turbo code stored in the FIFO buffer memory 3186. The apparatus 3187 time-division multiplexes the cyclically read successive bytes of each component to generate 4971-byte turbo codewords. These 4971-byte turbo codewords are written into respective columns of byte-storage locations in one of two banks of memory in the outer byte interleaver 319.

The two banks of memory in the outer byte interleaver 319 alternate between being written and being read. A succession of 4971-byte turbo codewords are written into respective columns of byte-storage locations in one bank of the memory while the rows of byte-storage locations in the other bank are being read out to the null-packet payload-data-field packer 4. Each bank of the memory contains M times 184 columns of byte-storage locations, M being an integer. When reading from a row of byte-storage locations in either bank of memory each successive group of 184 byte-storage locations furnishes the 184 bytes of data that the packer 4 will pack into one payload-data field. The integer M is chosen to be the number of payload-data fields that will occur between one byte and the next of a turbo codeword being read from one of the two banks of memory in the byte interleaver 319.

Suppose the outer byte interleaver 319 is to spread the bytes of each 4971-byte turbo codeword so that a deep fade of about one second duration can be overcome by a decoder for (207, 187) R-S FEC codewords that follows the decoder for turbo coding in the DTV receiver. Presumably the decoder for turbo coding can locate erasures caused by the drop-out, so the decoder for (207, 187) R-S FEC codewords can restore as many as twenty lost bytes. These lost bytes can be as far apart as one-twentieth of a second, then, which is essentially the duration of a 626-segment data frame. If turbo coding is transmitted in all 312 segments of each successive data field, the bytes of the data component of the turbo coding have to occur at least one data frame apart. The initial byte interleaver 3180 introduces 8-to-1 interleaving that compounds the 3-to-1 interleaving of the turbo coding components, resulting in the bytes of each turbo codeword having to occur at least one twenty-fourth of a data frame apart—i.e., at least 26 data segments apart. So, M has to be 26 in the outer byte interleaver 319. Each of the two banks in the byte interleaver 319 has 26×184=4,784 columns and 4,971 rows of byte-storage locations therein.

Interestingly, the outer byte interleaver 319 has 2×4784× 4971=47,562,528 byte-storage locations, and the outer byte interleaver 119 has 2×38,272×624=47,763,456 byte-storage locations. Even adding in the extra 3,312 byte-storage locations in the initial byte interleaver 3180 operated with 2-bank memory, the FIG. 8 circuitry employs slightly less memory than the FIG. 2 circuitry. This slight advantage is attributable to the fact that the number of tail bits and codeword separator sequences required are reduced 8-to-1 in the FIG. 8 circuitry as compared to the FIG. 2 circuitry.

Figure 9:
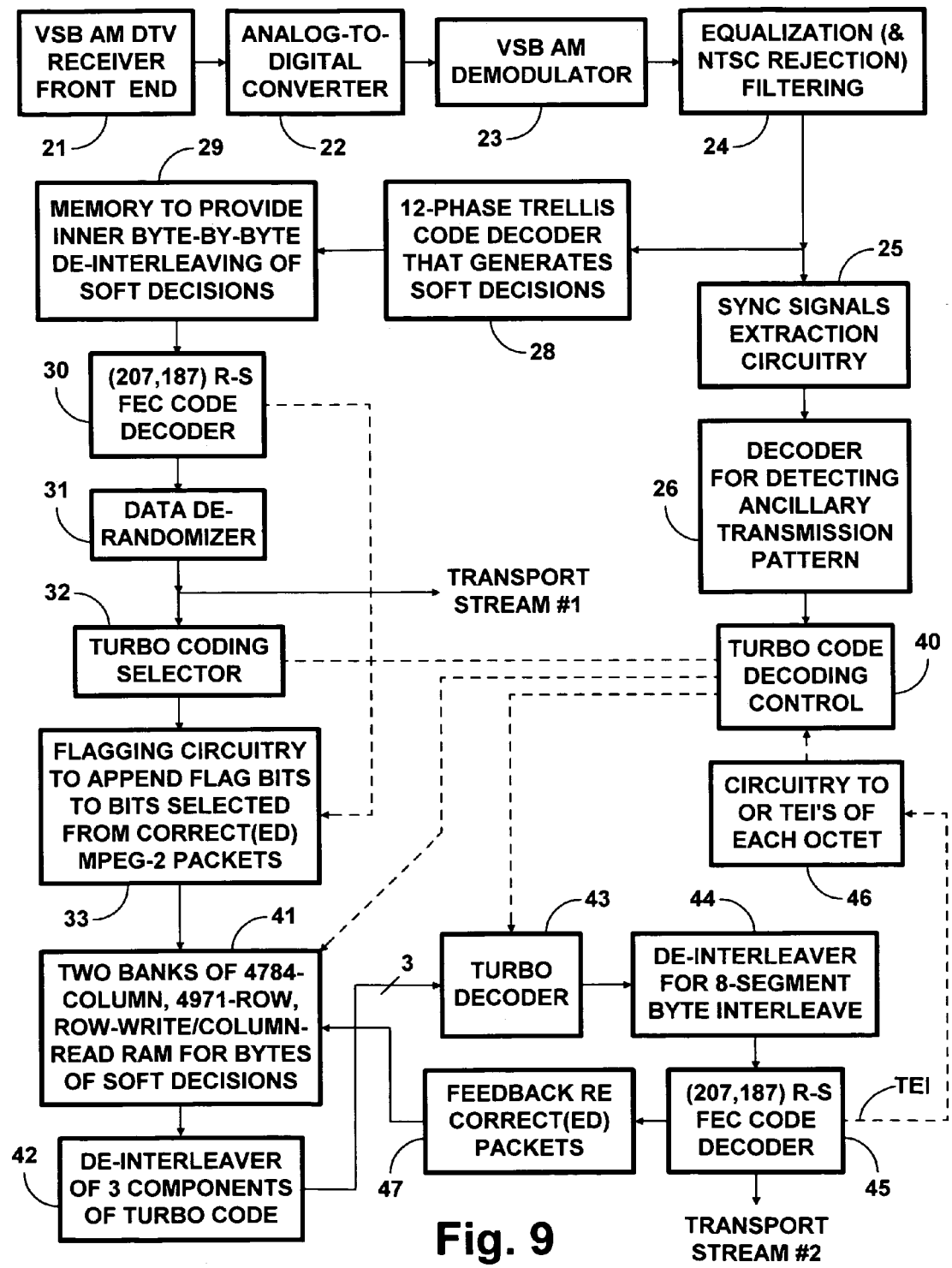
FIG. 9 is a schematic diagram of receiver apparatus for broadcast digital television signals transmitted by transmitter apparatus of the sort shown in FIGS. 1 and 8, which receiver apparatus embodies an aspect of the invention.

FIG. 9 shows receiver apparatus for DTV signals transmitted by transmitter apparatus as shown in FIGS. 1 and 8. Elements 21-26 and 28-33 of the FIG. 10 DTV receiver apparatus are similar in structure, interconnections and operation to similarly numbered elements in the FIG. 3 DTV receiver apparatus. The turbo code decoding control circuitry 27 of the FIG. 3 DTV receiver apparatus is replaced by turbo code decoding control circuitry 40 in the FIG. 9 DTV receiver apparatus. The operation of the turbo code decoding control circuitry 40 insofar as controlling the turbo coding selector 32 is similar to that of the turbo code decoding control circuitry 27 in the FIG. 3 DTV receiver apparatus.

The memory 34 used in the FIG. 4 DTV receiver apparatus for block de-interleaving of bytes is replaced in the FIG. 9 DTV receiver apparatus by memory 41 for de-interleaving of bytes. The memory 41 is separated into two banks to be alternately written to and read from. Each bank includes 4,784 columns and 4,971 rows of byte-storage locations with attendant soft-decision storage capability. These two banks are alternately written to and read from in accordance with a de-interleaving pattern that complements the interleaving pattern of the interleaver 319 shown in FIG. 8. The decoder 26 for detecting the ancillary transmission pattern signals the use of this pattern to the turbo code decoding control circuitry 40. The control circuitry 40 responds to supply appropriate addressing, read commands and write commands to the memory 41. Soft-decision information is passed down from the trellis decoder 28 to the memory 41 despite intervening procedures in elements 29-33. The memory 41 is operated, as controlled by the turbo code decoding control circuitry 40, to provide outer byte-by-byte de-interleaving of soft decisions as well as hard decisions in the read-out therefrom.

The turbo code decoding control circuitry 40 controls the writing and reading of the memory 41. The memory 41 is written to row-by-row and read from column-by-column when performing outer de-interleaving in accordance with a pattern that complements the pattern of interleaving by outer byte interleaver 19 in the FIG. 1 transmitter apparatus. This control operation is generally similar to one of the ways that the turbo code decoding control circuitry 27 uses to control the writing and reading of the memory 34 in the FIG. 3 DTV receiver apparatus, but differs in its particulars to suit the different interleaving matrix. If the outer byte interleaver 19 in the FIG. 1 transmitter apparatus is the interleaver 319 shown in FIG. 7, the memory in which is separated into two banks to be alternately written to and read from, the memory 40 is similarly separated into two banks. These two banks are alternately written to and read from in accordance with a de-interleaving pattern that complements the interleaving pattern of the interleaver 319 shown in FIG. 7. However, if the outer byte interleaver 19 in the FIG. 1 transmitter apparatus is the interleaver 419 shown in FIG. 8, the memory in which alternately writes to and reads from byte-storage locations therein, the memory 40 does not need to be banked, halving its required size. The memory 40 is then operated to alternately write to and read from byte-storage locations therein in accordance with a de-interleaving pattern that complements the interleaving pattern of the interleaver 419 shown in FIG. 8.

A de-interleaver 42 for separating the three components of the turbo code is connected to receive the bits of the reproduced outer coding read from the memory 41 together with their respective accompanying flag bits indicative of the likelihood of their being correct. The de-interleaver 42 separates the three components of the turbo code byte by byte for application to an decoder 43 for turbo code. The soft decisions and flag bits associated with the bits of the reproduced outer coding are preserved during this further de-interleaving procedure. In actual practice the de-interleaver 42 will usually be subsumed into the memory 41 by altering the addressing of its byte-storage locations that are read from. The turbo code decoder 43 in the FIG. 9 DTV receiver apparatus replaces the turbo code decoder 36 used in the FIG. 3 DTV receiver apparatus for decoding turbo-coded (207, 187) R-S FEC codewords one at a time. The turbo code decoder 43 is connected for receiving the three separated components of turbo-coded codewords descriptive of interleaved octets of eight successive (207, 187) R-S FEC codewords and decodes those codewords under control of instructions from the turbo code decoding control circuitry 40. The turbo code decoder 43 is connected for supplying the interleaved octets of eight successive (207, 187) R-S FEC codewords that its decoding procedures recover to a de-interleaver 44 for the 8-segment byte interleave of each octet of (207, 187) R-S FEC codewords.

The de-interleaver 44 is connected for supplying-successive (207, 187) R-S FEC codewords that result from its de-interleaving procedures to a decoder 45 for decoding (207, 187) Reed-Solomon forward-error-correction codewords that replaces the similar decoder 37 in the FIG. 3 DTV receiver apparatus. The R-S decoder 45 produces 187-byte MPEG-2-compatible data packets of the ancillary second transport stream. The R-S decoder 45 is further connected for supplying indications of byte errors in the 187-byte packets of ancillary data to circuitry 46 for supplying the turbo code decoding control circuitry 40 with an OR-gate response to those indications for each successive octet of (207, 187) R-S FEC codewords. If and only if the R-S decoder 45 finds all eight recovered 187-byte data packets in an octet to be correct or is able to correct any that are incorrect, the OR response of the circuitry 46 will be a logic ZERO. Responsive to this logic ZERO, the turbo code decoding control circuitry 40 will discontinue further turbo decoding procedures on the turbo-coded octet. The turbo code decoding control circuitry 40 keeps track of the number of decoding iterations for each turbo codeword in the turbo data field and will discontinue further turbo decoding procedures on the turbo-coded octet when that number reaches a prescribed maximum. In some DTV receivers the first and second transport streams may be combined into a single transport stream using a common buffer memory. In such case, the turbo code decoding control circuitry 40 includes circuitry for arbitrating the order in which packets from the first and second transport streams are to be written into the common buffer memory.

The turbo code decoding control circuitry 40 will instruct the turbo code decoder 43 to reiterate its decoding procedures if fewer than all eight of the 187-byte data packets in an octet were correct or corrected. However, the fact that some of the 187-byte data packets in an octet were correct or corrected is valuable information for the turbo code decoder 43 to have when its decoding procedures are reiterated. FIG. 9 shows a feedback connection 47 for conducting that information back to the memory 41. Part of this information consists of the bytes that were lost because of deep fades and were subsequently recovered by error-correction procedures in the R-S decoder 45. This information further comprises flag bits identifying for the benefit of the turbo code decoder 43 those bits contained in (207, 187) R-S codewords containing correct or corrected MPEG-2-compatible packets.

Note that feeding back such information is infeasible if long-delay outer byte de-interleaving is introduced between the decoders for turbo codewords and R-S codewords and subsequent. Besides the long delay of the outer byte de-interleaving in the feedback loop, there is similar long-delay in the interleaver required for re-interleaving after the R-S decoder. There is still an 8-data-segment or so delay in obtaining R-S decoding results, owing to the de-interleaver 44 for the 8-segment interleave, which de-interleaver 44 is required when only the single decoder 45 is used for decoding (207, 187) R-S FEC codewords.

Figure 10:
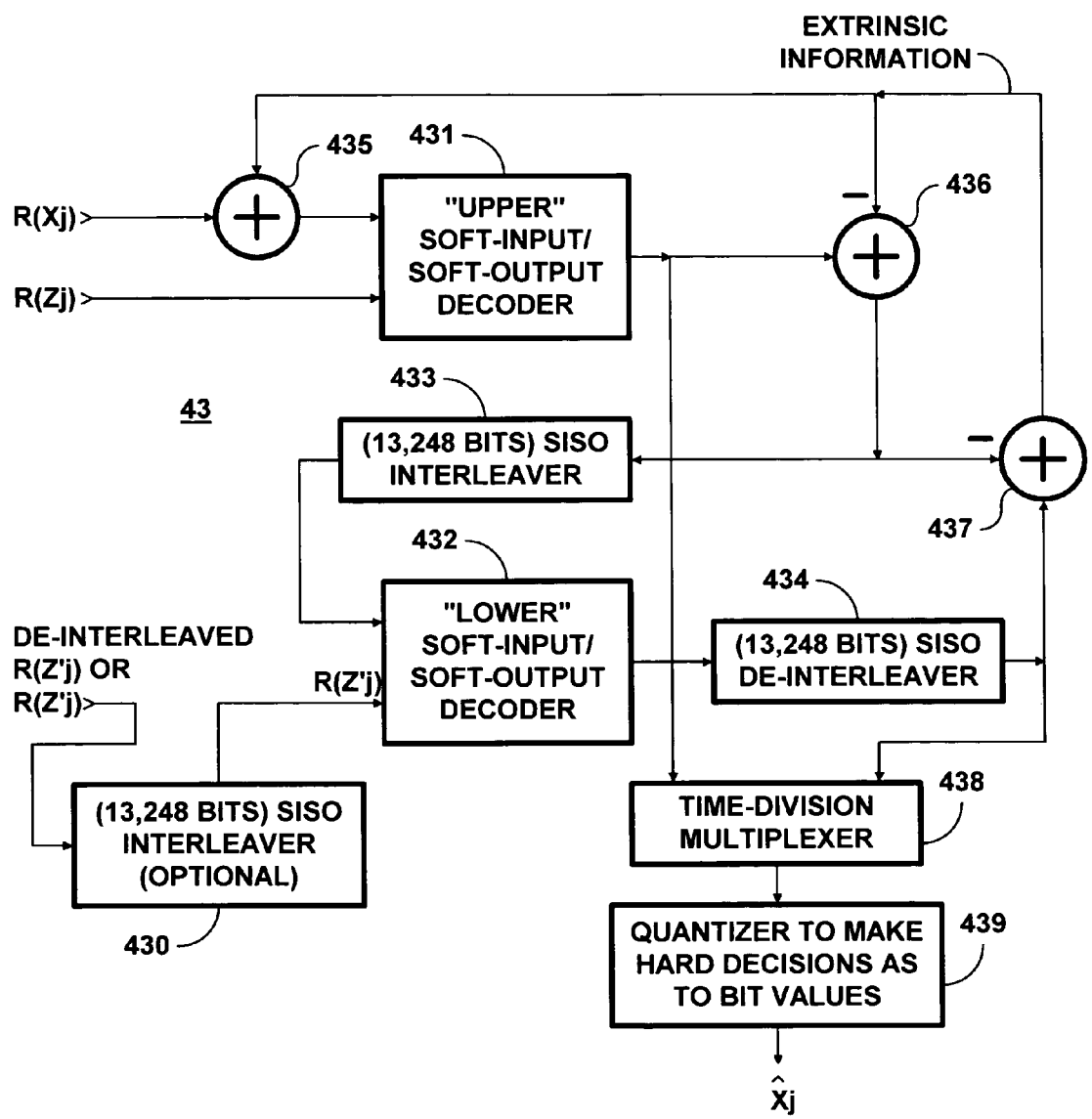
FIG. 10 is a detailed schematic diagram of a turbo code encoder and an outer byte interleaver used in an embodiment of the FIG. 1 transmitter apparatus that uses parallelly concatenated convolutional codes to turbo code octets of 207-byte data segments, which outer byte interleaver uses substantially less memory than that in FIG. 8.

FIG. 10 shows the basic architecture of the decoder 43 for the three components of turbo coding supplied from the de-interleaver 42 shown in FIG. 9. The three components of turbo coding supplied from the de-interleaver 42 are converted to LLRs for use in this basic architecture for the decoder 43. A distinctive feature of this basic architecture is the soft-input/soft-output interleaver 430 that is included, presuming that received signals are transmitted by transmitter apparatus as shown in FIG. 1 that is of a type that de-interleaves the "lower" parity code bits following their generation by the "lower" RSC code encoder. This basic architecture includes an "upper" soft-input/soft-output decoder 431, a "lower" soft-input/soft-output decoder 432, a soft-input/soft-output interleaver 433, a soft-input/soft-output de-interleaver 434, and (signed) two-input adders 435, 436 and 437. The LLRs computed by the SISO decoders 431 and 432 compare the probability that the particular data bit was a one versus the probability that it was a zero, considering the entire received turbo codeword. The basic architecture of the decoder 43 further includes a time-division multiplexer 438 and a quantizer 439. The interconnections of the elements 429, 431, 432, 433, 434, 435, 436, 437, 438 and 439 in the decoder 43 are similar to those of the elements 360, 361, 362, 363, 364, 365, 366, 367, 368 and 369 in the FIG. 4 decoder 36.

The SISO decoders 431 and 432 are similar in structure to the SISO decoders 361 and 362 used in the FIG. 4 decoder 36 for turbo coding. The SISO interleaver 433 is designed to accommodate soft decisions concerning 13,248 data bits of a turbo codeword. The permutation pattern of the SISO interleaver 433 is similar in design to the permutation pattern of the bit interleaver 3182 used in the encoder 318 for turbo coding shown in FIG. 8 or in FIG. 12. The SISO interleaver 429, if used, uses the same permutation pattern. The SISO de-interleaver 434 uses a permutation pattern that complements the permutation pattern of the SISO interleaver 433 and also that of the SISO interleaver 429, if used.

Figure 11:
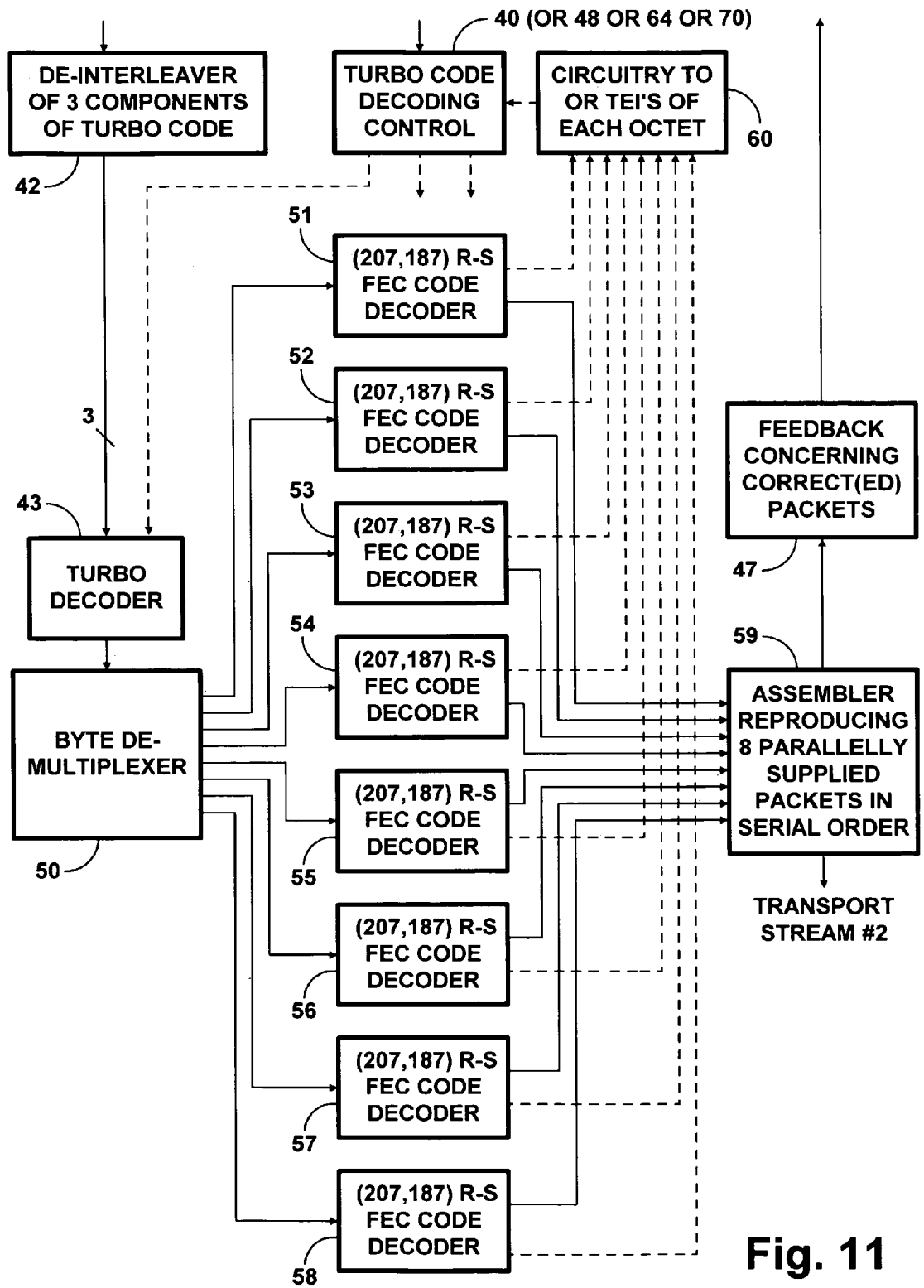
FIG. 11 is a schematic diagram of receiver apparatus for broadcast digital television signals transmitted by transmitter apparatus of the sort shown in FIGS. 1 and 10, which receiver apparatus embodies an aspect of the invention.

FIG. 11 shows modifications that can be made to the FIG. 9 DTV receiver apparatus to speed up the recovery of R-S decoding results. The turbo code decoder 43 is connected for supplying to a byte de-multiplexer 50 each successive interleaved octet of (207, 187) R-S FEC codewords recovered by the decoder 43 from a turbo codeword. The byte de-multiplexer 50 separates the eight (207, 187) R-S FEC codewords of each octet for application to respective ones of eight decoders 51, 52, 53, 54, 55, 56, 57 and 58 for decoding (207, 187) R-S FEC codewords. The byte de-multiplexer 50 typically includes some differential delay after de-interleaving so that the eight (207, 187) R-S FEC codewords are received simultaneously by the eight decoders 51, 52, 53, 54, 55, 56, 57 and 58. The eight R-S decoders 51, 52, 53, 54, 55, 56, 57 and 58 supply the results of decoding the eight (207, 187) R-S FEC codewords very shortly after reception of them is completed. This is some seven data segments or so earlier than with the FIG. 9 cascade connection of the de-interleaver 44 and the single decoder R-S decoder 43.

An assembler 59 receives each successive octet of (207, 187) R-S FEC codewords parallelly supplied from the eight R-S decoders 51, 52, 53, 54, 55, 56, 57 and 58 and reproduces them in correct serial order for extraction of information to be conducted back to the memory 40 via the feedback connection 47. The assembler 59 also selects the 187-byte MPEG-2-compatible packets contained within the serially ordered (207, 187) R-S FEC codewords to generate the ancillary second transport stream. The serial ordering of the selected packets facilitates loading them into buffer memory.

FIG. 11 shows circuitry 60 replacing the circuitry 46 shown in FIG. 9. The circuitry 60 is connected to supply the turbo code decoding control circuitry 40 an OR-gate response to the transport error indications that the eight R-S decoders 51, 52, 53, 54, 55, 56, 57 and 58 generate. These transport error indications are generated in response to each successive octet of (207, 187) R-S FEC codewords supplied them by the byte de-multiplexer 50.

Figure 12:
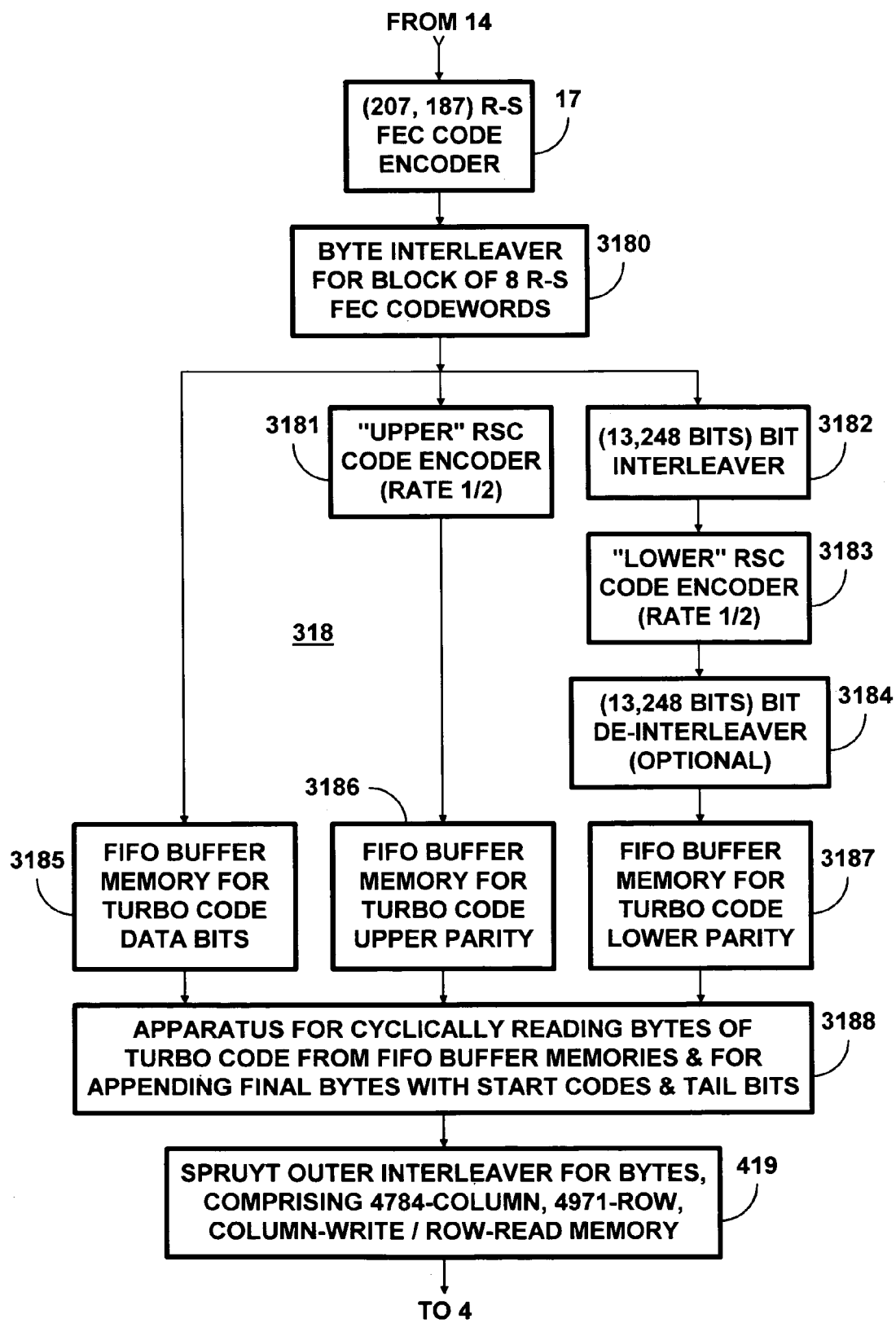
FIG. 12 is a schematic diagram showing the decoder used in each of the DTV receiver apparatuses of FIGS. 9 and 11 for turbo decoding parallelly concatenated convolutional codes.

FIG. 12 shows the turbo code encoder 318 and an outer byte interleaver 419, which are used as the turbo code encoder 18 and the outer byte interleaver 19 in another embodiment of the FIG. 1 transmitter apparatus that turbo codes octets of (207, 187) R-S FEC codewords using PCCC. The outer byte interleaver 419 uses substantially less memory than the outer byte interleaver 319 shown in FIG. 8. The memory in the outer byte interleaver 419 only has 4,784 columns and 4,971 rows of byte-storage locations therein, total, rather than that number in each of two banks within the memory. The memory in the outer byte interleaver 419 is not divided into two banks that are alternately written and read. Instead, there is alternate reading from a selected byte-storage location in memory and writing to a selected byte-storage location in memory. Since there are more rows of byte-storage locations in the memory than there are columns, the addressing during reading and writing can be carried out by method similar to that described in U.S. Pat. No. 5,907,560. Since the numbers 4,784 and 4,971 have no factors in common, there is no problem with establishing uniform scanning paths through all 4784×4971=23,781,264 byte-storage locations both during their being written and during their being read.

Figure 13:
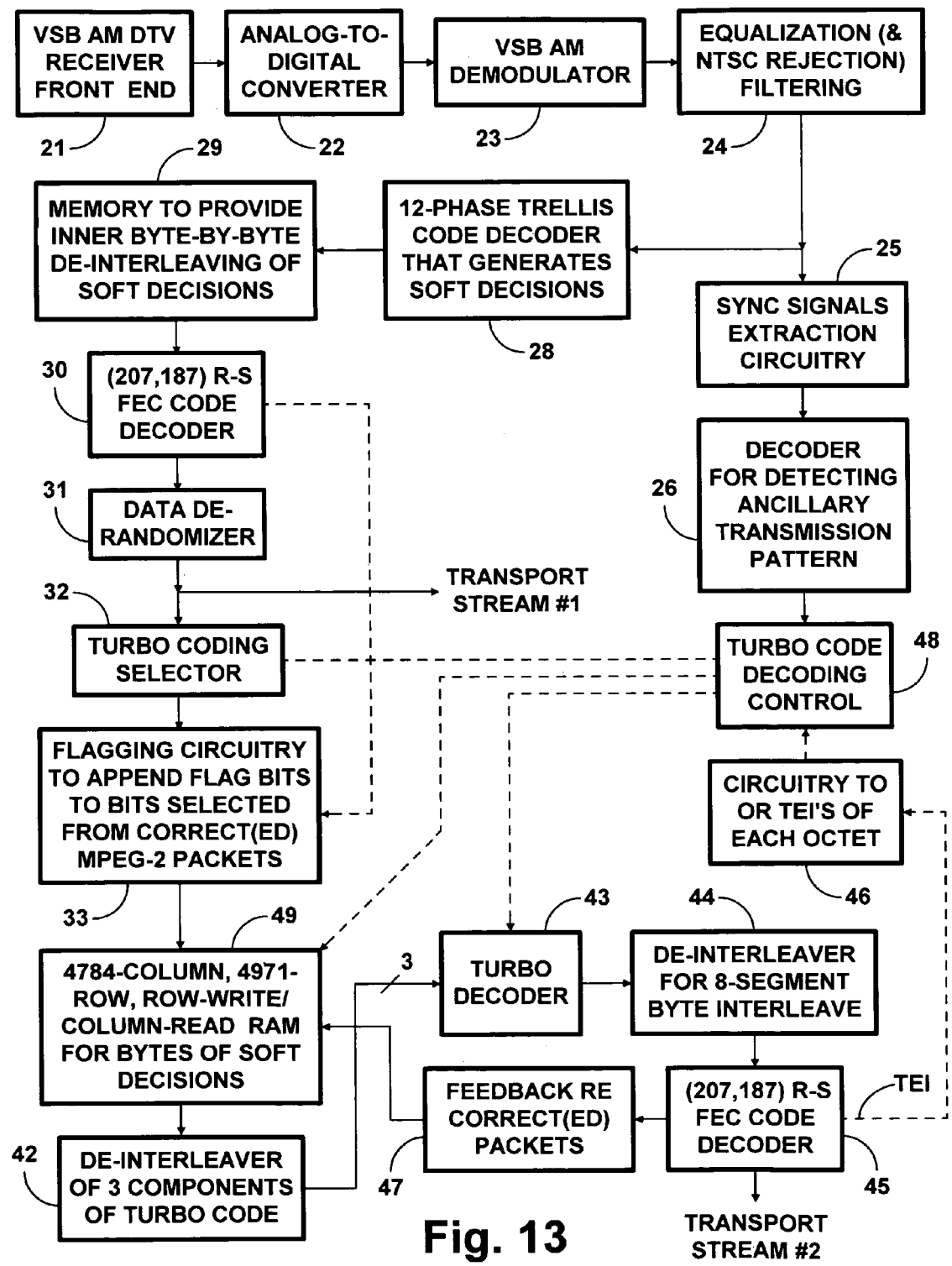
FIG. 13 is a schematic diagram of a modification of any of the DTV receiver apparatuses of FIGS. 9, 11, 17 and 21, each which modified receiver apparatus embodies an aspect of the invention.

FIG. 13 shows modifications to the FIG. 9 DTV receiver apparatus fitting it to receive the broadcast digital television signals transmitted with staggercasting by transmitter apparatus of the sort shown in FIGS. 1 and 12. The FIG. 13 receiver apparatus is similar to the FIG. 9 receiver apparatus except for the following modifications. The turbo code decoding control circuitry 40 of the FIG. 9 DTV receiver apparatus is replaced by turbo code decoding control circuitry 48 that takes into account the FIG. 12 outer byte interleaver 419 being of Spruyt type. The memory 41 of the FIG. 9 DTV receiver apparatus is replaced in FIG. 13 by a memory 49 that has therein 4,784 columns and 4,971 rows of byte-storage locations with attendant soft-decision storage capability. The decoder 26 for detecting the ancillary transmission pattern signals the use of the Spruyt pattern to the turbo code decoding control circuitry 48, which responds to supply appropriate addressing, read commands and write commands to the memory 49. The memory 49 is operated to alternately write to and read from its byte-storage locations in accordance with a de-interleaving pattern that complements the interleaving pattern of the Spruyt interleaver 419 shown in FIG. 12. This permits the memory 49 to be a single-bank memory half the size of the memory required if the FIG. 1 transmitter apparatus uses the interleaver 319 shown in FIG. 8.

A matter thus far not described in detail is the inclusion of codeword separator sequences between turbo codewords. Preferably, a codeword separator sequence should have close to the same number of ONEs as ZEROes. The apparatus 1187 in the turbo encoder 118 and the apparatus 3187 in the turbo encoder 318 extend each turbo codeword by three bytes, twelve bits of which are tail bits for that codeword. This leaves twelve bits available for insertion of a codeword separator sequence. A codeword separator sequence 1001 1001 1001 constructed from three cycles of the 4-bit Barker sequence 1001 can be used, for example. The turbo codewords can then be parsed proceeding from the results of convolving them with a 1001 1001 1001 correlation filter.

When the turbo code encoder 18 and the outer byte interleaver 19 in the FIG. 1 DTV transmitter apparatus are the encoder 118 and interleaver 119 per FIG. 2, it is simple to synchronize the de-interleaving pattern to be used in a DTV receiver per FIG. 3. The payload-data fields of 208 consecutive null packets containing turbo coding are packed with 76,544 consecutive cycles of the 1001 4-bit Barker sequence. So, the time to switch between banks in the memory 34 is easily detected just after the turbo coding selector 32, before outer byte de-interleaving is begun.

When the turbo code encoder 18 and the outer byte interleaver 19 in the FIG. 1 DTV transmitter apparatus are the encoder 318 and interleaver 319 per FIG. 8, it is simple to synchronize the de-interleaving pattern to be used in a DTV receiver per FIG. 9. The payload-data fields of 26 consecutive null packets containing turbo coding are packed with 9,568 consecutive cycles of the 1001 4-bit Barker sequence. So, the time to switch between banks in the memory 39 is easily detected just after the turbo coding selector 32, before outer byte de-interleaving is begun.

When the turbo code encoder 18 and the outer byte interleaver 19 in the FIG. 1 DTV transmitter apparatus are the encoder 318 and interleaver 419 per FIG. 12, it is still possible to synchronize the pattern of de-interleaving to be used in a DTV receiver per FIG. 13 by analyzing the response of the turbo coding selector 32, before outer byte de-interleaving is begun. The analysis can be performed using a suitably designed correlation filter to detect the occurrence of 1001 1001 bytes at 625-byte intervals in the response of the turbo coding selector 32.

When the turbo code encoder 18 and the outer byte interleaver 19 in the FIG. 1 DTV transmitter apparatus are the encoder 218 and interleaver 219 per FIG. 6, the apparatus 2187 in the turbo encoder 218 extends each turbo codeword by four bytes, twelve bits of which are tail bits for that codeword. This leaves twenty bits available for insertion of a codeword separator sequence. A codeword separator sequence 0 1110010 1110010 0 constructed from the 7-bit Barker sequence 1110010 can be used, for example. The turbo codewords can then be parsed proceeding from the results of convolving them with a 1110010 1110010 correlation filter. It is also possible to synchronize the pattern of de-interleaving to be used in a DTV receiver per FIG. 9 by analyzing the response of the turbo coding selector 32, before outer byte de-interleaving is begun. The analysis can be performed using a suitably designed correlation filter to detect the occurrences of 0111 0010 and 1110010 bytes at prescribed intervals in the response of the turbo coding selector 32.

Experience over time may show that longer codeword separator sequences are required for turbo codewords to be parsed reliably when reception is poor. Because the turbo codewords are transversely disposed in the payload-data fields of the null packets, these codewords may be further extended to any length that allows scanning of all the byte-storage locations in the outer byte interleaver 19 memory.

Figure 14:
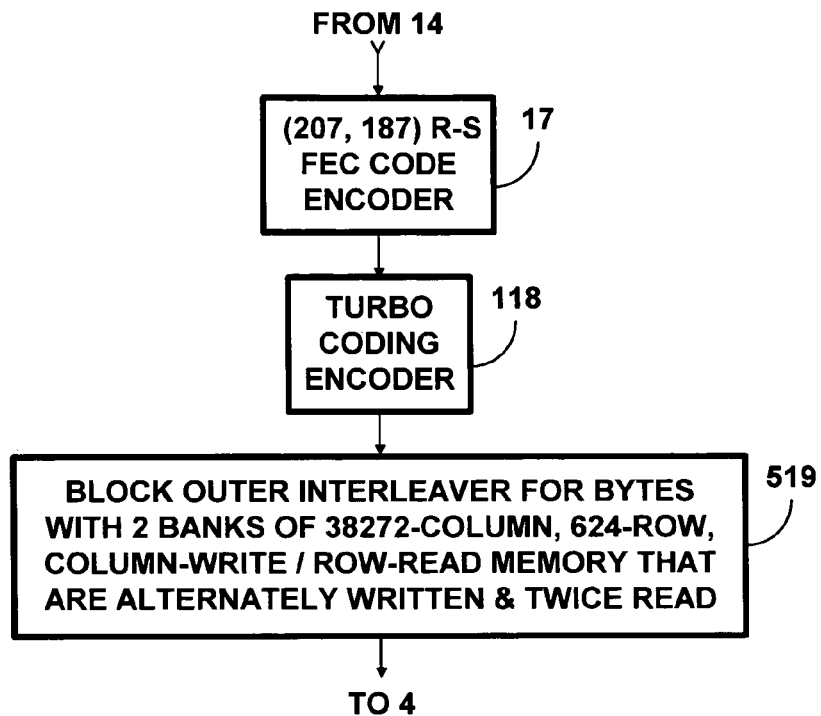
FIG. 14 is a detailed schematic diagram of the combination of turbo code encoder and outer byte interleaver used in an embodiment of the FIG. 1 transmitter apparatus that turbo codes individual 207-byte data segments for staggercasting.

FIG. 14 shows the turbo code encoder 118 and an outer byte interleaver 519 used in an embodiment of the FIG. 1 transmitter apparatus that turbo codes individual 207-byte data segments for staggercasting. The staggercasting is of the novel form in which each successive turbo codeword is immediately repeated in its transmission. The outer byte interleaver 519 uses a two-bank memory similar in structure to that used in the outer byte interleaver 119, and the banks are alternately written. However, while one bank of the memory in the outer byte interleaver 519 is written column by column, the other is read row by row and then read again row by row to implement staggercasting.

Figure 15:
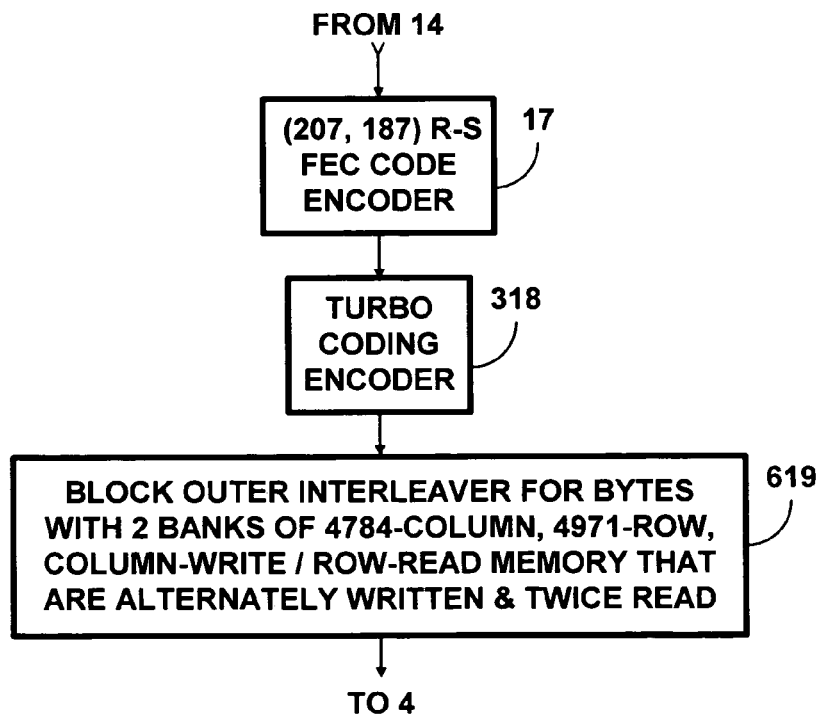
FIG. 15 is a detailed schematic diagram of the combination of turbo code encoder and outer byte interleaver used in an embodiment of the FIG. 1 transmitter apparatus that turbo codes octets of 207-byte data segments for staggercasting.

FIG. 15 shows the turbo code encoder 318 and an outer byte interleaver 719 used in an embodiment of the FIG. 1 transmitter apparatus that turbo codes octets of 207-byte data segments for staggercasting. The staggercasting is of the novel form in which each successive turbo codeword is immediately repeated in its transmission. The outer byte interleaver 719 uses a two-bank memory similar in structure to that used in the outer byte interleaver 319, and the banks are alternately written. However, while one bank of the memory in the outer byte interleaver 719 is written column by column, the other is read row by row and then read again row by row to implement staggercasting.

Figure 16:
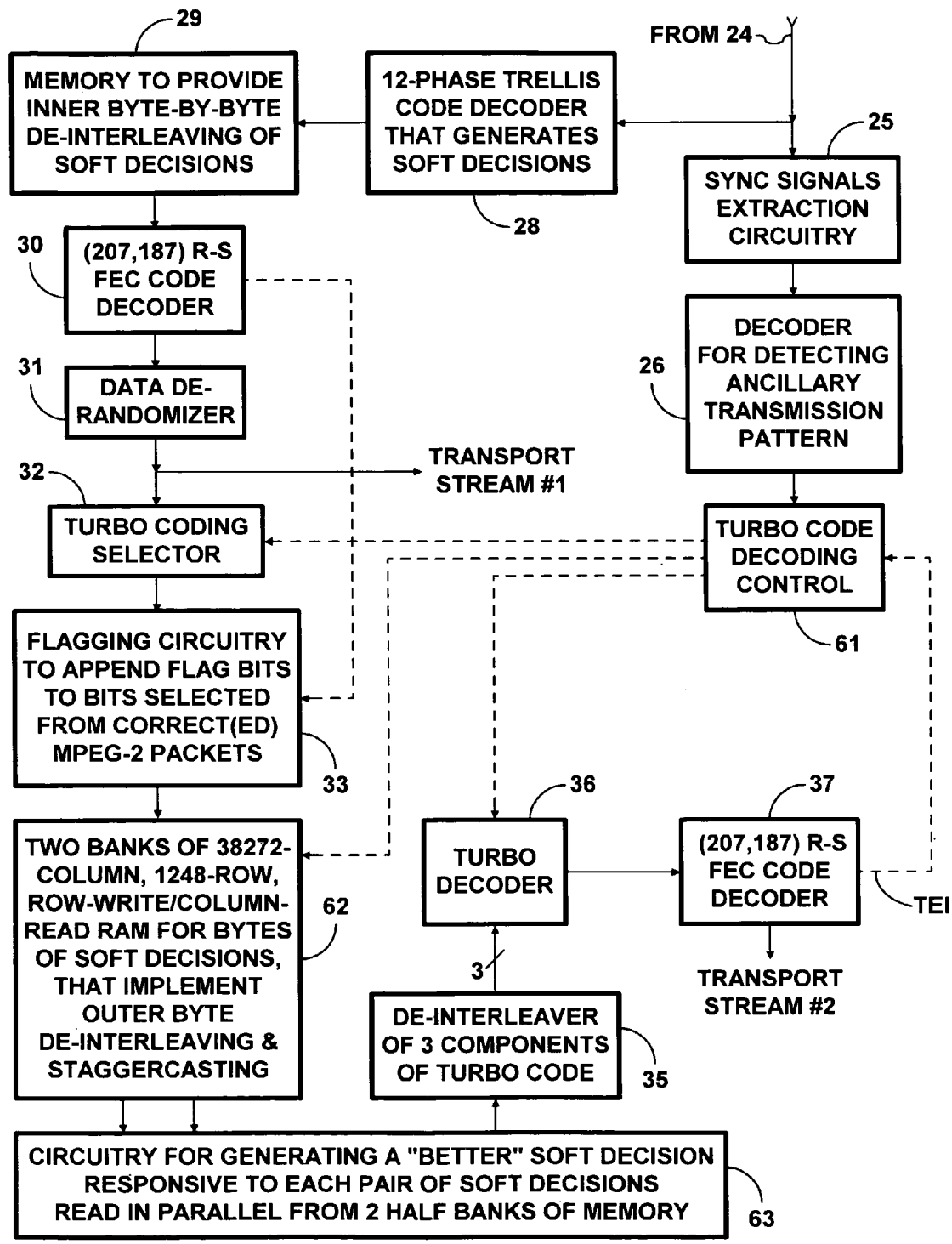
FIG. 16 is a schematic diagram of modifications to the FIG. 3 receiver apparatus, which modifications embody a further aspect of the invention and make possible the useful reception of broadcast digital television signals transmitted with staggercasting by transmitter apparatus of the sort shown in FIGS. 1 and 14.

FIG. 16 shows modifications to the FIG. 4 DTV receiver apparatus fitting it to receive the broadcast digital television signals transmitted with staggercasting by transmitter apparatus of the sort shown in FIGS. 1 and 14. The turbo code decoding control circuitry 27 of the FIG. 4 DTV receiver apparatus is replaced in FIG. 13 by turbo code decoding control circuitry 61 that takes into account the differences in turbo decoding introduced by staggercasting. The memory 34 of the FIG. 4 DTV receiver apparatus is replaced in FIG. 16 by a memory 62 having two banks each having 38,272 columns and 1248 rows of byte-storage locations therein. The 1248 rows of one bank of the memory are written while the 38,272 columns of the other bank are read in the following way. Soft decisions concerning an earlier transmitted turbo codeword are read serially from an initial half of each column to a first output port of the memory 62. This is done concurrently with soft decisions concerning a later transmitted "duplicate" of the same turbo codeword being read serially from the final half of each column to a second output port of the memory 62. The turbo code decoding control circuitry 61 controls the writing and reading operations of the memory 62.

The first and second output ports of the memory 62 respectively connect to first and second input ports of circuitry 63 for generating a "better" soft decision responsive to each pair of soft decisions concurrently read thereto from the memory 62. The circuitry 63 compares each pair of concurrent soft decisions read thereto. The "better" one of the soft decisions is selected for application to the output port of the circuitry 63. The "better" of the concurrent soft decisions is the one with largest probability of being correct. If two concurrent soft decisions have equal probability of being correct, a prescribed one of the pair is selected by default as the "better" decision. In more sophisticated designs of the circuitry 63, the probability of error in the selected soft decision is adjusted according to the degree of agreement or disagreement of the two concurrent soft decisions. Each successive turbo codeword that is synthesized by the circuitry 63 is supplied from the output port thereof to the input port of the de-interleaver 35, which de-interleaves the bytes of the three components of the codeword for application to the turbo decoder 36.

In sophisticated designs of the circuitry 63, the synthesis of the soft-decision turbo codeword is also aided by information concerning the probability of each soft decision being correct. The flag bits appended by the flagging circuitry 33 indicating that the hard-decision portions of the soft decisions were found likely to be correct by the R-S decoder 30 are examples of such information. The automatic gain control circuitry of the DTV receiver can furnish indications of drop-outs in signal strength, which indications are used by the circuitry 63 to help determine which of the soft decisions concurrently read thereto from the memory 62 is the one with largest probability of being correct.

Note that the circuitry 63 can synthesize a complete turbo codeword from the remnants of the iterated turbo codeword, even though the burst error corrupts a sequence of consecutive bytes as long as an entire turbo codeword. In the design of the outer byte interleaver 118, it was presumed that when turbo coding was transmitted in all 312 segments of each successive data field, the bytes of the data component of the turbo coding would have to occur at least one data frame apart. Because of the 1:1:1 interleaving of the bytes of the data component with the bytes of two other turbo coding components, the bytes of each turbo codeword would then have to occur at least one third of a data frame apart—i.e., at least 208 data segments apart. The corruption of an entire 624-byte turbo codeword requires a deep fade of 624 times 208 data segments duration. The drop-out would have to be some 208 data frames long, which is to say a little over ten seconds duration, for the circuitry 63 not to be able to synthesize a complete turbo codeword from the remnants of the iterated turbo codeword. Augmented by the error-correction capability of the R-S decoder 37, drop-outs of over eleven seconds can be overcome by the FIG. 16 DTV receiver circuitry.

If computation time is not at a premium, the turbo codewords read serially from the first and second output ports of the memory 62 may also be byte de-interleaved, turbo decoded and R-S decoded individually. Occasionally one of these computations may succeed when computations on the turbo codeword synthesized by the circuitry 63 are unsuccessful.

Figure 17:
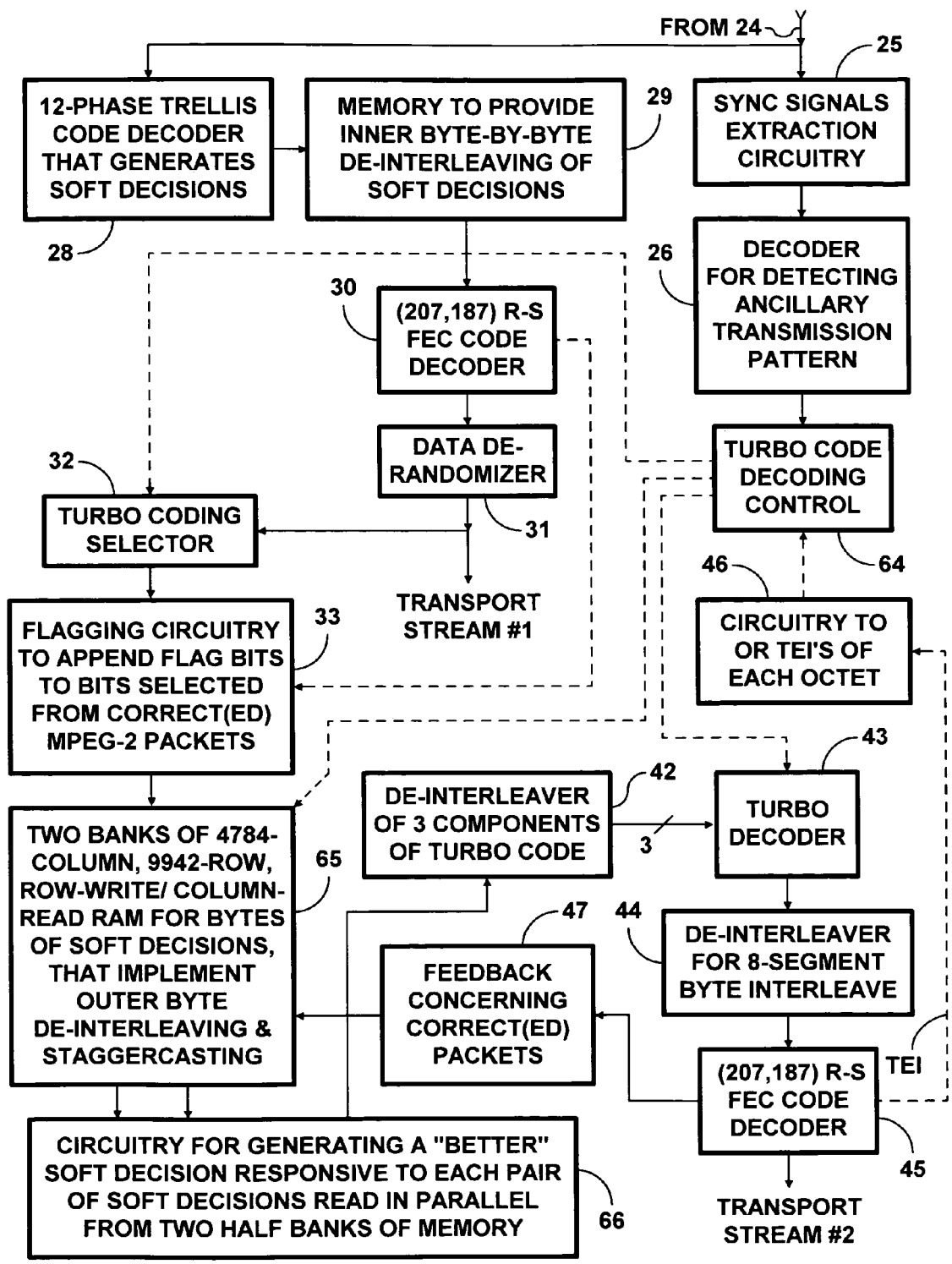
FIG. 17 is a schematic diagram of modifications to the FIG. 9 receiver apparatus, which modifications embody a further aspect of the invention and make possible the useful reception of broadcast digital television signals transmitted with staggercasting by transmitter apparatus of the sort shown in FIGS. 1 and 15.

FIG. 17 shows modifications to the FIG. 9 DTV receiver apparatus fitting it to receive the broadcast digital television signals transmitted with staggercasting by transmitter apparatus of the sort shown in FIGS. 1 and 15. The turbo code decoding control circuitry 40 of the FIG. 9 DTV receiver apparatus is replaced in FIG. 17 by turbo code decoding control circuitry 64 that takes into account the differences in turbo decoding introduced by staggercasting. The memory 40 of the FIG. 9 DTV receiver apparatus is replaced in FIG. 17 by a memory 65 having two banks each having 4784 columns and 9942 rows of byte-storage locations therein. The 9942 rows of one bank of the memory are written while the 4784 columns of the other bank are read in the following way. Soft decisions concerning an earlier transmitted turbo codeword are read serially from an initial half of each column to a first output port of the memory 65. This is done concurrently with soft decisions concerning a later transmitted "duplicate" of the same turbo codeword being read serially from the final half of each column to a second output port of the memory 65. The turbo code decoding control circuitry 64 controls the writing and reading operations of the memory 65.

The first and second output ports of the memory 65 respectively connect to first and second input ports of circuitry 66 for generating a "better" soft decision responsive to each pair of soft decisions concurrently read thereto from the memory 65. The operation of the circuitry 66 is generally similar to that of the circuitry 63 in the FIG. 16 DTV receiver apparatus. However, the circuitry 66 synthesizes 4971-byte turbo codewords, rather than synthesizing 624-byte turbo codewords as the circuitry 63 does. Each successive turbo codeword that is synthesized by the circuitry 66 is supplied from the output port thereof to the input port of the de-interleaver 42, which de-interleaves the bytes of the three components of the codeword for application to the turbo decoder 43.

Figure 18:
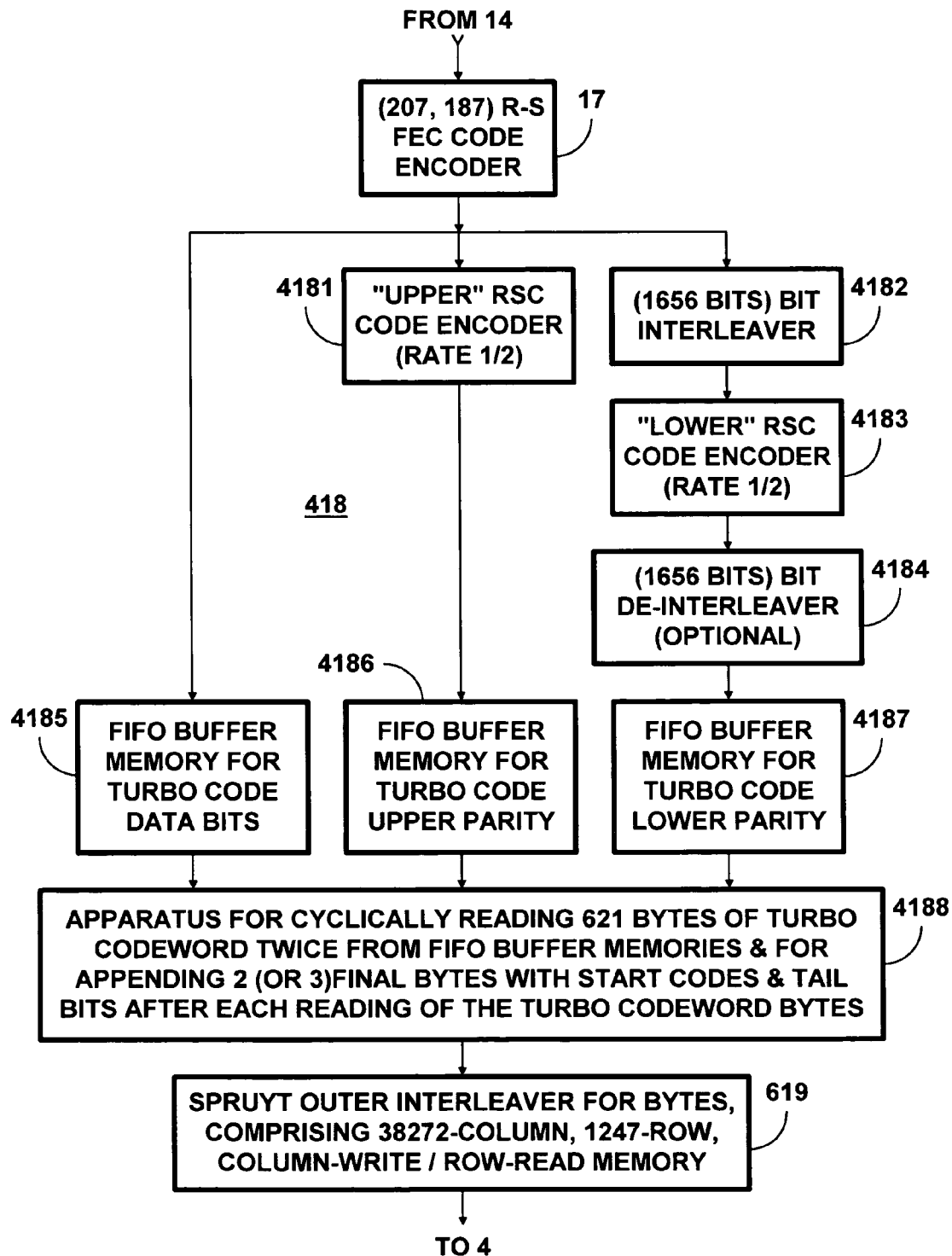
FIG. 18 is a detailed schematic diagram of the combination of turbo code encoder and outer byte interleaver used in another embodiment of the FIG. 1 transmitter apparatus that turbo codes individual 207-byte data segments for staggercasting.

FIG. 18 shows a turbo code encoder 428 and an outer byte interleaver 619 used in another embodiment of the FIG. 1 transmitter apparatus that turbo codes individual 207-byte data segments for staggercasting. The turbo code encoder 428 generates PCCC words that are once repeated to implement staggercasting in the form in which each successive turbo codeword is immediately repeated in its transmission. The outer byte interleaver 619 is of the type described by Spruyt.

The encoder 428 includes an "upper" RSC code encoder 4281, a bit interleaver 4282, a "lower" RSC code encoder 4283, a bit de-interleaver 4284 and first-in, first-out buffer memories 4285, 4286 and 4287. Essentially these elements respectively correspond to the "upper" RSC code encoder 2181, the bit interleaver 2182, the "lower" RSC code encoder 2183, the bit de-interleaver 2184 and FIFO buffer memories 2185, 2186 and 2187 of the turbo code encoder 218 shown in FIG. 6. The turbo code encoder 428 further includes apparatus 4288 that cyclically reads a successive byte of the data bits component of the turbo code stored in the FIFO buffer memory 4285, a successive byte of the "upper" parity bits component of the turbo code stored in the FIFO buffer memory 4286, and a successive byte of the "lower" parity bits component of the turbo code stored in the FIFO buffer memory 4287. The apparatus 4288 time-division multiplexes the cyclically read successive bytes of each component and appends a codeword separator sequence to generate the initial one of each successive pair of the turbo codewords written to a respective column of byte-storage locations within memory in the outer byte interleaver 619. The concluding one of that pair of the turbo codewords written to the respective column of byte-storage locations essentially repeats the initial one of that pair of the turbo codewords, but is a byte longer. The apparatus 4288 generates that concluding one-byte-longer turbo codeword by again cyclically reading a successive byte of the data bits component of the turbo code stored in the FIFO buffer memory 4285, a successive byte of the "upper" parity bits component of the turbo code stored in the FIFO buffer memory 4286, and a successive byte of the "lower" parity bits component of the turbo code stored in the FIFO buffer memory 4287. The apparatus 4288 time-division multiplexes the cyclically read successive bytes of each component and appends a codeword separator sequence to generate the final one of each successive pair of the turbo codewords written to a respective column of byte-storage locations within memory in the outer byte interleaver 619.

The memory in the outer byte interleaver 619 has 1247 rows and 38,262 columns. The number 1247 has only two prime numbers, 29 and 43, as factors. Neither 29 nor 43 is a factor of 38,262. So, there is no problem with establishing uniform scanning paths through the memory in the outer byte interleaver 619 during both the writing of its byte-storage locations and the reading of its byte-storage locations.

Figure 19:
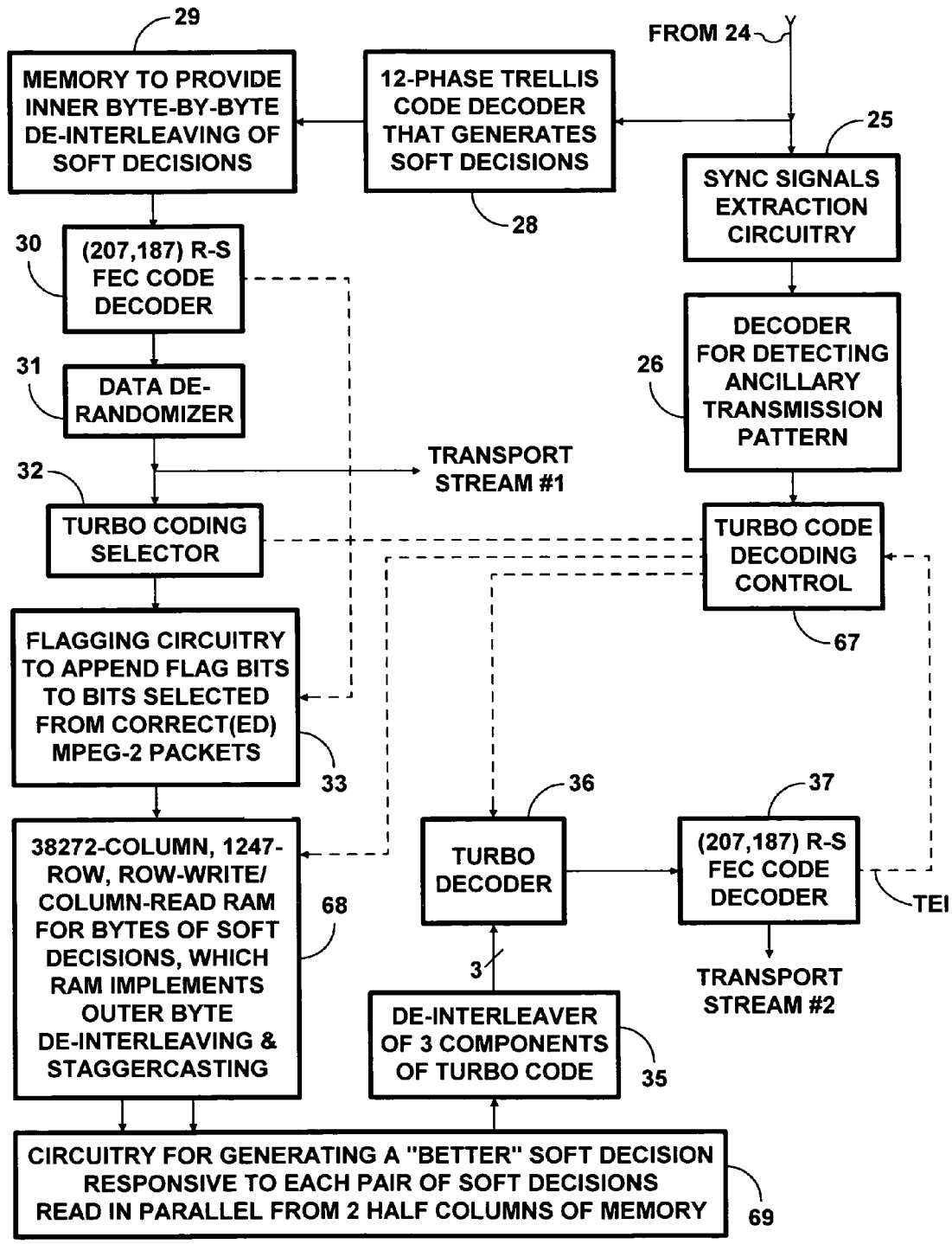
FIG. 19 is a schematic diagram of modifications to the FIG. 5 receiver apparatus, which modifications embody a further aspect of the invention and make possible the useful reception of broadcast digital television signals transmitted with staggercasting by transmitter apparatus of the sort shown in FIGS. 1 and 18.

FIG. 19 shows modifications to the FIG. 4 DTV receiver apparatus fitting it to receive the broadcast digital television signals transmitted with staggercasting by transmitter apparatus of the sort shown in FIGS. 1 and 18. The turbo code decoding control circuitry 27 of the FIG. 3 DTV receiver apparatus is replaced in FIG. 19 by turbo code decoding control circuitry 67 that takes into account the differences in turbo decoding introduced by staggercasting. The memory 34 of the FIG. 3 DTV receiver apparatus is replaced in FIG. 19 by a memory 68 having 38,272 columns and 1247 rows of byte-storage locations therein. Soft decisions concerning an earlier transmitted turbo codeword are read serially from an initial half of each column to a first output port of the memory 68. This is done concurrently with soft decisions concerning a later transmitted "duplicate" of the same turbo codeword being read serially from the final half of each column to a second output port of the memory 68. The turbo code decoding control circuitry 67 controls the writing and reading operations of the memory 68.

The first and second output ports of the memory 68 respectively connect to first and second input ports of the circuitry 69 for generating a "better" soft decision responsive to each pair of soft decisions concurrently read thereto from the memory 68. Each successive turbo codeword that is synthesized by the circuitry 69 is supplied from the output port thereof to the input port of the de-interleaver 35, which de-interleaves the bytes of the three components of the codeword for application to the turbo decoder 36.

Figure 20:
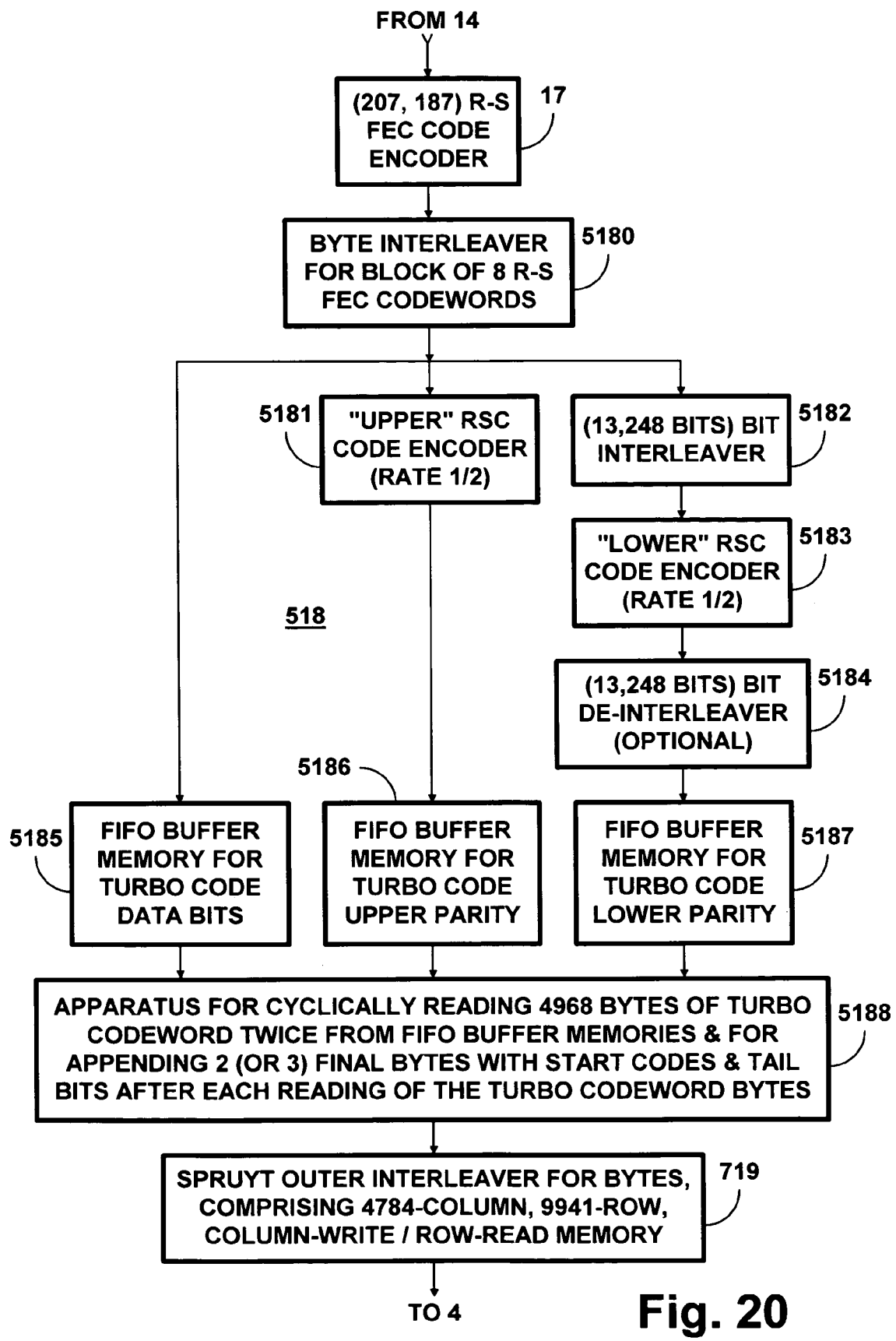
FIG. 20 is a detailed schematic diagram of the combination of turbo code encoder and outer byte interleaver used in another embodiment of the FIG. 1 transmitter apparatus that turbo codes octets of 207-byte data segments for staggercasting.

FIG. 20 shows a turbo code encoder 518 and an outer byte interleaver 719 used in an embodiment of the FIG. 1 transmitter apparatus that turbo codes octets of 207-byte data segments for staggercasting. The turbo code encoder 518 generates PCCC words that are once repeated to implement staggercasting of the novel form in which each successive turbo codeword is immediately repeated in its transmission. The outer byte interleaver 719 is of the type described by Spruyt. The encoder 518 includes a byte interleaver 5180 for octets of 207-byte data segments, an "upper" RSC code encoder 5181, a bit interleaver 5182, a "lower" RSC code encoder 5183, a bit de-interleaver 5184 and first-in, first-out buffer memories 5185, 5186 and 5187. Essentially these elements respectively correspond to the byte interleaver 3180, the "upper" RSC code encoder 3181, the bit interleaver 3182, the "lower" RSC code encoder 3183, the bit de-interleaver 3184 and FIFO buffer memories 3185, 3186 and 3187 of the turbo code encoder 318 shown in FIG. 8 or 12. The turbo code encoder 518 further includes apparatus 5188 that cyclically reads a successive byte of the data bits component of the turbo code stored in the FIFO buffer memory 5185, a successive byte of the "upper" parity bits component of the turbo code stored in the FIFO buffer memory 5186, and a successive byte of the "lower" parity bits component of the turbo code stored in the FIFO buffer memory 5187. The apparatus 5188 time-division multiplexes the cyclically read successive bytes of each component and appends a codeword separator sequence to generate the initial one of each successive pair of the turbo codewords written to a respective column of byte-storage locations within memory in the outer byte interleaver 719. The concluding one of that pair of the turbo codewords written to the respective column of byte-storage locations essentially repeats the initial one of that pair of the turbo codewords, but is a byte longer. The apparatus 5188 generates that concluding one-byte-longer turbo codeword by again cyclically reading a successive byte of the data bits component of the turbo code stored in the FIFO buffer memory 5185, a successive byte of the "upper" parity bits component of the turbo code stored in the FIFO buffer memory 5186, and a successive byte of the "lower" parity bits component of the turbo code stored in the FIFO buffer memory 5187. The apparatus 5188 time-division multiplexes the cyclically read successive bytes of each component and appends a codeword separator sequence to generate the final one of each successive pair of the turbo codewords written to a respective column of byte-storage locations within memory in the outer byte interleaver 719.

The memory in the outer byte interleaver 719 has 9941 rows and 4784 columns. The number 994.1 is prime. So, there is no problem with establishing uniform scanning paths through byte-storage locations of the memory in the outer byte interleaver 719 during their writing and during their reading.

Figure 21:
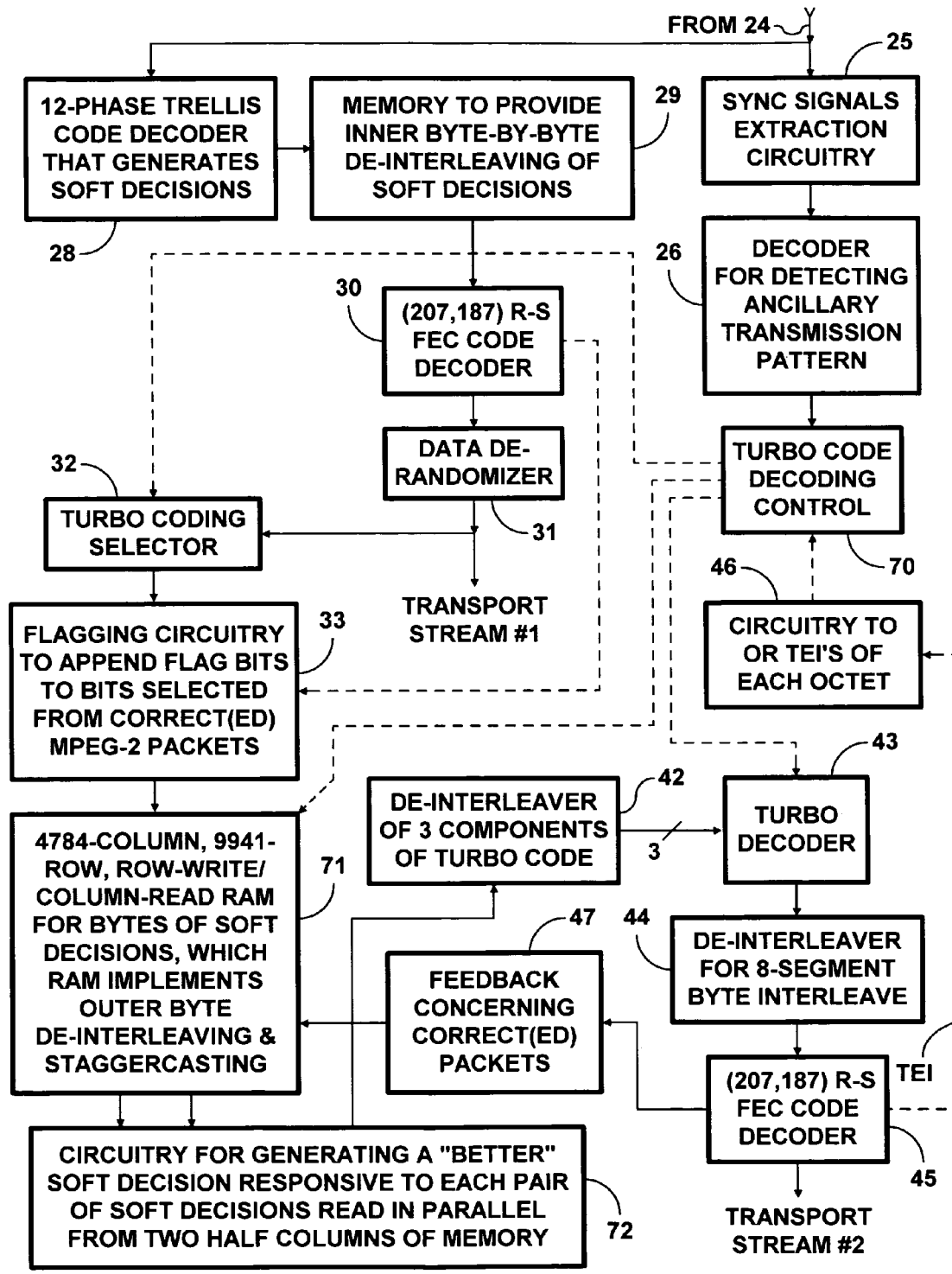
FIG. 21 is a schematic diagram of modifications to the FIG. 11 receiver apparatus, which modifications embody a further aspect of the invention and make possible the useful reception of broadcast digital television signals transmitted with staggercasting by transmitter apparatus of the sort shown in FIGS. 1 and 20.

FIG. 21 shows modifications to the FIG. 9 DTV receiver apparatus fitting it to receive the broadcast digital television signals transmitted with staggercasting by transmitter apparatus of the sort shown in FIGS. 1 and 20. The turbo code decoding control circuitry 40 of the FIG. 9 DTV receiver apparatus is replaced in FIG. 21 by turbo code decoding control circuitry 70 that takes into account the differences in turbo decoding introduced by staggercasting. The memory 41 of the FIG. 9 DTV receiver apparatus is replaced in FIG. 21 by a memory 71 having 4,784 columns and 9,941 rows of byte-storage locations therein. Soft decisions concerning an earlier transmitted turbo codeword are read serially from an initial half of each column to a first output port of the memory 71. This is done concurrently with soft decisions concerning a later transmitted "duplicate" of the same turbo codeword being read serially from the final half of each column to a second output port of the memory 71. The turbo code decoding control circuitry 70 controls the writing and reading operations of the memory 71.

The first and second output ports of the memory 71 respectively connect to first and second input ports of circuitry 72 for generating a "better" soft decision responsive to each pair of soft decisions concurrently read thereto from the memory 71. Each successive turbo codeword that is synthesized by the circuitry 72 is supplied from the output port thereof to the input port of the de-interleaver 42, which de-interleaves the bytes of the three components of the codeword for application to the turbo decoder 43.

The retransmission of the turbo codeword can be delayed to increase the capability of the DTV receiver to overcome deep fades, of course, but this will cost additional memory in the DTV transmitter and in each DTV receiver. While the retransmission of turbo codewords can substantially increase the capability of the DTV receiver to overcome deep fades, this capability comes at a cost in reduced code rate. In the retransmission procedures specifically described, the code rate is one-sixth that of an ordinary 8VSB signal. Half of this reduction is caused by retransmission; the rest, by the 3:1 redundancy introduced by turbo coding. The inventor sought some way to mitigate the six times reduction in code rate.

The inventor discerned that re-transmitting just the data components of turbo codewords would reduce code rate only four times, while retaining some capability of the DTV receiver to overcome deep fades. Preferably the first set of parity bits would be time-interleaved with one of the transmissions of the data component of a turbo codeword, and the second set of parity bits would be time-interleaved with the other transmission of the data component of the turbo codeword. While portions of the two transmissions might be lost because of a deep fade, the remaining data would retain half of its convolutional coding, so AWGN performance would still be improved to considerable degree. Deep fades could still be overcome by the staggercasting if the tunnels and underpasses causing the drop-outs were not so distant from the DTV transmitter antenna that the compromised AWGN performance were inadequate. If both transmissions of a turbo codeword were received at some signal strength, AWGN performance would not be much compromised. This type of staggercasting will be referred to as "punctured staggercasting" in the following portion of this specification.

Figure 22:
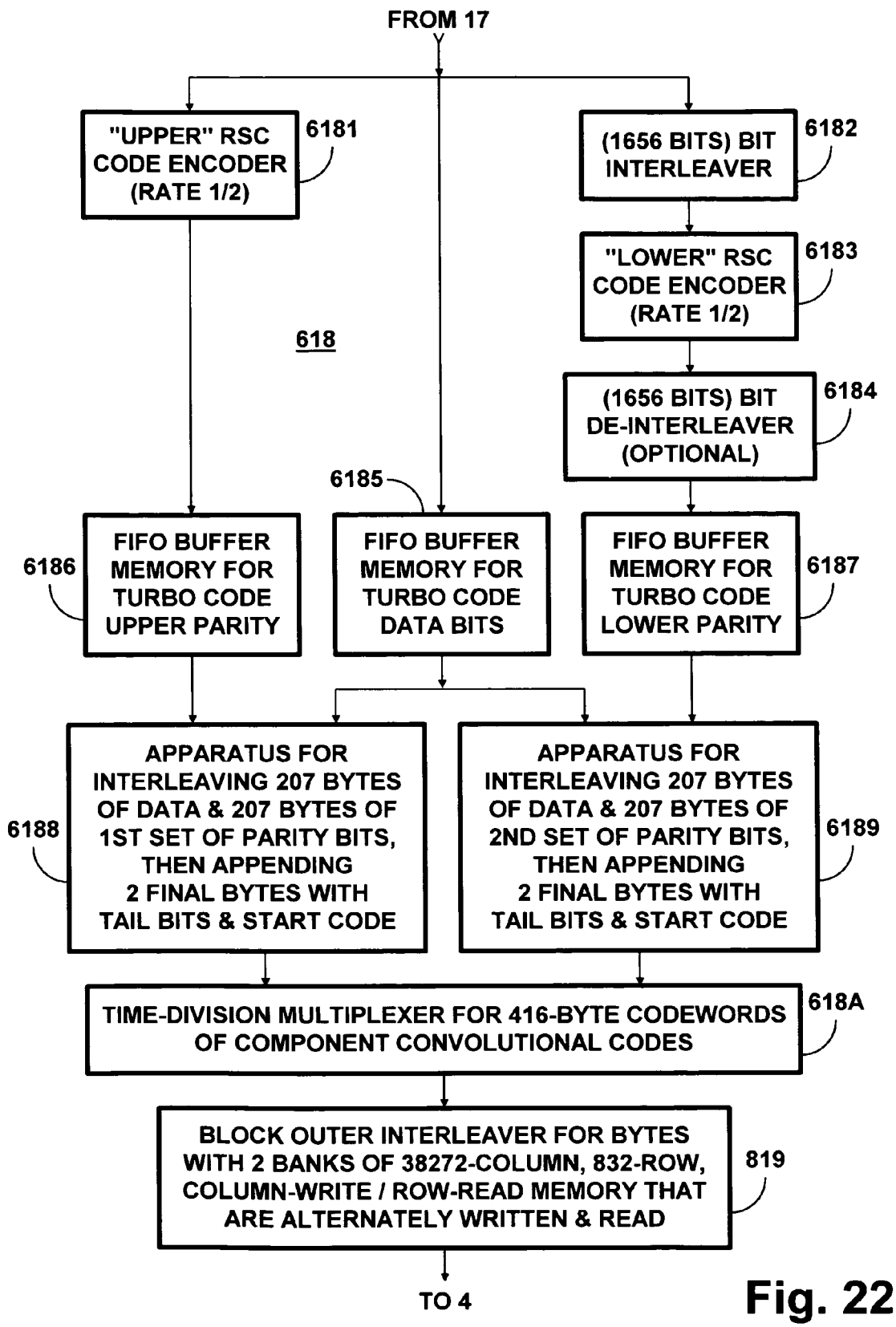
FIG. 22 is a detailed schematic diagram of the combination of turbo code encoder and outer byte interleaver used in an embodiment of the FIG. 1 transmitter apparatus that uses parallelly concatenated convolutional codes to turbo code individual 207-byte data segments and that staggercasts just the data portions of each turbo codeword.

FIG. 22 shows a turbo code encoder 618 and an outer byte interleaver 819, which are used as the turbo code encoder 18 and the outer byte interleaver 19 in an embodiment of the FIG. 1 transmitter apparatus that turbo codes individual R-S FEC codewords and transmits them to provide punctured staggercasting. The turbo code encoder 18 generates PCCC words the data components of which are repeated in the punctured staggercasting of the novel form in which each successive turbo codeword is immediately repeated in its transmission. The encoder 618 includes an "upper" RSC code encoder 6181, a bit interleaver 6182, a "lower" RSC code encoder 6183, a bit de-interleaver 6184 and first-in, first-out buffer memories 6185, 6186 and 6187. Essentially these elements respectively correspond to the "upper" RSC code encoder 1181, the bit interleaver 1182, the "lower" RSC code encoder 1183, the bit de-interleaver 1184 and FIFO buffer memories 1185, 1186 and 1187 of the turbo code encoder 118 shown in FIG. 2. The turbo code encoder 618 further includes apparatus 6188 for interleaving bytes of data read from the FIFO buffer memory 6185 with bytes of the first set of parity bits read from the FIFO buffer memory 6186, and then appending two bytes containing the tail bits forwarded from the "upper" RSC code encoder 6181 and a start code. The turbo code encoder 618 also further includes apparatus 6189 for interleaving bytes of data read from the FIFO buffer memory 6185 with bytes of the second set of parity bits read from the FIFO buffer memory 6187, then appending two bytes containing the tail bits forwarded from the "lower" RSC code encoder 6183 and a start code. The turbo code encoder 618 still further includes a time-division multiplexer 618A which interleaves the 416-byte convolutional codewords from the apparatus 6188 and the 416-byte convolutional codewords from the apparatus 6189 for application to the input port of the outer byte interleaver 819. The differential delay required for this multiplexing operation is conveniently provided by suitably timing the reading of the FIFO buffer memories 6185, 6186 and 6187.

The outer byte interleaver 819 is a block interleaver comprising two banks of memory that alternate between being written and being read. A succession of 832-byte turbo codewords with repeated data are written into respective columns of byte-storage locations in one bank of the memory while the rows of byte-storage locations in the other bank are being read out to the null-packet payload-data-field packer 4. Each bank of the memory contains 38,272 columns of byte-storage locations, so data bytes are spread out to be about one data frame apart.

Figure 23:
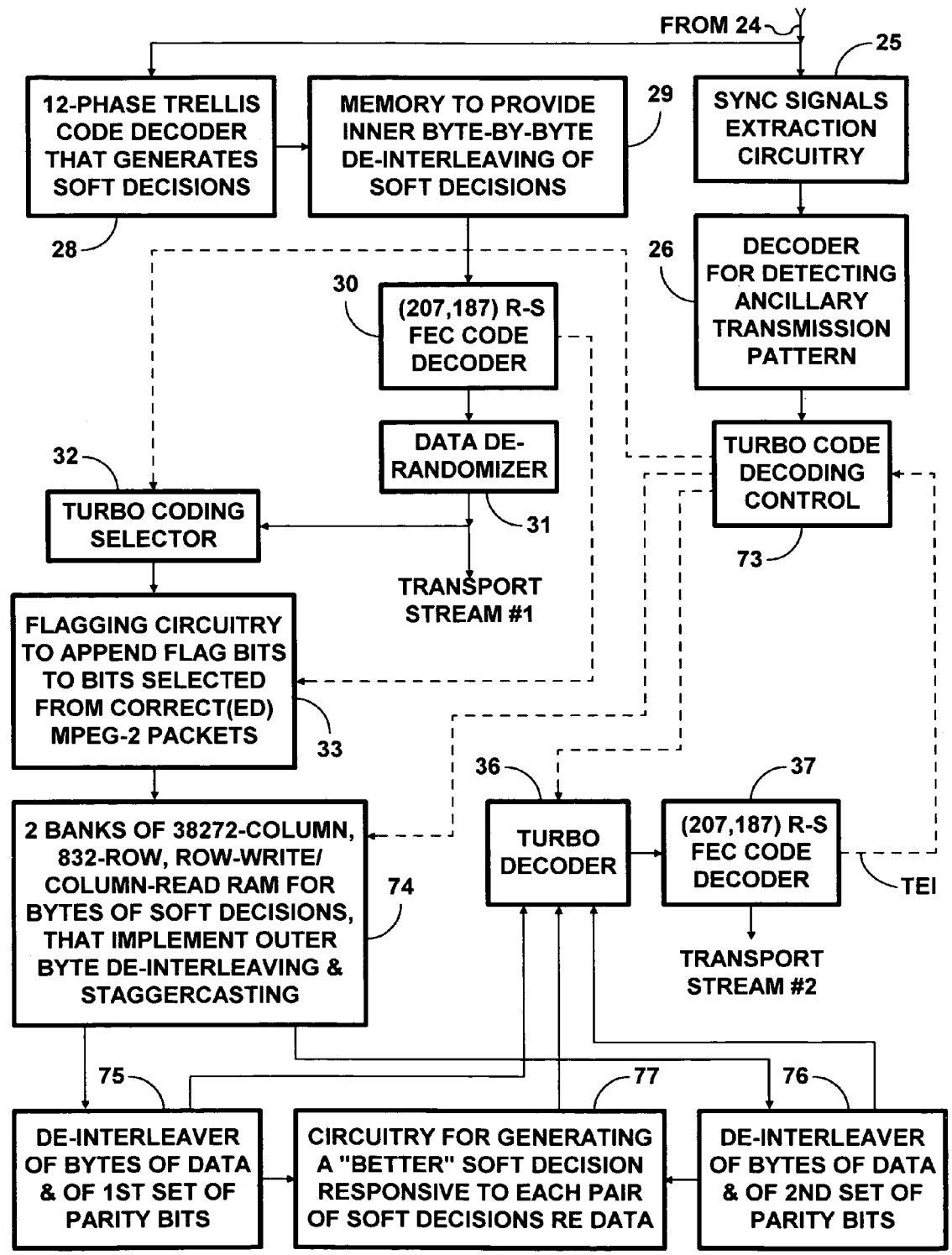
FIG. 23 is a schematic diagram of modifications to the FIG. 4 receiver apparatus, which modifications embody a further aspect of the invention and make possible the useful reception of broadcast digital television signals transmitted with staggercasting by transmitter apparatus of the sort shown in FIGS. 1 and 22.

FIG. 23 shows modifications to the FIG. 3 DTV receiver apparatus fitting it to receive the broadcast digital television signals transmitted with punctured staggercasting by transmitter apparatus of the sort shown in FIGS. 1 and 22. The turbo code decoding control circuitry 27 of the FIG. 3 DTV receiver apparatus is replaced in FIG. 23 by turbo code decoding control circuitry 73 that takes into account the differences in turbo decoding introduced by punctured staggercasting. The memory 34 of the FIG. 3 DTV receiver apparatus is replaced in FIG. 23 by a memory 74 having two banks each having 38,272 columns and 832 rows of byte-storage locations therein. The 832 rows of one bank of the memory are written while the 38,272 columns of the other bank are read in the following way. Soft decisions concerning an earlier transmitted convolutional codeword are read serially from an initial half of each column to a first output port of the memory 74. This is done concurrently with soft decisions concerning a later transmitted convolutional codeword with similar data component being read serially from the final half of each column to a second output port of the memory 74. The turbo code decoding control circuitry 73 controls the writing and reading operations of the memory 74.

The first output port of the memory 74 connects to the input port of a de-interleaver 75 for selecting bytes of data to its first output port and selecting bytes of a first set of parity bits to its second output port. The de-interleaver 75 also selects bytes with data tail bits to its first output port and bytes with tail bits for the first set of parity bits to its second output port. The second output port of the de-interleaver 75 is connected to a respective input port of the turbo code decoder 36 for supplying the decoder 36 with the first set of parity bits including tail bits for each successive turbo codeword.

The second output port of the memory 74 connects to the input port of a de-interleaver 76 for selecting bytes of data to its first output port and selecting bytes of a second set of parity bits to its second output port. The de-interleaver 76 also selects bytes with data tail bits to its first output port and bytes with tail bits for the second set of parity bits to its second output port. The second output port of the de-interleaver 76 is connected to a respective input port of the turbo code decoder 36 for supplying the decoder 36 with the second set of parity bits including tail bits for each successive turbo codeword.

The first input ports of the de-interleavers 75 and 76 respectively connect to first and second input ports of circuitry 77 for generating a "better" soft decision responsive to each pair of soft decisions concurrently read thereto from the de-interleavers 75 and 76. The operation of the circuitry 77 is generally similar to that of the circuitry 62 in the FIG. 16 DTV receiver apparatus. However, the circuitry 77 operates only on the data components of turbo codewords, rather than on all three components of turbo codewords as the circuitry 62 does. Each successive turbo codeword data component that is synthesized by the circuitry 77 is supplied from the output port thereof to a respective input port of the turbo decoder 36.

Figure 24:
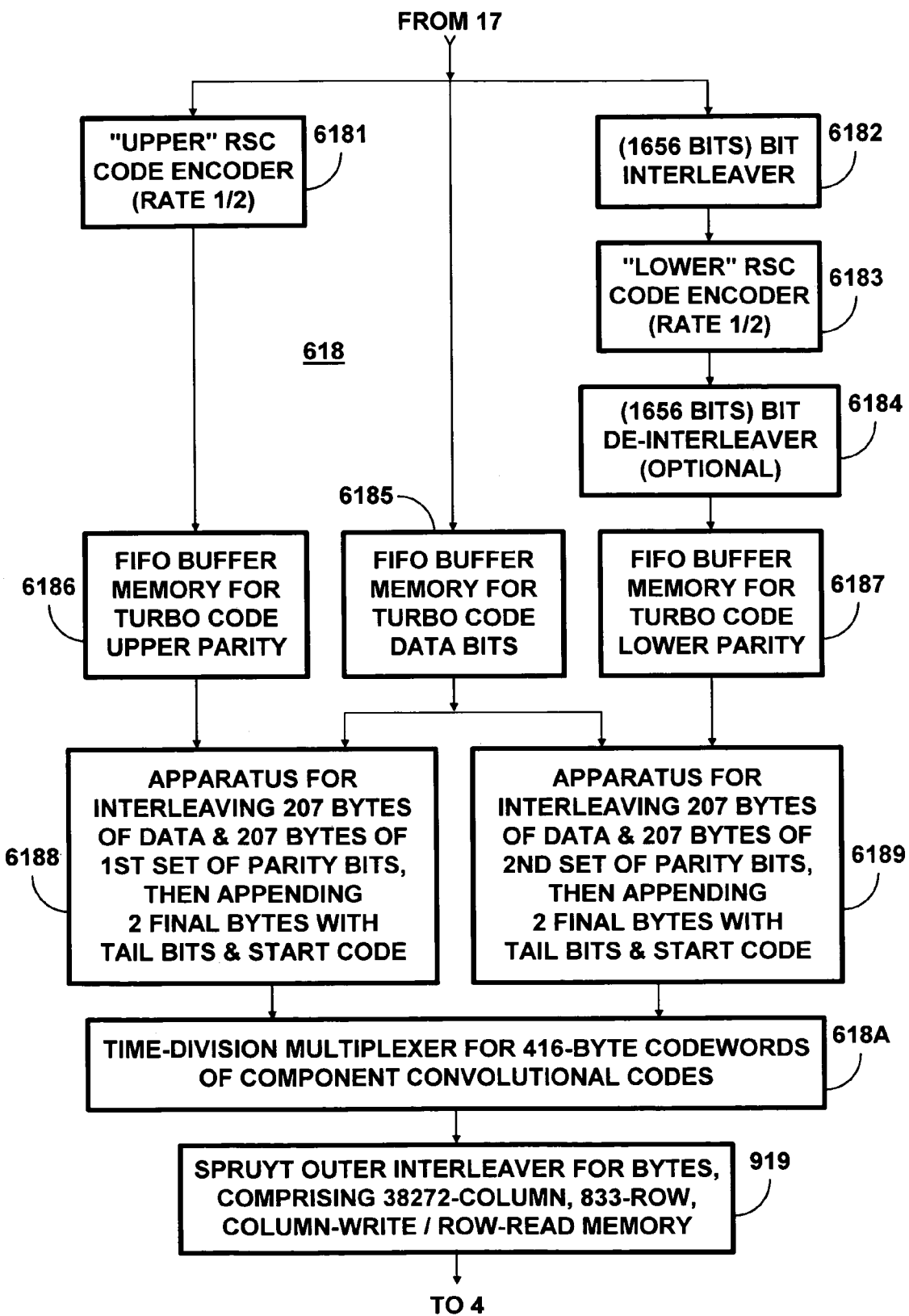
FIG. 24 is a detailed schematic diagram of the combination of turbo code encoder and outer byte interleaver used in another embodiment of the FIG. 1 transmitter apparatus that uses parallelly concatenated convolutional codes to turbo code individual 207-byte data segments and that staggercasts just the data portions of each turbo codeword, the outer byte interleaver of which combination uses substantially less memory than that in FIG. 22.

FIG. 24 shows the turbo code encoder 618 and an outer byte interleaver 919, which are used as the turbo code encoder 18 and the outer byte interleaver 19 in another embodiment of the FIG. 1 transmitter apparatus that turbo codes individual R-S FEC codewords and transmits them to provide punctured staggercasting. The outer byte interleaver 919 is of the type described by Spruyt. The memory therein has 38,272 columns of byte-storage locations for spreading data bytes of a turbo codeword to occur one per data frame and must have at least 832 rows of byte-storage locations to accommodate each turbo codeword with repeated data component. The numbers 38,272 and 832 have a number of factors in common with each other, suggesting possible problems with establishing uniform scanning paths for both writing and reading 832×38, 272=31,842,304 byte-storage locations. Extending the number of rows of byte-storage locations to 833 eliminates any problems caused by there being any factors in common with the number 38,272. The factors 7 and 119 of 833 are not factors of 38,272. The extra byte-storage location in each column of byte-storage locations is filled with additional start code which can be introduced by the time-division multiplexer 618A or can be hard-wired into suitable byte-storage locations in the memory as read-only data.

Figure 25:
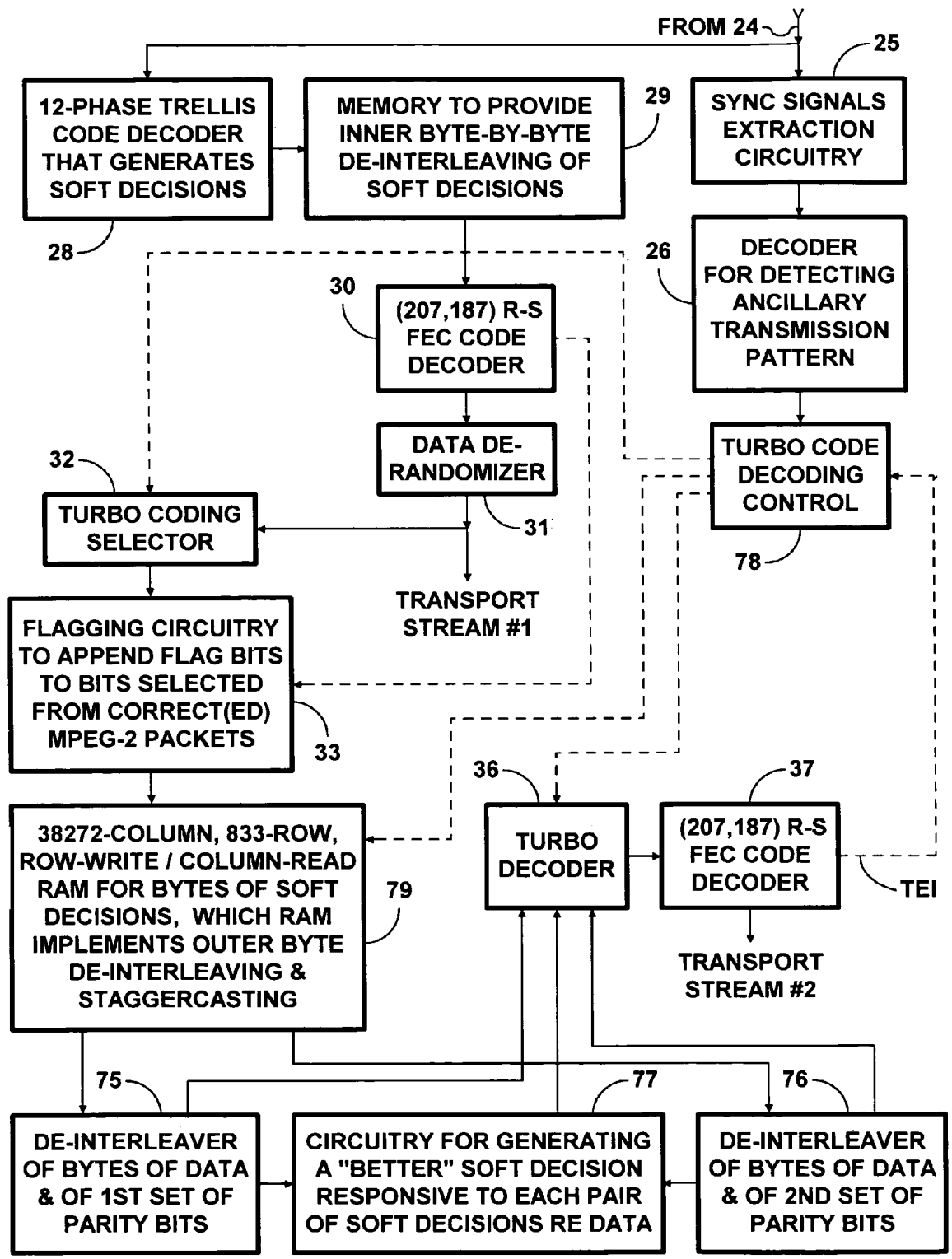
FIG. 25 is a schematic diagram of modifications to the FIG. 9 receiver apparatus, which modifications embody a further aspect of the invention and make possible the useful reception of broadcast digital television signals transmitted with punctured staggercasting by transmitter apparatus of the sort shown in FIGS. 1 and 24.

FIG. 25 shows modifications to the FIG. 4 DTV receiver apparatus fitting it to receive the broadcast digital television signals transmitted with punctured staggercasting by transmitter apparatus of the sort shown in FIGS. 1 and 24. The turbo code decoding control circuitry 27 of the FIG. 4 DTV receiver apparatus is replaced in FIG. 25 by turbo code decoding control circuitry 78 that takes into account the differences in turbo decoding introduced by punctured staggercasting. The memory 34 of the FIG. 4 DTV receiver apparatus is replaced in FIG. 25 by a memory 79 having 38,272 columns and 833 rows of byte-storage locations therein. Soft decisions concerning an earlier transmitted convolutional codeword are read serially from an initial half of each column to a first output port of the memory 79. This is done concurrently with soft decisions concerning a later transmitted convolutional codeword with similar data component being read serially from the final half of each column to a second output port of the memory 79. The turbo code decoding control circuitry 78 controls the writing and reading operations of the memory 79.

The first and second output ports of the memory 78 connect to the input ports of the de-interleavers 75 and 76, respectively. The first input ports of the de-interleavers 75 and 76 supply respective data components to first and second input ports of circuitry 77 for generating a "better" soft decision responsive to each pair of soft decisions concurrently read thereto from the de-interleavers 75 and 76. Each successive turbo codeword data component that is synthesized by the circuitry 77 is supplied from the output port thereof to a respective input port of the turbo decoder 36. The first input ports of the de-interleavers 75 and 76 respectively connect to respective input ports of the turbo decoder 36 for supplying the decoder 36 with first and second sets of parity bits respectively.

Figure 26:
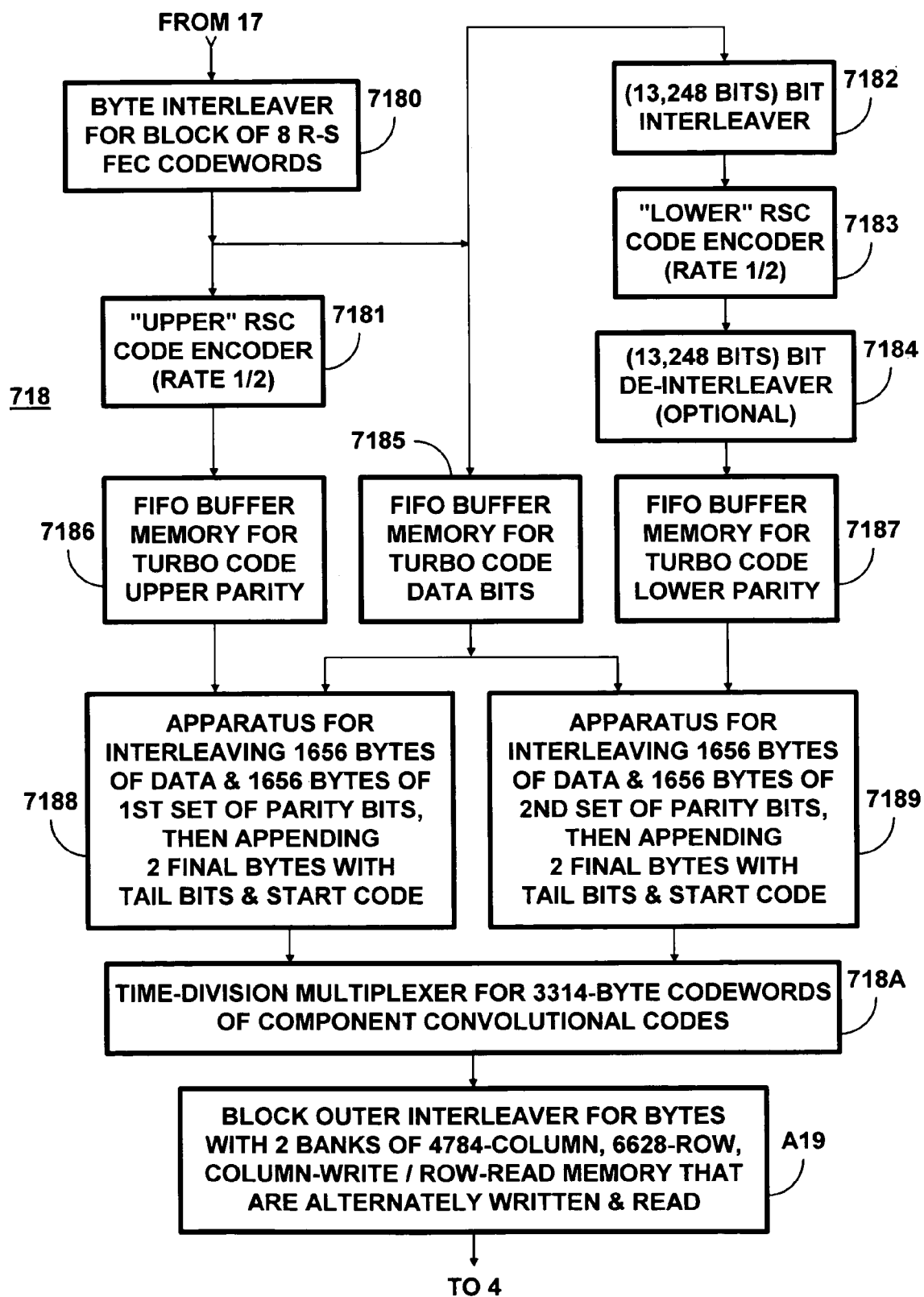
FIG. 26 is a detailed schematic diagram of the combination of turbo code encoder and outer byte interleaver used in an embodiment of the FIG. 1 transmitter apparatus that uses parallelly concatenated convolutional codes to turbo code octets of 207-byte data segments and that staggercasts just the data portions of each turbo codeword.

FIG. 26 shows a turbo code encoder 718 and an outer byte interleaver A19, which are used as the turbo code encoder 18 and the outer byte interleaver 19 in an embodiment of the FIG. 1 transmitter apparatus that turbo codes octets of R-S FEC codewords and transmits them to provide punctured staggercasting. The turbo code encoder 18 generates PCCC words the data components of which are repeated in the punctured staggercasting of novel form in which each successive turbo codeword is immediately repeated in its transmission. The encoder 718 includes a byte interleaver 7180 for octets of R-S FEC codewords, an "upper" RSC code encoder 7181, a bit interleaver 7182, a "lower" RSC code encoder 7183, a bit de-interleaver 7184 and first-in, first-out buffer memories 7185, 7186 and 7187. Essentially these elements respectively correspond to the byte interleaver 3180, the "upper" RSC code encoder 3181, the bit interleaver 3182, the "lower" RSC code encoder 3183, the bit de-interleaver 3184 and FIFO buffer memories 3185, 3186 and 3187 of the turbo code encoder 318 shown in FIGS. 8 and 12. The turbo code encoder 718 further includes apparatus 7188 for interleaving bytes of data read from the FIFO buffer memory 7185 with bytes of the first set of parity bits read from the FIFO buffer memory 7186, and then appending two bytes containing the tail bits forwarded from the "upper" RSC code encoder 7181 and a start code. The turbo code encoder 718 also further includes apparatus 7189 for interleaving bytes of data read from the FIFO buffer memory 7185 with bytes of the second set of parity bits read from the FIFO buffer memory 7187, then appending two bytes containing the tail bits forwarded from the "lower" RSC code encoder 7183 and a start code. The turbo code encoder 718 still further includes a time-division multiplexer 718A which interleaves the 3314-byte convolutional codewords from the apparatus 7188 and the 3314-byte convolutional codewords from the apparatus 7189 to generate 6628-byte codewords for application to the input port of the outer byte interleaver A18. The differential delay required for this multiplexing operation is conveniently provided by suitably timing the reading of the FIFO buffer memories 7185, 7186 and 7187.

The outer byte interleaver A19 is a block interleaver comprising two banks of memory that alternate between being written and being read. A succession of 6628-byte turbo codewords with repeated data are written into respective columns of byte-storage locations in one bank of the memory while the rows of byte-storage locations in the other bank are being read out to the null-packet payload-data-field packer 4. Each bank of the memory contains 4,784 columns of byte-storage locations, so data bytes are spread out to be about one data frame apart.

Figure 27:
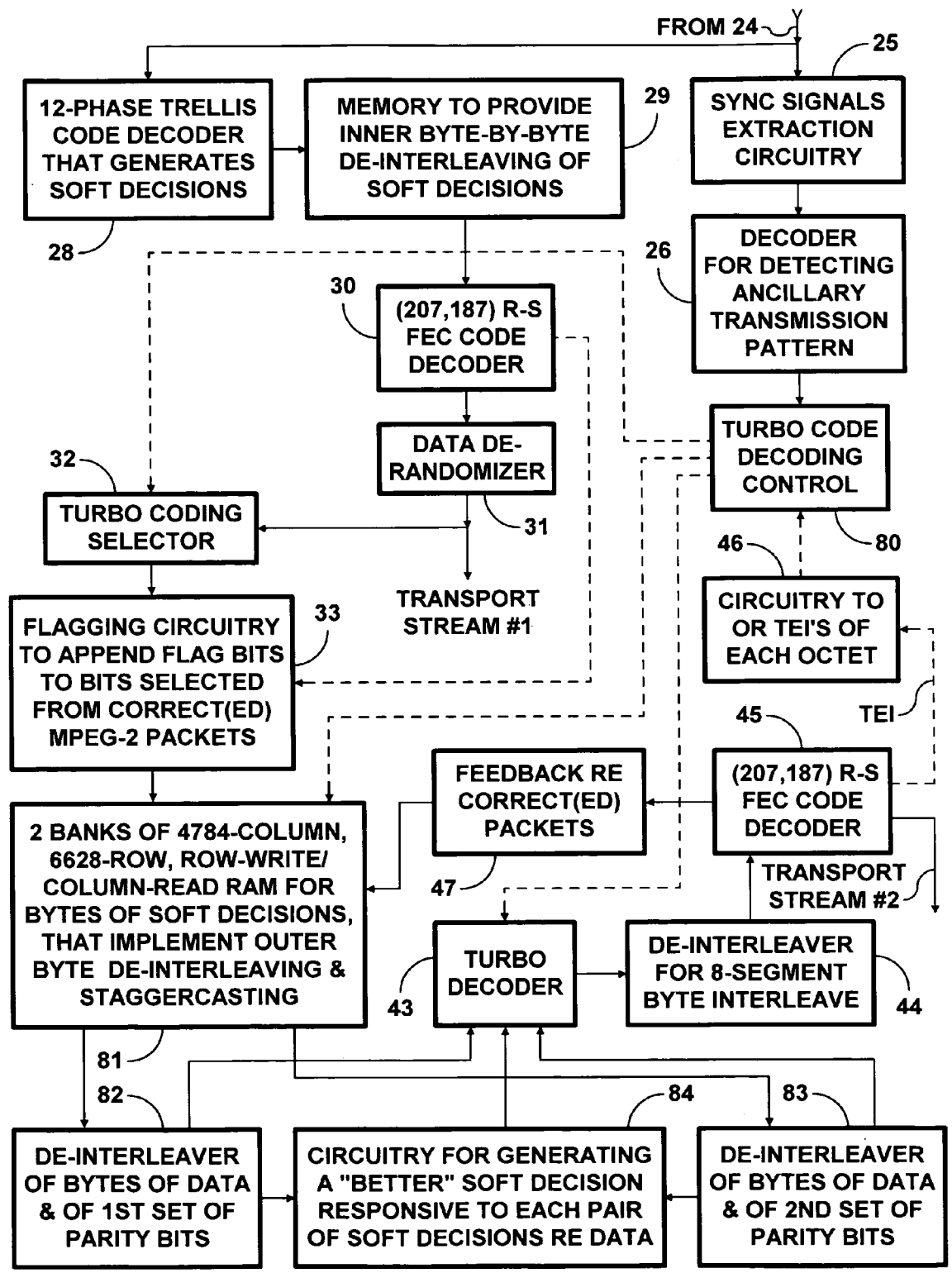
FIG. 27 is a schematic diagram of modifications to the FIG. 9 receiver apparatus, which modifications embody a further aspect of the invention and make possible the useful reception of broadcast digital television signals transmitted with punctured staggercasting by transmitter apparatus of the sort shown in FIGS. 1 and 26.

FIG. 27 shows modifications to the FIG. 9 DTV receiver apparatus fitting it to receive the broadcast digital television signals transmitted with punctured staggercasting by transmitter apparatus of the sort shown in FIGS. 1 and 24. The turbo code decoding control circuitry 40 of the FIG. 9 DTV receiver apparatus is replaced in FIG. 27 by turbo code decoding control circuitry 80 that takes into account the differences in turbo decoding introduced by punctured staggercasting. The memory 41 of the FIG. 9 DTV receiver apparatus is replaced in FIG. 27 by a memory 81 having two banks each having 4,784 columns and 6628 rows of byte-storage locations therein. The 6628 rows of one bank of the memory are written while the 4,784 columns of the other bank are read in the following way. Soft decisions concerning an earlier transmitted convolutional codeword are read serially from an initial half of each column to a first output port of the memory 81. This is done concurrently with soft decisions concerning a later transmitted convolutional codeword with similar data component being read serially from the final half of each column to a second output port of the memory 81. The turbo code decoding control circuitry 80 controls the writing and reading operations of the memory 81.

The first output port of the memory 81 connects to the input port of a de-interleaver 82 for selecting bytes of data to its first output port and selecting bytes of a first set of parity bits to its second output port. The de-interleaver 82 also selects bytes with data tail bits to its first output port and bytes with tail bits for the first set of parity bits to its second output port. The second output port of the de-interleaver 82 is connected to a respective input port of the turbo code decoder 43 for supplying the decoder 43 with the first set of parity bits including tail bits for each successive turbo codeword.

The second output port of the memory 81 connects to the input port of a de-interleaver 83 for selecting bytes of data to its first output port and selecting bytes of a second set of parity bits to its second output port. The de-interleaver 83 also selects bytes with data tail bits to its first output port and bytes with tail bits for the second set of parity bits to its second output port. The second output port of the de-interleaver 83 is connected to a respective input port of the turbo code decoder 43 for supplying the decoder 43 with the second set of parity bits including tail bits for each successive turbo codeword.

The first input ports of the de-interleavers 82 and 83 respectively connect to first and second input ports of circuitry 84 for generating a "better" soft decision responsive to each pair of soft decisions concurrently read thereto from the de-interleavers 82 and 83. The operation of the circuitry 83 is generally similar to that of the circuitry 66 in the FIG. 17 DTV receiver apparatus. However, the circuitry 84 operates only on the data components of turbo codewords, rather than on all three components of turbo codewords as the circuitry 66 does. Each successive turbo codeword data component that is synthesized by the circuitry 84 is supplied from the output port thereof to a respective input port of the turbo decoder 43.

Figure 28:
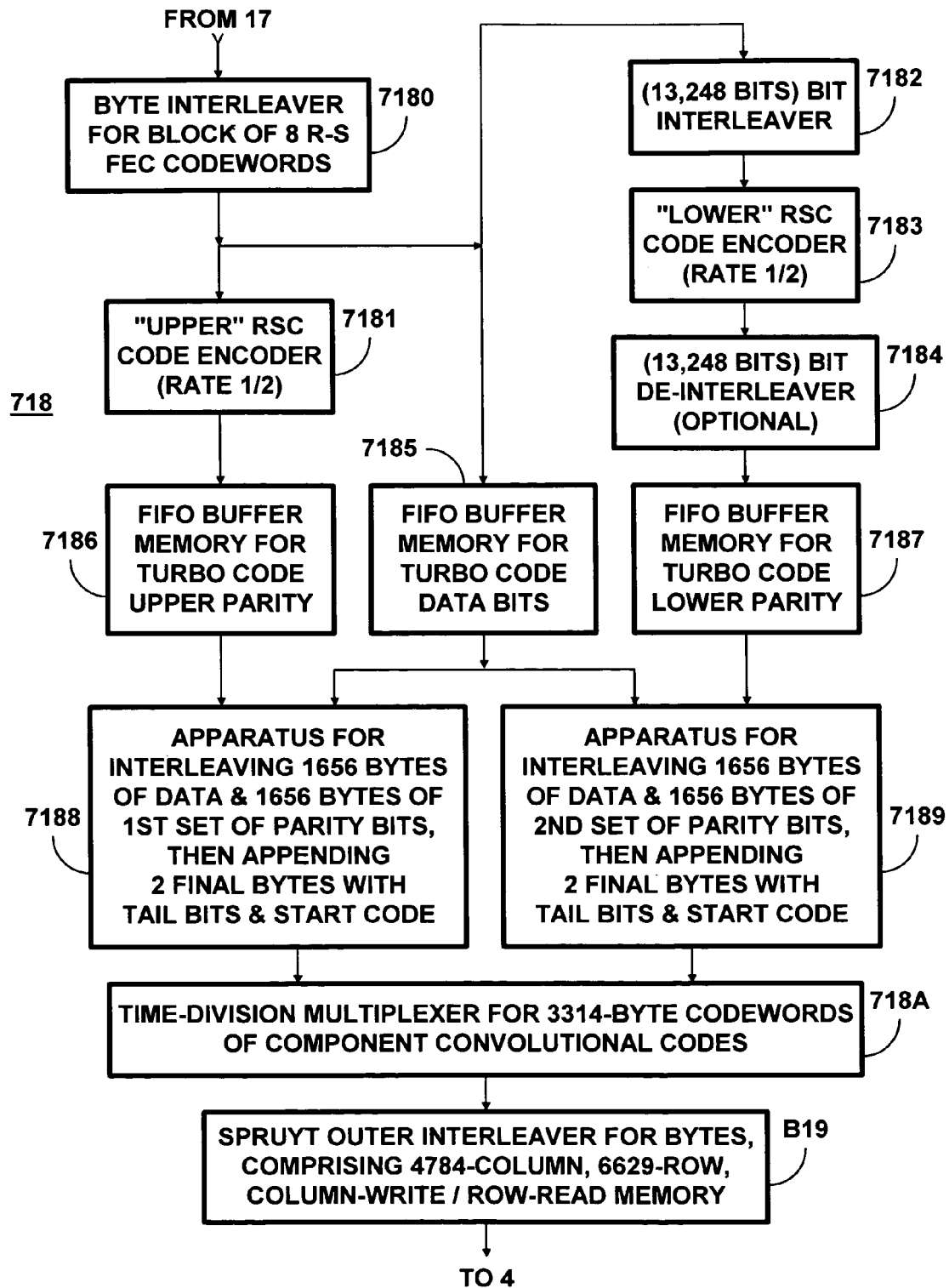
FIG. 28 is a detailed schematic diagram of the combination of turbo code encoder and outer byte interleaver used in another embodiment of the FIG. 1 transmitter apparatus that uses parallelly concatenated convolutional codes to turbo code octets of 207-byte data segments and that staggercasts just the data portions of each turbo codeword, the outer byte interleaver of which combination uses substantially less memory than that in FIG. 24.

FIG. 28 shows the turbo code encoder 718 and an outer byte interleaver B19, which are used as the turbo code encoder 18 and the outer byte interleaver 19 in another embodiment of the FIG. 1 transmitter apparatus that turbo codes octets of R-S FEC codewords and transmits them to provide punctured staggercasting. The outer byte interleaver B19 is of the type described by Spruyt. The memory therein has 4,784 columns of byte-storage locations for spreading data bytes of a turbo codeword to occur one per data frame and must have at least 6,628 rows of byte-storage locations to accommodate each turbo codeword with repeated data component. The numbers 4,784 and 6,628 have a number of factors in common with each other, suggesting possible problems with establishing uniform scanning paths for both writing and reading 4784×6628=31,708,352 byte-storage locations. Extending the number of rows of byte-storage locations to 6,629 eliminates any problems caused by there being any factors in common with the number 4,784. The factors 7 and 947 of 6,629 are not factors of 4784. The extra byte-storage location in each column of byte-storage locations is filled with additional start code which can be introduced by the time-division multiplexer 718A or can be hard-wired into suitable byte-storage locations in the memory as read-only data.

Figure 29:
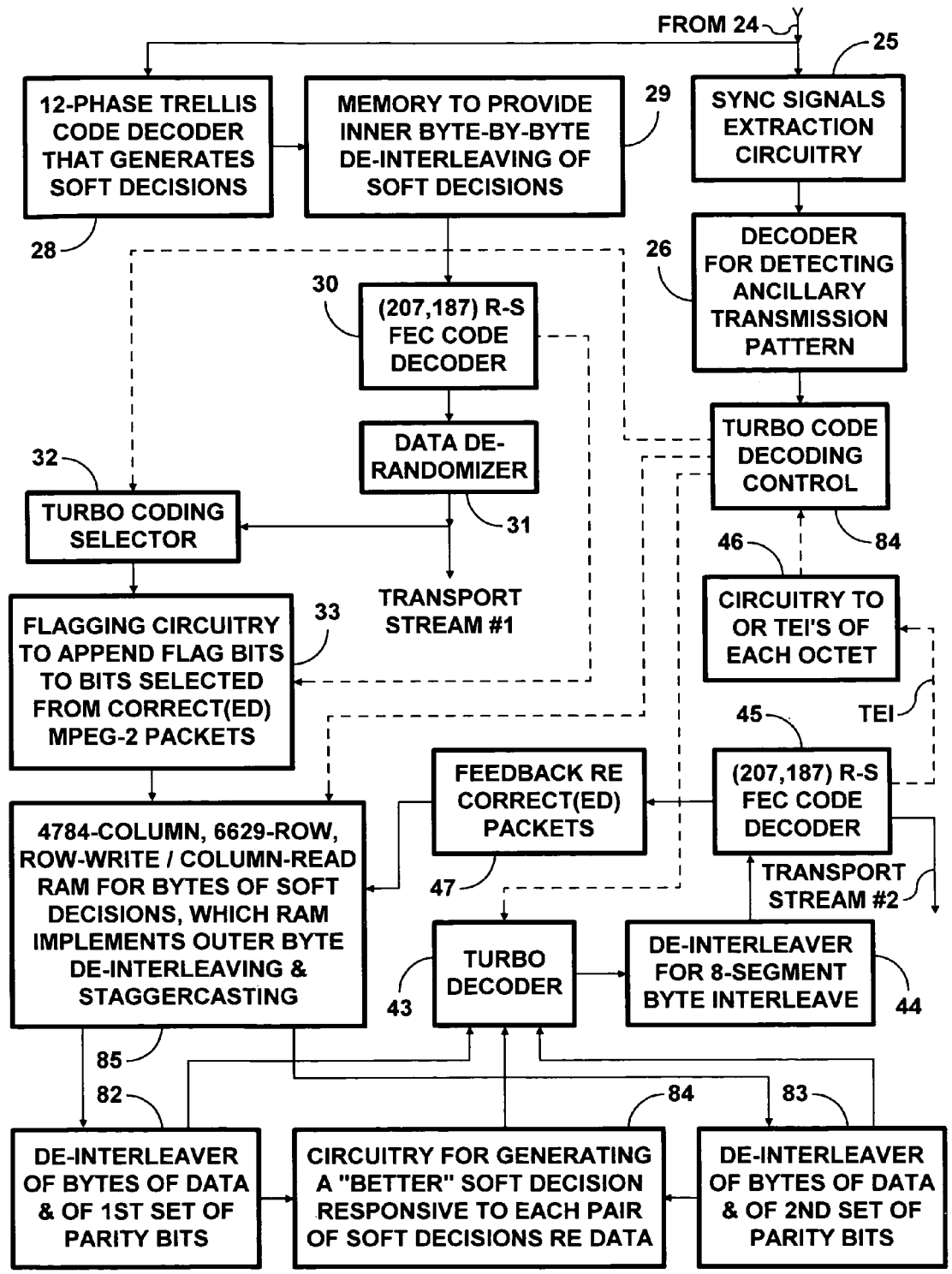
FIG. 29 is a schematic diagram of modifications to the FIG. 9 receiver apparatus, which modifications embody a further aspect of the invention and make possible the useful reception of broadcast digital television signals transmitted with punctured staggercasting by transmitter apparatus of the sort shown in FIGS. 1 and 28.

FIG. 29 shows modifications to the FIG. 9 DTV receiver apparatus fitting it to receive the broadcast digital television signals transmitted with punctured staggercasting by transmitter apparatus of the sort shown in FIGS. 1 and 28. The turbo code decoding control circuitry 40 of the FIG. 9 DTV receiver apparatus is replaced in FIG. 29 by turbo code decoding control circuitry 84 that takes into account the differences in turbo decoding introduced by punctured staggercasting. The memory 41 of the FIG. 9 DTV receiver apparatus is replaced in FIG. 29 by a memory 85 having 4,784 columns and 6,629 rows of byte-storage locations therein. Soft decisions concerning an earlier transmitted convolutional codeword are read serially from an initial half of each column to a first output port of the memory 85. This is done concurrently with soft decisions concerning a later transmitted convolutional codeword with similar data component being read serially from the final half of each column to a second output port of the memory 85. The turbo code decoding control circuitry 84 controls the writing and reading operations of the memory 85.

The first and second output ports of the memory 85 connect to the input ports of the de-interleavers 82 and 83, respectively. The first input ports of the de-interleavers 82 and 83 supply respective data components to first and second input ports of circuitry 84 for generating a "better" soft decision responsive to each pair of soft decisions concurrently read thereto from the de-interleavers 82 and 83. Each successive turbo codeword data component that is synthesized by the circuitry 84 is supplied from the output port thereof to a respective input port of the turbo decoder 43. The first input ports of the de-interleaver 82 and 83 respectively connect to respective input ports of the turbo decoder 43 for supplying the decoder 43 with first and second sets of parity bits respectively.

An important feature of the FIG. 1 DTV transmitter apparatus is that data randomization is only performed on the complete transport stream supplied from the multiplexer 1. In the DTV receiver apparatuses of FIGS. 3, 7, 9, 13, 16, 17, 19, 21, 23, 25, 27 and 29 this feature of the FIG. 1 DTV transmitter apparatus permits data de-randomization to be completed immediately after the inner decoder 30 for (207, 187) R-S FEC code. At this point in the system the correlation of the 187-byte MPEG-2-compatible data packets with the portion of the PRBS they are to be exclusive-ORed with is well-defined in time. The subsequent turbo code decoding procedures are apt to be iterated a number of times that depends on the signal-to-noise ratio of the received signal. Having no further data de-randomization procedure obviates problems with timing a de-randomizing function so as to track the timing of turbo code decoding results.

The capability of the decoder 30 in the DTV receiver apparatuses of FIGS. 3, 7, 9, 13, 16, 17, 19, 21, 23, 25, 27 and 29 to correct byte errors in (207, 187) R-S FEC codewords is doubled if byte errors are located beforehand. A method for locating byte errors during Viterbi trellis decoding is described in U.S. Pat. No. 7,103,831 titled "Burst Reliability and Error Locator for Trellis Codes", which issued 5 Sep. 2006 to A. Krieger and D. B. Eidson. The capability of the DTV receiver apparatuses of FIGS. 3, 7, 16, 19, 23 and 25 to withstand drop-outs in signal strength is lengthened by doubling the byte error correction capability of the decoder 37 to correct byte errors in (207, 187) R-S FEC codewords. This depends upon byte errors being located during the turbo decoding procedure. Similarly, the capability of the DTV receiver apparatuses of FIGS. 9, 13, 17, 21, 27 and 29 to withstand drop-outs in signal strength is lengthened by doubling the byte error correction capability of the decoder 45 to correct byte errors in (207, 187) R-S FEC codewords.

DTV systems can be designed that are able to overcome protracted drop-outs in signal strength without requiring as many byte-storage locations both in outer interleaver memory and in outer de-interleaver memory, providing that some further reduction in code rate is acceptable. Some of these designs are less preferred alternative embodiments of the invention that depend on the ancillary transport stream being forward-error-correction coded with a more powerful Reed-Solomon code. Decoding operations take longer time as the number of erroneous bytes that can be corrected in the R-S FEC codeword is increased by adding further parity bytes to the 187-byte data packet.

By way of example, the well-known (255, 223) Reed-Solomon code can be shortened to a (219, 187) Reed-Solomon code with 1.6 times the capability for withstanding protracted drop-outs in signal strength that the (207, 187) Reed-Solomon code has. So, the byte-storage locations both in outer interleaver memory and in outer de-interleaver memory can be reduced some 36% compared to designs using (207, 187) R-S coding, while keeping the same capability to overcome drop-outs in signal strength. The (219, 187) R-S code does not lend itself particularly well to turbo coding with a frame size that is a multiple both of 184 bytes and of 219 bytes, 219 and 184 having no factors in common with each other. Four (230, 187) R-S codewords would fit exactly into five 184-byte payload-data fields. This would allow a 53% reduction in memory requirements for outer interleaver memory and for outer de-interleaver memory compared to designs using (207, 187) R-S coding, while keeping the same capability to overcome protracted drop-outs in signal strength. Eight (253, 187) R-S codewords would fit exactly into eleven 184-byte payload-data fields, to suit a bit interleaver with capacity for 16,192 bits. This would allow a 69% reduction in memory requirements for outer interleaver memory and for outer de-interleaver memory compared to designs using (207, 187) R-S coding, while keeping the same capability to overcome protracted drop-outs in signal strength.

DVB-Huses (255, 191) R-S coding, which could be shortened to (251, 187) R-S coding. Each (251, 187) R-S FEC codeword could be provided with a two-byte header to make a respective 253-byte chunk, eight of which 253-byte chunks would fit exactly into eleven 184-byte payload-data fields. Rather than turbo coding an octet of the 253-byte chunks using a bit interleaver with capacity for 16,192 bits, a quartet of the 253-byte chunks could be turbo coded using a bit interleaver with capacity for 8,096 bits. This would allow a 68% reduction in memory requirements for outer interleaver memory and for outer de-interleaver memory compared to designs using (207, 187) R-S coding, while keeping the same capability to overcome protracted drop-outs in signal strength.

Synchronization of the pattern of de-interleaving to be used in a DTV receiver per FIGS. 3, 7, 9, 13, 16, 17, 19, 21, 23, 25, 27 and 29 can be done relying on the ancillary transmission pattern information recovered by the decoder 26. Synchronization of the pattern of de-interleaving to be used in a DTV receiver can also be done by analyzing the placement of codeword separator sequences in a few payload-data fields of turbo coding.

The inventor contemplated using parallelly concatenated convolutional coding (PCCC) that reduced code rate 4-to-1 or 5-to-1 rather than just 3-to-1. PCCC that reduces code rate 4-to-1 or 5-to-1 is used in cdma2000 wireless telephony. Such reductions in code rate were considered to be unacceptably high for the performance gains that could be achieved.

The transverse disposition of turbo codewords in the payload-data fields of null packets or MPEG-2 packets with a special PID is a good tactic even if the turbo codewords are generated other than by parallelly concatenated RSC codes. For example, the turbo codewords can be generated by a serially concatenated convolutional code (SCCC). The turbo codewords can be generated by serially concatenated block code and convolutional code by way of further example. A turbo product code could also be used.

Supposing the turbo codewords in the payload-data fields of null packets or MPEG-2 packets with a special PID have parity bytes for forward-error-correction coding dispersed at regular intervals throughout each of them, the interleaving of the turbo codewords using methods adapted from Spruyt's U.S. Pat. No. 5,907,560 is a good tactic, too. This is so even if the turbo codewords are generated other than by parallelly concatenated RSC codes. Turbo codewords generated by serially concatenated block code and convolutional code can be designed so the block code can locate byte errors for the R-S FEC code.

Variants of the DTV systems described in the foregoing specification may be used for broadcasting just to DTV receivers at fixed locations. In these variants the outer byte interleaver 19 in the FIG. 1 DTV transmitter apparatus spreads the bytes of the turbo codewords just 184 bytes, and de-interleaving in the DTV receivers is simplified accordingly. The turbo codewords still are transverse to the payload-data fields of the packets that are used to contain the turbo coding, so that coding will not introduce artifacts that the adaptive equalizers in DTV receivers might mistake for echoes.

The momentary loss of audio during a deep fade is usually more likely to cause one listening and viewing a television program to lose track of what is going on in a program than momentary loss of video. So, the compressed audio portions of a DTV signal intended for mobile reception can be transmitted using staggercast turbo codes, while the compressed video portions of that DTV signal are transmitted using punctured staggercast turbo codes.

The inventor has also conceived of staggercasting or punctured staggercasting being used to provide AVSB the capability of overcoming "deep fades" of considerable duration, as might arise when a vehicle carrying the DTV receiver moves through underpasses or passes large buildings. Preferred embodiments of DTV receivers for receiving staggercast AVSB signals include apparatus for comparing portions of each turbo codeword and the repeated portion or portions thereof for synthesizing the turbo codeword supplied for turbo decoding.

Performing turbo decoding operations sweeping the trellis in both forward and reverse directions to decode the portions of a turbo codeword preceding and succeeding a deep fade was disclosed, supra. Turbo decoding operations sweeping the trellis in both forward and reverse directions can be done simultaneously, to reduce the time to decode a turbo codeword even when there is no deep fade to corrupt that turbo codeword. Seokhyun Yoon and Yeheskel Bar-Ness describe a method for reducing the computational delay time of turbo decoding in a letter entitled "A Parallel MAP Algorithm for Low Latency Turbo Decoding" published in IEEE Communications Letters, Vol. 6, No. 7, July 2002. In this method portions of a long turbo codeword are iteratively decoded separately and parallelly in time, using boundary conditions for iteratively decoding those portions as determined from the preceding performance of the MAP algorithm. DTV receivers embodying aspects of the invention disclosed in earlier paragraphs of this specification can be implemented using the Yoon and Bar-Ness method. Power consumption need not go up if slower processing is made possible. If many iterations of the turbo decoding procedures are required during low SNR, the faster processing available using the Yoon and Bar-Ness method may be required in order that buffer memory associated with turbo coding can be kept from overflowing. The cost will be higher energy consumption by the turbo decoding procedures.

The foregoing specification discloses in general terms DTV systems of types that support reception by DTV receivers in rapidly moving vehicles and that can overcome protracted deep fades during such reception. The foregoing specification prescribes that byte de-interleaving to overcome protracted deep fades should precede turbo code decoding and subsequent decoding of R-S FEC coding in a DTV receiver. The foregoing specification points out how this prescription for DTV receiver designs facilitates iterative turbo code decoding procedures being controlled so as to conserve power consumption by them. The foregoing specification also sets out how outer R-S FEC coding, turbo coding and outer byte interleaving are properly cascaded in DTV transmitter apparatus. The foregoing specification also teaches how soft-decision turbo decoding improves staggercasting reception.

The foregoing specification will enable persons of ordinary skill in the arts of digital communications system design and of equipment design for digital communications systems to make a variety of DTV transmitter apparatuses and a variety of DTV receiver apparatuses that embody the invention in various of its aspects. This should be taken into consideration when considering the far-ranging scope of the invention as defined by the following claims and their equivalents.

What is claimed is:

1. In transmitter apparatus for a digital television broadcast signal manifested as an electromagnetic wave subjected to vestigial sideband amplitude modulation in accordance with an eight-level modulating signal, said eight-level modulating signal formed by two-thirds trellis coding of convolutionally byte-interleaved 207-byte Reed-Solomon codewords generated from 187-byte packets beginning with respective 3-byte headers and concluding with respective 184-byte contents, the improvement wherein:

the contents of special ones of said 187-byte packets encapsulate respective segments of byte-interleaved parallel concatenated convolutional codewords;

the headers of said special ones of said 187-byte packets indicate their special nature;

said parallel concatenated convolutional codewords encode Reed-Solomon-coded ancillary data, time-division multiplexing bytes of said Reed-Solomon-coded ancillary data with bytes of a first parity determination and with bytes of a second parity determination; and the byte interleaving of said parallel concatenated convolutional codewords disposes the bytes of each of them transversally within the contents of said special ones of said 187-byte packets.

2. Transmitter apparatus including said improvement set forth in claim 1, said transmitter apparatus comprising:

an outer Reed-Solomon forward-error-correction code encoder connected for Reed-Solomon forward-error-correction coding said ancillary data to generate said Reed-Solomon-coded ancillary data;

a turbo coding encoder connected for coding said Reed-Solomon-coded ancillary data to generate said parallel concatenated convolutional codewords in which bytes of said Reed-Solomon-coded ancillary data are time-division multiplexed with bytes of a first parity determination and with bytes of a second parity determination;

an outer byte interleaver connected for receiving said parallel concatenated convolutional codewords and matrix-type block interleaving them to generate an outer byte interleaver response;

apparatus connected for packing the 184-byte payload-data fields of said special packets with segments of said outer byte interleaver response, thereby disposing the bytes of each of said parallel concatenated convolutional codewords transversally within the contents of said special ones of said 187-byte packets;

a transport stream multiplexer connected for time-division multiplexing said special ones of said 187-byte packets with others of said 187-byte packets to generate a complete transport stream;

a data randomizer connected for randomizing said complete transport stream by exclusive-ORing the bits thereof with the bits of a prescribed pseudo-random binary sequence, thereby to generate a data-randomized complete transport stream;

an inner Reed-Solomon forward-error-correction code encoder connected for Reed-Solomon forward-error-correction coding said data-randomized complete transport stream to generate said 207-byte Reed-Solomon codewords for convolutional byte interleaving;

an inner byte interleaver connected for receiving said 207-byte Reed-Solomon codewords for convolutional byte interleaving and convolutionally interleaving their bytes to generate an inner byte interleaver response;

a trellis code encoder connected for receiving said inner byte interleaver response and performing 12-phase two-thirds trellis coding of said inner byte interleaver response to generate successive three-bit sequences descriptive of respective symbols;

a symbol mapper connected for converting said three-bit sequences to respective eight-level symbols;

a symbol-code assembler connected for inserting data segment synchronizing symbols and data field synchronizing symbols at intervals within eight-level symbols from said symbol mapper to generate assembled symbol coding;

apparatus connected for generating a modulating signal by combining an offset with said assembled symbol coding; and a vestigial-sideband amplitude-modulation digital television transmitter connected for receiving said modulating signal and transmitting said improved digital television broadcast signal.

3. The transmitter apparatus of claim 2 wherein said outer byte interleaver comprises a memory separated into two banks, each connected for the byte storage locations therewithin being written to column by column with said parallel concatenated convolutional codewords generated by said turbo coding encoder while byte storage locations within the other is being read row by row to supply said segments of said outer byte interleaver response to said apparatus connected for packing the 184-byte payload-data fields of said special packets.

4. The transmitter apparatus of claim 2 wherein said outer byte interleaver is of a Spruyt type in which a memory is connected for having byte storage locations therewithin written to column by column with said parallel concatenated convolutional codewords generated by said turbo coding encoder and read row by row to supply said segments of said outer byte interleaver response to said apparatus connected for packing the 184-byte payload-data fields of said special packets.

5. Transmitter apparatus including the improvement set forth in claim 1 operated in a digital television broadcasting system, said digital television broadcasting system further including at least one receiver apparatus comprising:

apparatus for converting a selected 8VSB digital television signal received as an amplitude-modulated radio-frequency carrier to a baseband digital television signal, which apparatus includes front-end circuitry, an analog-to-digital converter, a demodulator for 8VSB digital television signals and a channel equalization filter;

a 12-phase trellis decoder connected for providing trellis decoding results that include soft decisions concerning symbols in said baseband digital television signal, said 12-phase trellis decoder connected to receive baseband digital television signal from said apparatus for converting a selected 8VSB digital television signal received as an amplitude-modulated radio-frequency carrier to a baseband digital television signal; and further apparatus connected for decoding selected portions of said trellis decoding results conveying said PCCC that encodes said ancillary data, thus to reproduce said ancillary data in at least substantially original form.

6. Receiver apparatus for receiving a digital television broadcast signal manifested as an electromagnetic wave subjected to vestigial sideband amplitude modulation in accordance with an eight-level modulating signal, said eight-level modulating signal formed by two-thirds trellis coding of convolutionally byte-interleaved 207-byte Reed-Solomon codewords generated from 187-byte packets beginning with respective 3-byte headers and concluding with respective 184-byte contents, the contents of special ones of said 187-byte packets encapsulating respective segments of parallel concatenated convolutional codewords at least some of which are byte-interleaved , the headers of said special ones of said 187-byte packets indicating their special nature, said parallel concatenated convolutional codewords encoding Reed-Solomon-coded ancillary data, bytes of said Reed-Solomon-coded ancillary data being time-division multiplexed with bytes of a first parity determination and with bytes of a second parity determination, and the byte interleaving of said parallel concatenated convolutional codewords disposing the bytes of each of them transversally within the contents of said special ones of said 187-byte packets, said receiver apparatus comprising:

apparatus for converting the received improved digital television broadcast signal to a digitized baseband signal;

a decoder for two-thirds trellis coding, connected for receiving said digitized baseband signal and generating soft decisions concerning the symbols encoded therein, which are descriptive of said convolutionally byte-interleaved 207-byte Reed-Solomon codewords;

an inner byte de-interleaver connected for de-interleaving said soft decisions concerning said symbols in said baseband digital television signal that are descriptive of said convolutionally byte-interleaved 207-byte Reed-Solomon codewords;

an inner Reed-Solomon decoder for (207, 187) Reed-Solomon forward-error-correction coding connected for receiving de-interleaved soft decisions concerning said symbols that are descriptive of 207-byte Reed-Solomon codewords and correcting byte errors in the 187-byte packets contained within respective ones of said 207-byte Reed-Solomon codewords, thereby to generate soft decisions concerning those said 187-byte packets;

a data de-randomizer connected for de-randomizing hard decision portions of said soft decisions concerning those said 187-byte packets generated by said inner Reed-Solomon decoder, said de-randomizing being done by exclusive-ORing the bits of said hard decision portions with the bits of a prescribed pseudo-random binary sequence, thereby to generate de-randomized 187-byte packets;

a turbo coding selector connected for selecting interleaved bytes of said parallel concatenated convolutional codewords from those of said de-randomized 187-byte packets that begin with respective 3-byte headers indicative of their said special nature, which interleaved bytes are accompanied by soft-decision information and continue to be so accompanied in the selective response of the turbo coding selector;

an outer byte de-interleaver connected for de-interleaving said selective response of said turbo coding selector including the soft-decision information therein and reproducing said parallel concatenated convolutional codewords;

a turbo decoder connected for receiving said parallel concatenated convolutional codewords reproduced by said outer byte de-interleaver and decoding them to reproduce said Reed-Solomon-coded ancillary data: and outer Reed-Solomon decoding apparatus connected for receiving said Reed-Solomon-coded ancillary data and correcting byte errors in the packets of ancillary data contained within said Reed-Solomon-coded ancillary data.

7. The receiver apparatus of claim 6, further comprising:
turbo decoding control circuitry for discontinuing turbo coding of any of said parallel concatenated convolutional codewords by said turbo decoder when said outer Reed-Solomon decoding apparatus determines lack of byte error in the Reed-Solomon-coded ancillary data encoded in that particular said parallel concatenated convolutional codeword.

8. The receiver apparatus of claim 6 wherein said outer byte de-interleaver comprises a memory separated into two banks, each connected for the byte storage locations therewithin being written to row by row with said selective response of said turbo coding selector while byte storage locations within the other is being read column by column to reproduce said parallel concatenated convolutional codewords.

9. The receiver apparatus of claim 6 wherein said outer byte de-interleaver is of a Spruyt type in which a memory is connected for having byte storage locations therewithin written to row by row with said selective response of said turbo coding selector and read column by column to reproduce said parallel concatenated convolutional codewords.

10. Receiver apparatus for receiving a digital television broadcast signal manifested as an electromagnetic wave subjected to vestigial sideband amplitude modulation in accordance with an eight-level modulating signal, said eight-level modulating signal formed by two-thirds trellis coding of convolutionally byte-interleaved 207-byte Reed-Solomon codewords generated from 187-byte packets, the contents of special ones of said 187-byte packets encapsulating respective segments of parallel concatenated convolutional codewords at least some of which are byte-interleaved, the headers of said special ones of said 187-byte packets indicating their special nature, said parallel concatenated convolutional codewords encoding Reed-Solomon-coded ancillary data, bytes of said Reed-Solomon-coded ancillary data being time-division multiplexed with bytes of a first parity determination and with bytes of a second parity determination, and the byte interleaving of said parallel concatenated convolutional codewords disposing the bytes of each of them transversally within the contents of said special ones of said 187-byte packets, said receiver apparatus comprising:

apparatus for converting a selected 8VSB digital television signal received as an amplitude-modulated radio-frequency carrier to a baseband digital television signal, which apparatus includes front-end circuitry, an analog-to-digital converter, a demodulator for 8VSB digital television signals and a channel equalization filter;

a 12-phase trellis decoder connected for providing trellis decoding results that include soft decisions concerning symbols in said baseband digital television signal, said 12-phase trellis decoder connected to receive baseband digital television signal from said apparatus for converting a selected 8VSB digital television signal received as an amplitude-modulated radio-frequency carrier to a baseband digital television signal; and further apparatus connected for decoding selected portions of said trellis decoding results conveying said parallel concatenated convolutional codewords that encode said ancillary data, thus to reproduce said ancillary data in at least substantially original form.

11. The receiver apparatus of claim 10, wherein said further apparatus connected for decoding selected portions of said trellis decoding results comprises:

apparatus for reproducing in a selective response therefrom bytes of said parallel concatenated convolutional codewords as selected from said trellis decoding results, which bytes of said parallel concatenated convolutional codewords are accompanied by soft-decision information in said trellis decoding results and continue to be so accompanied in said selective response of said apparatus for selecting said bytes of said parallel concatenated convolutional codewords from said trellis decoding results; and a turbo decoder connected for receiving said selective response of said apparatus for reproducing bytes of said parallel concatenated convolutional codewords as selected from said trellis decoding results and decoding said parallel concatenated convolutional codewords.

12. The receiver apparatus of claim 10, wherein said further apparatus connected for decoding selected portions of said trellis decoding results comprises:

apparatus for reproducing in a selective response therefrom interleaved bytes of said parallel concatenated convolutional codewords from said trellis decoding results, which interleaved bytes of said parallel concatenated convolutional codewords are accompanied by soft-decision information in said trellis decoding results and continue to be so accompanied in the selective response of said apparatus for selecting said interleaved bytes of said parallel concatenated convolutional codewords from said trellis decoding results;

an outer byte de-interleaver connected for de-interleaving said selective response of said apparatus for reproducing interleaved bytes of said parallel concatenated convolutional codewords from said trellis decoding results, including the soft-decision information within that said selective response and thus reproducing said parallel concatenated convolutional codewords; and a turbo decoder connected for receiving said parallel concatenated convolutional codewords reproduced by said outer byte de-interleaver and decoding them.

13. The receiver apparatus of claim 10, wherein said further apparatus connected for decoding selected portions of said trellis decoding results comprises:

an inner byte de-interleaver connected for de-interleaving said soft decisions concerning said symbols in said baseband digital television signal that are descriptive of said convolutionally byte-interleaved 207-byte Reed-Solomon codewords;

an inner Reed-Solomon decoder for (207, 187) Reed-Solomon forward-error-correction coding connected for receiving de-interleaved soft decisions concerning said symbols that are descriptive of 207-byte Reed-Solomon codewords and correcting byte errors in the 187-byte packets contained within respective ones of said 207-byte Reed-Solomon codewords, thereby to generate soft decisions concerning those said 187-byte packets;

a data de-randomizer connected for de-randomizing hard decision portions of said soft decisions concerning those said 187-byte packets generated by said inner Reed-Solomon decoder, said de-randomizing being done by exclusive-ORing the bits of said hard decision portions with the bits of a prescribed pseudo-random binary sequence, thereby to generate de-randomized 187-byte packets;

a turbo coding selector connected for selecting interleaved bytes of said parallel concatenated convolutional codewords from those of said de-randomized 187-byte packets that begin with respective 3-byte headers indicative of their said special nature, which interleaved bytes are accompanied by soft-decision information and continue to be so accompanied in the selective response of the turbo coding selector;

an outer byte de-interleaver connected for de-interleaving said selective response of said turbo coding selector including the soft-decision information therein and reproducing said parallel concatenated convolutional codewords;

a turbo decoder connected for receiving said parallel concatenated convolutional codewords reproduced by said outer byte de-interleaver and decoding them to reproduce said Reed-Solomon-coded ancillary data: and outer Reed-Solomon decoding apparatus connected for receiving said Reed-Solomon-coded ancillary data and correcting byte errors in the packets of ancillary data contained within said Reed-Solomon-coded ancillary data.

14. The receiver apparatus of claim 13, further comprising:

turbo decoding control circuitry for discontinuing turbo coding of any of said parallel concatenated convolutional codewords by said turbo decoder when said outer Reed-Solomon decoding apparatus determines lack of byte error in the Reed-Solomon-coded ancillary data encoded in that particular said parallel concatenated convolutional codeword.

15. The receiver apparatus of claim 13 wherein said outer byte de-interleaver comprises a memory separated into two banks, each connected for the byte storage locations therewithin being written to row by row with said selective response of said turbo coding selector while byte storage locations within the other is being read column by column to reproduce said parallel concatenated convolutional codewords.

16. The receiver apparatus of claim 13 wherein said outer byte de-interleaver is of a Spruyt type in which a memory is connected for having byte storage locations therewithin written to row by row with said selective response of said turbo coding selector and read column by column to reproduce said parallel concatenated convolutional codewords.

17. Receiver apparatus for receiving 8-VSB digital television broadcast signals each manifested as an electromagnetic wave subjected to vestigial sideband amplitude modulation in accordance with an eight-level modulating signal, said eight-level modulating signal formed by two-thirds trellis coding of 207-byte Reed-Solomon codewords generated from 187-byte packets and convolutionally byte-interleaved before said two-thirds trellis coding, the contents of special ones of said 187-byte packets each encapsulating data bits and parity bits of parallel concatenated convolutional coding of ancillary data, the headers of said special ones of said 187-byte packets indicative of their special nature, said parallel concatenated convolutional coding encoding ancillary data, said receiver apparatus comprising:

apparatus for converting a selected 8VSB digital television signal received as an amplitude-modulated radio-frequency carrier to a baseband digital television signal, which apparatus includes front-end circuitry, an analog-to-digital converter, a demodulator for 8VSB digital television signals and a channel equalization filter;

a 12-phase trellis decoder connected for providing trellis decoding results that include soft decisions concerning symbols in said baseband digital television signal, said 12-phase trellis decoder connected to receive baseband digital television signal from said apparatus for converting a selected 8VSB digital television signal received as an amplitude-modulated radio-frequency carrier to a baseband digital television signal; and further apparatus connected for decoding selected portions of said trellis decoding results conveying said parallel concatenated convolutional coding that encodes said ancillary data, thus to reproduce said ancillary data in at least substantially its original form.

18. Receiver apparatus as set forth in claim 17, wherein said further apparatus connected for decoding selected portions of said trellis decoding results comprises:

a byte de-interleaver connected for de-interleaving said soft decisions concerning said symbols in said baseband digital television signal that are descriptive of said 207-byte data segments that have been convolutionally byte-interleaved;

a Reed-Solomon decoder for (207, 187) Reed-Solomon forward-error-correction coding connected for receiving de-interleaved soft decisions concerning said symbols that are descriptive of 207-byte Reed-Solomon codewords and correcting byte errors in the 187-byte packets contained within respective ones of said 207-byte Reed-Solomon codewords, thereby to generate updated soft decisions concerning those said 187-byte packets as Reed-Solomon decoding results;

apparatus connected for decoding selected portions of said Reed-Solomon decoding results which convey said parallel concatenated convolutional coding that encodes said ancillary data, thus to reproduce said ancillary data in at least substantially its original form.

19. Receiver apparatus as set forth in claim 18, wherein said apparatus connected for decoding selected portions of said Reed-Solomon decoding results which convey said parallel concatenated convolutional coding that encodes said ancillary data comprises:

a random-access memory operable for re-interleaving said selected portions of said Reed-Solomon decoding results which convey said parallel concatenated convolutional coding that encodes said ancillary data, thus to restore said parallel concatenated convolutional coding to an original order thereof; and a turbo decoder for said parallel concatenated convolutional coding as restored to said original order thereof, said turbo decoder operable to reproduce said ancillary data in at least substantially its original form.

\* \* \* \* \*